(12) United States Patent
Hwang et al.

(10) Patent No.: US 12,389,546 B2
(45) Date of Patent: Aug. 12, 2025

(54) PRINTED CIRCUIT BOARD, ELECTRONIC COMPONENT-EMBEDDED SUBSTRATE, AND MANUFACTURING METHOD THEREOF

(71) Applicant: SAMSUNG ELECTRO-MECHANICS CO., LTD., Suwon-si (KR)

(72) Inventors: Mi Sun Hwang, Suwon-si (KR); Jun Hyeong Jang, Suwon-si (KR); Byung Duk Na, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 1011 days.

(21) Appl. No.: 17/208,151

(22) Filed: Mar. 22, 2021

(65) Prior Publication Data
US 2022/0039261 A1    Feb. 3, 2022

(30) Foreign Application Priority Data
Jul. 30, 2020    (KR) .......................... 10-2020-0094985

(51) Int. Cl.
*H05K 1/11*    (2006.01)
*H05K 1/18*    (2006.01)
(Continued)

(52) U.S. Cl.
CPC ............. *H05K 1/186* (2013.01); *H05K 1/115* (2013.01); *H05K 3/429* (2013.01); *H05K 3/4605* (2013.01); *H05K 3/4697* (2013.01)

(58) Field of Classification Search
CPC .......... H05K 1/115; H05K 1/18; H05K 1/181; H05K 1/182; H05K 1/183; H05K 1/184;
(Continued)

(56) References Cited

U.S. PATENT DOCUMENTS

| 10,448,512 B2 | 10/2019 | Lee et al. | |
| 2013/0062108 A1* | 3/2013 | Kondo | ................... H05K 3/388 977/932 |

(Continued)

FOREIGN PATENT DOCUMENTS

| KR | 10-1136396 B1 | 4/2012 |
| KR | 10-1304359 B1 | 9/2013 |

(Continued)

OTHER PUBLICATIONS

Office Action issued in corresponding Taiwanese Patent Application No. 110109968 dated Sep. 30, 2021, with English translation.

(Continued)

*Primary Examiner* — Roshn K Varghese
(74) *Attorney, Agent, or Firm* — MORGAN, LEWIS & BOCKIUS LLP

(57) ABSTRACT

A printed circuit board and an electronic component-embedded substrate including the same are provided. The printed circuit board includes a first insulating layer, a second insulating layer disposed on the first insulating layer, a barrier layer disposed between the first and second insulating layers, a cavity penetrating through one of the first and second insulating layers, and a first wiring layer at least partially in contact with the barrier layer. The barrier layer has a modulus lower than a modulus of each of the first and second insulating layers.

13 Claims, 40 Drawing Sheets

(51) Int. Cl.
*H05K 3/42* (2006.01)
*H05K 3/46* (2006.01)

(58) Field of Classification Search
CPC . H05K 1/185; H05K 1/186; H05K 2201/0183
See application file for complete search history.

(56) References Cited

U.S. PATENT DOCUMENTS

| | | |
|---|---|---|
| 2016/0219711 A1* | 7/2016 | Lee ..................... H05K 1/0271 |
| 2017/0019989 A1 | 1/2017 | Lee et al. |
| 2019/0131226 A1* | 5/2019 | Lee ..................... H01L 23/5389 |
| 2019/0164933 A1 | 5/2019 | Lee |
| 2021/0118935 A1 | 4/2021 | Haneda |

FOREIGN PATENT DOCUMENTS

| | | |
|---|---|---|
| KR | 10-2016-0090637 A | 8/2016 |
| KR | 10-2017-0067481 A | 6/2017 |
| KR | 10-1942746 B1 | 1/2019 |
| KR | 10-2019-0052852 A | 5/2019 |
| TW | 202015207 A | 4/2020 |

OTHER PUBLICATIONS

Office Action dated Jan. 21, 2025, issued in corresponding Korean Patent Application No. 10-2020-0094985 with an English translation.

\* cited by examiner

I-I'

II-II'

PRINTED CIRCUIT BOARD, ELECTRONIC COMPONENT-EMBEDDED SUBSTRATE, AND MANUFACTURING METHOD THEREOF

CROSS-REFERENCE TO RELATED APPLICATION(S)

This application claims the benefit under 35 USC 119 (a) of Korean Patent Application No. 10-2020-0094985 filed on Jul. 30, 2020 in the Korean Intellectual Property Office, the entire disclosure of which is incorporated herein by reference for all purposes.

TECHNICAL FIELD

The present disclosure relates to a printed circuit board and an electronic component-embedded substrate including the same.

BACKGROUND

As electronic devices in the Information Technology (IT) field, including mobile phones, have become lighter and thinner, in response to such technical demand, a technology in which electronic components such as Integrated Circuit (IC) are inserted into the printed circuit board is required. Technology is being developed in which electronic components are embedded in a printed circuit board. Accordingly, various cavity structures are formed in the printed circuit board.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

Exemplary embodiments provide a printed circuit board in which a process may be reduced using a cavity structure, and an electronic component-embedded substrate including the same.

Exemplary embodiments provide a printed circuit board of which the size may be reduced using a cavity structure, and an electronic component-embedded substrate including the same.

A cavity structure in which an electronic component is disposed on a printed circuit board may be implemented using a barrier layer having a relatively low modulus, compared to an insulating layer in which a cavity is formed.

For example, a printed circuit board according to an example includes a first insulating layer, a second insulating layer disposed on the first insulating layer, a barrier layer disposed between the first and second insulating layers, a cavity penetrating through one of the first and second insulating layers, and a first wiring layer at least partially in contact with the barrier layer. The barrier layer has a modulus lower than a modulus of each of the first and second insulating layers.

For example, an electronic component-embedded substrate includes a core structure including a first insulating body, a plurality of first wiring layers respectively disposed on or in the first insulating body, and a barrier layer disposed within the first insulating body and at least partially in contact with any one of the plurality of first wiring layers, the core structure having a cavity penetrating through one side of the first insulating body with respect to the barrier layer, an electronic component disposed in the cavity, and a build-up structure including a second insulating body covering at least a portion of each of the core structure and the electronic component and disposed in at least a portion of the cavity, and a second wiring layer comprised of one or more layers respectively disposed on or within the second insulating body. A material of the barrier layer has a modulus lower than a modulus of a material of the first insulating body.

For example, a printed circuit board according to an example includes a first insulating layer, a second insulating layer disposed on the first insulating layer, an insulating barrier layer disposed between the first and second insulating layers and separating the first insulating layer and the second insulating layer from each other, a wiring layer at least partially in contact with the insulating barrier layer, and a cavity penetrating through one of the first and second insulating layers and penetrating in at least a portion of the insulating barrier layer. The insulating barrier layer provides a lowest portion of a side wall of the cavity, the lowest portion of the side wall of the cavity being in contact with a bottom surface of the cavity.

For example, an electronic component-embedded substrate includes a core structure including a first insulating body, a plurality of first wiring layers respectively disposed on or in the first insulating body, and an insulating barrier layer disposed within the first insulating body and at least partially in contact with one of the plurality of first wiring layers, the core structure having a cavity penetrating through one side of the first insulating body and penetrating in at least a portion of the insulating barrier layer, an electronic component disposed in the cavity, and a build-up structure including a second insulating body covering at least a portion of each of the core structure and the electronic component and disposed in at least a portion of the cavity, and a second wiring layer comprised of one or more layers respectively disposed on or within the second insulating body. The insulating barrier layer is in contact with two insulating layers in the first insulating body and separates the two insulating layers from each other, and the insulating barrier layer provides a lowest portion of a side wall of the cavity, the lowest portion of the side wall of the cavity being in contact with a bottom surface of the cavity.

For example, a method for manufacturing an electronic component-embedded substrate includes forming a core structure including a first insulating body, a plurality of first wiring layers respectively disposed on or in the first insulating body, and an insulating barrier layer disposed between first and second insulating layers among a plurality of insulating layers in the first insulating body, forming a cavity to penetrate through at least the first insulating layer and to partially penetrate in the insulating barrier layer, disposing an electronic component in the cavity, and forming a build-up structure including a second insulating body covering at least a portion of each of the core structure and the electronic component and disposed in at least a portion of the cavity, and a second wiring layer comprised of one or more layers respectively disposed on or within the second insulating body.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
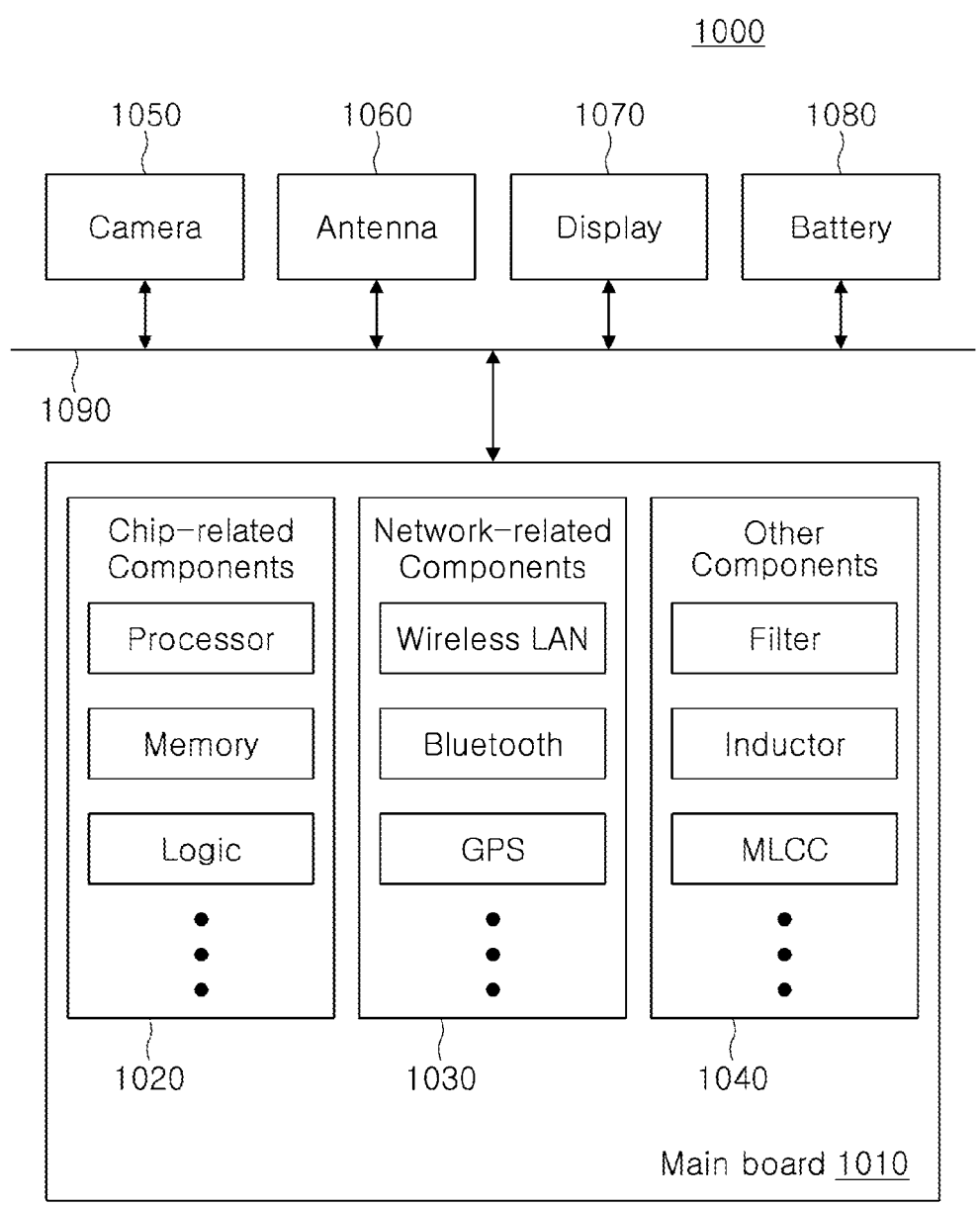
FIG. 1 is a block diagram schematically illustrating an example of an electronic device system.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an embodiment or example, e.g., as to what an embodiment or example may include or implement, means that at least one embodiment or example exists in which such a feature is included or implemented while all examples and examples are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after gaining an understanding of the disclosure of this application. Further, although the examples described herein have a variety of configurations, other configurations are possible as will be apparent after an understanding of the disclosure of this application.

Hereinafter, embodiments will be described with reference to the accompanying drawings. In the drawings, the shapes and sizes of elements may be exaggerated or reduced for clearer explanation.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but in addition to these chip related components, may also include other types of chip related components. In addition, the chip related components 1020 may be combined with each other. The chip-related components 1020 may also be in the form of a package including the above-described chip.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with the chip-related components 1020 and provided in package form.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive devices in the form of chip components used for various other purposes, or the like. In addition, other components 1040 may be combined with the chip-related components 1020 and/or the network-related components 1030 and may be provided in a package form.

Depending on a type of the electronic device 1000, the electronic device 1000 may include other electronic components that may or may not be physically or electrically connected to the mainboard 1010. These other electronic components may include, for example, a camera module 1050, an antenna module 1060, a display device 1070, a battery 1080, or the like. However, these other electronic components are not limited thereto, but may be an audio codec, a video codec, a power amplifier, a compass, an accelerometer, a gyroscope, a speaker, amass storage unit (for example, a hard disk drive), a compact disk (CD) drive, a digital versatile disk (DVD) drive, or the like. In addition, the electronic device 1000 may also include other electronic components used for various purposes depending on a type of the electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
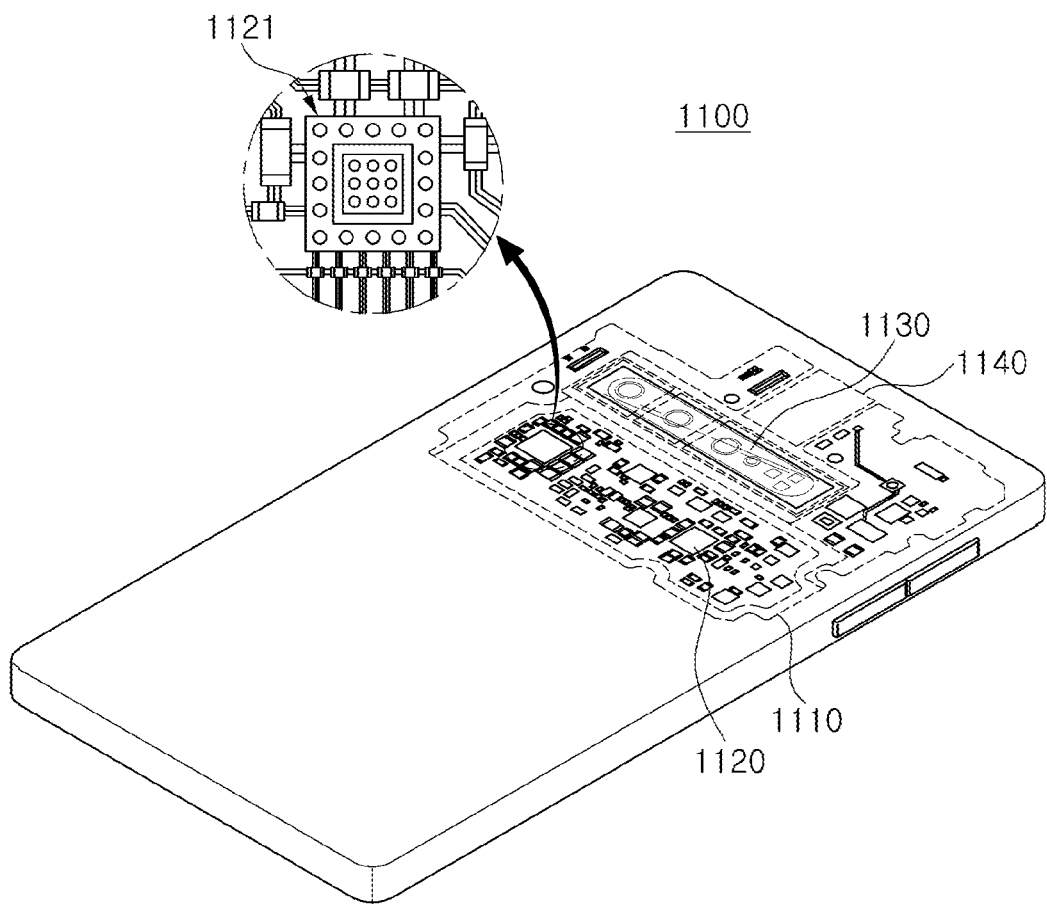
FIG. 2 is a perspective view schematically illustrating an example of an electronic device.

FIG. 2 is a schematic perspective view illustrating an example of an electronic device.

Referring to FIG. 2, an electronic device may be, for example, a smartphone 1100. A motherboard 1110 may be accommodated in the smartphone 1100, and various electronic components 1120 may be physically and/or electrically connected to the motherboard 1110. In addition, a camera module 1130 and/or a speaker 1140, and the like, may be accommodated in the smartphone 1100. Some of the electronic components 1120 may be the chip related components, for example, an electronic component-embedded substrate 1121, but are not limited thereto. The electronic component-embedded substrate 1121 may have a form in which an electronic component is embedded in a multilayer printed circuit board, but is not limited thereto. The electronic device is not necessarily limited to the smartphone 1100, but may be other electronic devices as described above.

Figure 3:
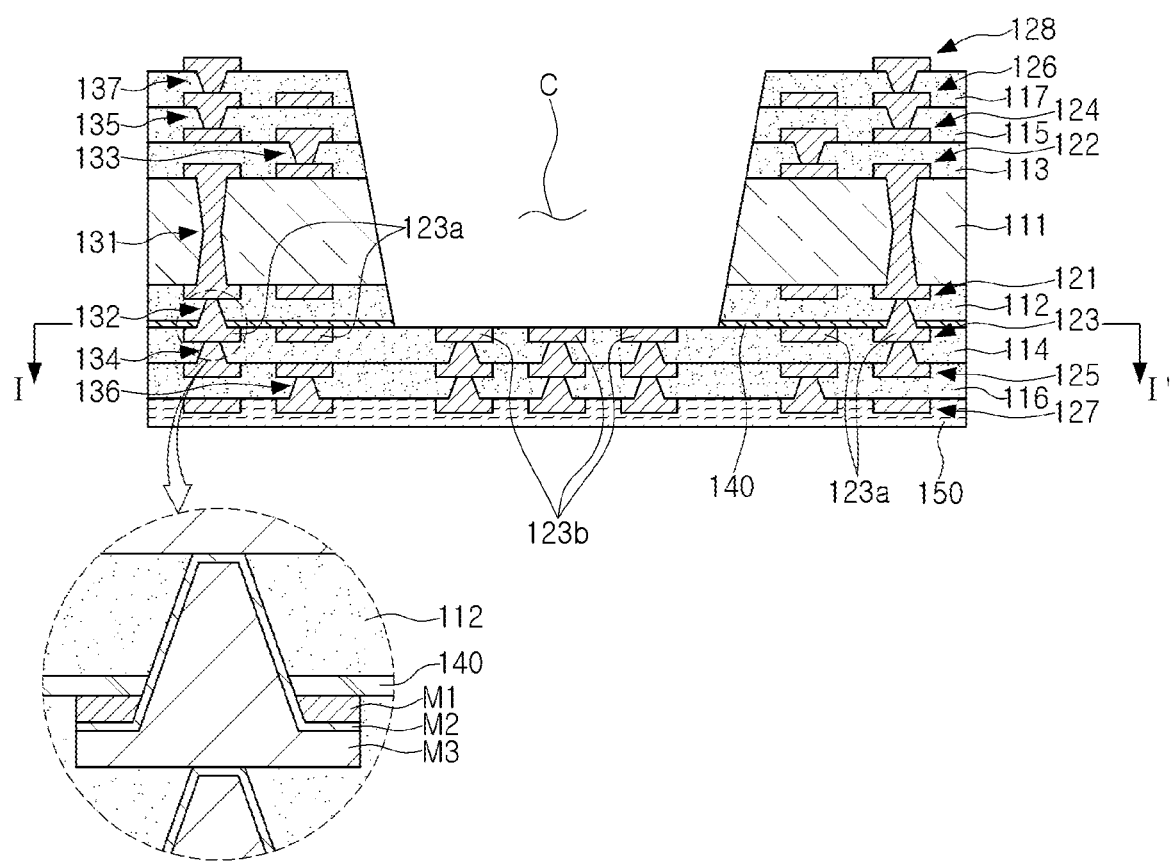
FIG. 3 is a schematic cross-sectional view of an example of a printed circuit board.

FIG. 3 is a schematic cross-sectional view of an example of a printed circuit board.

Figure 4:
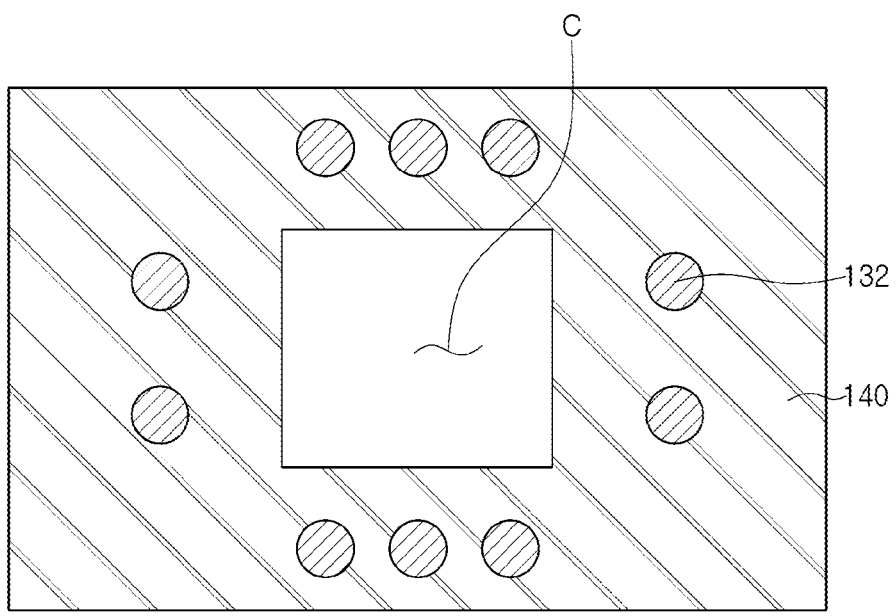
FIG. 4 is a schematic plan view of the printed circuit board of FIG. 3, taken along line I-I'.

FIG. 4 is a schematic plan view of the printed circuit board of FIG. 3, taken along line I-I'.

Referring to the drawings, a printed circuit board 100A according to an example includes a plurality of insulating layers 111, 112, 113, 114, 115, 116 and 117, a plurality of wiring layers 121, 122, 123, 124, 125, 126, 127 and 128, a plurality of wiring via layers 131, 132, 133, 134, 135, 136 and 137, and a primer layer 140, and may further include a passivation layer 150 if necessary. In addition, the printed circuit board 100A has a cavity C penetrating through the insulating layers 111, 112, 113, 115 and 117 disposed in the upper side, based on the primer layer 140. The cavity C may further penetrate through the primer layer 140, and as a result, may expose at least a portion of an uppermost insulating layer 114 among the insulating layers 114 and 116 disposed in a lower side, based on the primer layer 140. In addition, the cavity C may expose at least a portion of a wiring pattern 123b of an uppermost wiring layer 123 among the wiring layers 123, 125 and 127 disposed in a lower side, based on the primer layer 140.

Meanwhile, in recent years, technologies in which electronic components are embedded in a printed circuit board in various ways have been developed, and accordingly, various cavity structures are formed in the printed circuit board. At this time, to process the cavity, it may be necessary to form a pattern layer serving as a stopper. In addition, to electrically connect electronic components disposed in the cavity, it may be necessary to form a pad pattern in an area exposed through the cavity, and in this case, it may be necessary to form a protective layer for protecting the pad pattern. However, by forming the pattern layer and/or the protective layer, costs may increase due to an additional process. In addition, when the cavity C is formed, a problem of misalignment with the pattern layer and/or the protective layer may occur, and to minimize the occurrence of misalignment, sufficient space should be secured with the consideration thereof, which may be, as a result, disadvantageous in reducing the size.

Meanwhile, in the printed circuit board 100A according to an example of the present disclosure, the primer layer 140 is used as a barrier layer for processing the cavity C. In this case, the primer layer 140 may be a primer of copper foil (M1) provided to use a plating process, for example, Semi Additive Process (SAP), Modified Semi Additive Process (MSAP), etc. on any insulating layer 112. When the primer layer 140 is used as a barrier layer for processing the cavity C, a separate pattern layer for processing the cavity C is unnecessary. In addition, since the primer layer 140 protects the wiring pattern 123b of the wiring layer 123 that may be exposed later by the cavity C when processing the cavity C, it is unnecessary to form a separate protective layer. Therefore, the process may be reduced, and since there is no issue of alignment, a size reduction effect may also be provided. In one example, the primer layer 140 may provide a lowest portion of a side wall of the cavity C, and the lowest portion of the side wall of the cavity C may be in contact with a bottom surface of the cavity C.

On the other hand, the primer layer 140 may have a lower modulus than each of the plurality of insulating layers 111, 112, 113, 114, 115, 116 and 117, and in this case, may effectively serve as a barrier for processing the cavity C. For example, the processing of the cavity C may use a technique such as sandblasting in which an abrasive is sprayed with air pressure for mechanical processing, and in this case, the etching amount may vary according to the modulus, a mechanical property of the object to be processed. For example, the lower the modulus is, the lower the amount of etching may be. Therefore, when the primer layer 140 has a lower modulus than each of the plurality of insulating layers 111, 112, 113, 114, 115, 116 and 117, the primer layer 140 may be effectively used as a barrier layer for processing the cavity C. In this case, the modulus means the ratio of stress and strain. For example, after obtaining a stress-strain curve until fracture occurs at room temperature using a universal testing machine (UTM), the slope of the load for initial deformation on the stress-strain curve may be expressed in Gigapascal (GPa), but is not limited thereto.

In addition, the primer layer 140 may have an elongation greater than each of the plurality of insulating layers 111, 112, 113, 114, 115, 116 and 117, and in this case, may perform the barrier role more effectively for processing the cavity C described above. For example, as the elongation is relatively high, the modulus may be relatively low, and as a result, the amount of etch by sandblasting may be relatively low. In this case, the elongation refers to the ratio of the initial length and the length at the time of fracture at the time of performing the tensile test of the material. For example, a test piece after fracture is butted using a universal testing machine, and the amount of deformation between gages is calculated, which may be expressed as a percentage, but the method is not limited thereto.

For example, as illustrated in [Table 1] below, an insulating material (Material 1) such as Copper Clad Laminate (CCL) or a prepreg, which may be used as a material for the plurality of insulating layers 111, 112, 113, 114, 115, 116 and 117, has a relatively high modulus of 20 GPa or more, and has a relatively low elongation of less than 1%. Therefore, the amount of etching by sandblasting is relatively high, about 30 μm.

On the other hand, (Material 2), such as a primer resin that may be used as a material of the primer layer 140, has a relatively low modulus of 1 GPa or less, for example, about 0.89 GPa, and a relatively high elongation of 5% or more, for example, about 7.5%. Accordingly, the amount of etching by sandblasting is relatively low, about 1 to 3 μm. As a result, it can be seen that (Material 2) may be easily used as a barrier against sand blast as compared with (Material 1).

TABLE 1

| Classification | Modulus [GPa] | Elongation [%] | Etching Amount [μm] |
|---|---|---|---|
| Material 1 | ≥20 | <1 | 30 |
| Material 2 | 0.89 | 7.5 | 1-3 |

On the other hand, the primer layer 140 may include an insulating resin, but may not include an inorganic filler such as silica ($SiO_2$) or the like. In this case, adhesion of a wiring pattern 123a of the wiring layer 123 in contact with the primer layer 140, to be described later, for example, the adhesion with the first metal layer M1, may be improved. On the other hand, the plurality of insulating layers 111, 112, 113, 114, 115, 116 and 117 may further include an inorganic filler such as silica ($SiO_2$) in addition to the insulating resin, and for rigidity, may further include a reinforcing material such as glass fiber, etc. In this case, the primer layer 140 may have a lower modulus than that of each of the plurality of insulating layers 111, 112, 113, 114, 115, 116 and 117, and may have relatively high elongation, resulting in effectively serving as a barrier in processing the cavity (C).

On the other hand, the insulating layer 114 disposed on the uppermost side among the insulating layers 114 and 116 disposed in the lower side, based on the primer layer 140, may have a lower modulus than each of the insulating layers 111, 112, 113, 115 and 117, disposed in the upper side, based on the primer layer 140. In this case, the insulating layer 114 may effectively serve as an auxiliary barrier for processing the cavity C. From this point of view, the insulating layer 114 disposed on the uppermost side among the insulating layers 114 and 116 disposed in the lower side, based on the primer layer 140, may have a higher elongation than each of the insulating layers 111, 112, 113, 115 and 117 disposed in the upper side, based on the primer layer 140. For example, as illustrated in [Table 2] below, (Material 3) such as Ajinomoto Build-up Film (ABF), which may be used as a material of the uppermost insulating layer 114 among the insulating layers 114 and 116 disposed in the lower side, based on the primer layer 140, has a modulus of 5 GPa or less and an elongation of 5% or more, and thus, has a lower modulus than the aforementioned (Material 1) and relatively high elongation. Accordingly, it can be seen that the amount of etching by sandblasting is about 3 to 6 μm, and thus, the insulating layer 114 may be located in a relatively middle position, and thus, may be easily used as an auxiliary barrier for sandblasting.

TABLE 2

| Classification | Modulus [GPa] | Elongation [%] | Etching Amount [μm] |
|---|---|---|---|
| Material 3 | ≤5 | 5.6 | 3-6 |

On the other hand, the insulating layer 114 disposed on the uppermost side among the insulating layers 114 and 116 disposed in the lower side, based on the primer layer 140, further includes an inorganic filler such as silica ($SiO_2$) in addition to the insulating resin, but may not include a reinforcing material such as glass fiber. In this case, the modulus is lower than a modulus of each of the insulating layers 111, 112, 113, 115 and 117 disposed in the upper side, based on the primer layer 140, and the elongation is relatively relatively high, but the modulus may be higher than the primer layer 140 and the elongation may be relatively low.

On the other hand, the primer layer 140 may be thinner than each of the plurality of insulating layers 111, 112, 113, 114, 115, 116 and 117. Therefore, the presence of the primer layer 140 may not significantly affect the overall thickness of the printed circuit board 100A. The thickness of the primer layer 140 may be about several hundred nanometers (nm) to several micrometers (μm), for example, about 0.1 μm to 5 μm, but is not limited thereto.

On the other hand, the wiring pattern 123a of the wiring layer 123 disposed on the uppermost side, among the wiring layers 123, 125 and 127 disposed in the lower side, based on the primer layer 140, may be disposed on the primer layer 140 to be in contact therewith. The wiring pattern 123a may be located on the same level as the wiring pattern 123b, and the wiring pattern 123a and the wiring pattern 123b may be at least partially embedded in the insulating layer 114 disposed on the uppermost side among the insulating layers 114 and 116 disposed in the lower side, based on the primer layer 140. Each of the wiring patterns 123a and 123b may include first to third metal layers M1, M2 and M3. The first metal layer M1 may be thicker than the second metal layer M2, but may be thinner than the third metal layer M3. The first metal layer M1 may be a copper foil having the primer layer 140 as a primer resin, but is not limited thereto. The second metal layer M2 may be a seed layer including copper (Cu) and/or titanium (Ti) formed by electroless plating, and the third metal layer M3 may be a plating layer including copper (Cu) formed by electrolytic plating, but are not limited thereto.

Hereinafter, each configuration included in the printed circuit board 100A according to an example will be described in more detail with reference to the drawings.

The plurality of insulating layers (111, 112, 113, 114, 115, 116, 117) include a first insulating layer 111, second and third insulating layers 112 and 113 disposed on both sides of the first insulating layer 111, respectively, fourth and fifth insulating layers 114 and 115 disposed on the second and third insulating layers 112 and 113, respectively, and sixth and seventh insulating layers 116 and 117 disposed on the fourth and fifth insulating layers 114 and 115, respectively. The plurality of insulating layers (111, 112, 113, 114, 115, 116, 117) may include a smaller number of insulating layers, or may include a greater number of insulating layers.

An insulating material may be used as a material for the plurality of insulating layers 111, 112, 113, 114, 115, 116 and 117, and a thermosetting resin such as epoxy resin or a thermoplastic resin such as polyimide, and a material in which an inorganic filler such as silica and/or a reinforcing material such as glass fiber is included in these resins may be used. For example, as a material of the first insulating layer 111, an insulating material of a copper clad laminate may be used. In addition, a prepreg may be used as a material for the second to seventh insulating layers 112, 113, 114, 115, 116 and 117. If necessary, ABF may be used as the material of the fourth insulating layer 114. The first insulating layer 111 may be thicker than each of the second to seventh insulating layers 112, 113, 114, 115, 116 and 117. The second to seventh insulating layers 112, 113, 114, 115, 116 and 117 may have substantially the same thickness, but the configuration is not limited thereto.

The plurality of wiring layers (121, 122, 123, 124, 125, 126, 127) include first and second wiring layers 121 and 122 disposed on both sides of the first insulating layer 111, respectively, third and fourth wiring layers 123 and 124 disposed on the second and third insulating layers 112 and 113 and embedded in the fourth and fifth insulating layers 114 and 115, respectively, fifth and sixth wiring layers 125 and 126 disposed on the fourth and fifth insulating layers 114 and 115 and embedded in the sixth and seventh insulating layers 116 and 117, respectively, and seventh and eighth wiring layers 127 and 128 disposed on the sixth and seventh insulating layers 116 and 117, respectively. The plurality of wiring layers 121, 122, 123, 124, 125, 126 and 127 may include a smaller number of wiring layers, or may include a larger number of wiring layers.

A metal material may be used as a material for the plurality of wiring layers 121, 122, 123, 124, 125, 126 and 127, and as the metal material, copper (Cu), aluminum (Al), silver (Ag), tin (Sn), gold (Au), nickel (Ni), lead (Pb), titanium (Ti) or alloys thereof may be used. The plurality of wiring layers 121, 122, 123, 124, 125, 126 and 127 may respectively perform various functions according to a design, and for example, may include a ground pattern, a power pattern, a signal pattern, and the like. In this case, the signal pattern includes various signals, for example, data signals, excluding the ground pattern and the power pattern. Each of these patterns may have a line, a plane, or a pad shape. The plurality of wiring layers 121, 122, 123, 124, 125, 126 and 127 may be formed through a plating process such as an additive process (AP), a semi-AP (SAP), a modified SAP (MSAP), or tenting (TT), and as a result thereof, may each include a seed layer that is an electroless plating layer, and an electrolytic plating layer formed based on the seed layer. A specific layer may further include copper foil.

The plurality of wiring via layers (131, 132, 133, 134, 135, 136, 137) include a first wiring via layer 131 penetrating through the first insulating layer 111 and connecting the first and second wiring layers 121 and 122, a second wiring via layer 132 penetrating through the second insulating layer 112 and the primer layer 140 and connecting the first and third wiring layers 121 and 123, a third wiring via layer 133 penetrating through the third insulating layer 113 and connecting the second and fourth wiring layers 122 and 124, a fourth wiring via layer 134 penetrating through the fourth insulating layer 114 and connecting the third and fifth wiring layers 123 and 125, a fifth wiring via layer 135 penetrating through the fifth insulating layer 115 and connecting the fourth and sixth wiring layers 124 and 126, a sixth wiring via layer 136 penetrating through the sixth insulating layer 116 and connecting the fifth and seventh wiring layers 125 and 127, and an eighth wiring via layer 137 penetrating through the seventh insulating layer 117 and connecting the sixth and eighth wiring layers 126 and 128. The plurality of wiring via layers 131, 132, 133, 134, 135, 136 and 137 may include a smaller number of wiring via layers, or may include a larger number of wiring via layers.

A metal material may be used as a material for the plurality of wiring via layers 131, 132, 133, 134, 135, 136 and 137, and as the metal material, copper (Cu), aluminum (Al), silver (Ag), tin (Sn), gold (Au), nickel (Ni), lead (Pb), titanium (Ti), or alloys thereof may be used. Each of the plurality of wiring via layers 131, 132, 133, 134, 135, 136 and 137 may include a signal connection via, a ground connection via, a power connection via, and the like according to a design. Wiring vias of the plurality of wiring via layers 131, 132, 133, 134, 135, 136 and 137 may be entirely filled with a metal material, or may be formed as the metal material is formed along a wall surface of the via hole. The first wiring via layer 131 may have an hourglass or cylindrical shape. The second to seventh wiring via layers 132, 133, 134, 135, 136 and 137 may have a tapered shape. The second, fourth, and sixth wiring via layers 132, 134 and 136 and the third, fifth and seventh wiring via layers 133, 135 and 137 may have shapes tapered opposite to each other. The plurality of wiring via layers 131, 132, 133, 134, 135, 136 and 137 may be formed by a plating process, for example, AP, SAP, MSAP, TT, etc., and as a result, may include a seed layer that is an electroless plating layer, and an electroplating layer formed on the basis of the seed layer. A specific layer may further include copper foil.

An insulating material may be used as the material of the primer layer 140, and a thermosetting resin such as an epoxy resin or a thermoplastic resin such as polyimide may be used as the insulating material. However, the primer layer 140 may not include an inorganic filler and a reinforcing material. The primer layer 140 may have a lower modulus than each of the plurality of insulating layers 111, 112, 113, 114, 115, 116 and 117, and may have a greater elongation, and also, may have a relatively thinner thickness. The primer layer 140 may be a primer resin of the first metal layer M1 of the wiring patterns 123a and 123b of the third wiring layer 123, and thus may have a relatively thinner thickness.

The passivation layer 150 may protect the seventh wiring layer 127 disposed on the lowermost side from external physical and chemical damage. The passivation layer 150 may be disposed on the sixth insulating layer 116 disposed on the lowermost side to cover the seventh wiring layer 127 disposed on the lowermost side. If necessary, an opening may be formed in the passivation layer 150 to expose at least a portion of the seventh wiring layer 127 disposed on the lowermost side. The material of the passivation layer 150 may be an insulating material. In this case, as the insulating material, a thermosetting resin such as an epoxy resin, a thermoplastic resin such as polyimide, or a material in which these resins are mixed with an inorganic filler, for example, Ajinomoto Build-up Film (ABF), may be used, but is not limited thereto.

FIGS. 5 to 10 are process diagrams schematically illustrating an example of manufacturing the printed circuit board of FIG. 3.

Figure 5:
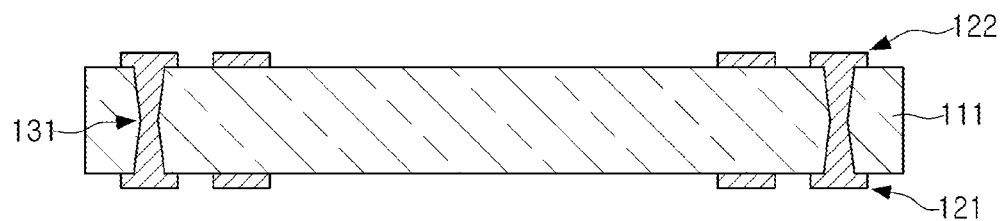
FIGS. 5 to 10 are process diagrams schematically illustrating an example of manufacturing the printed circuit board of FIG. 3.

Referring to FIG. 5, first, a copper clad laminate (CCL) or the like used as the first insulating layer 111 is prepared. Next, a via hole is processed in the first insulating layer 111 using a mechanical drill or the like, and then the via hole is filled by a plating process to form the first wiring via layer 131. In addition, first and second wiring layers 121 and 122 are formed on both surfaces of the first insulating layer 111 by a plating process.

Figure 6:
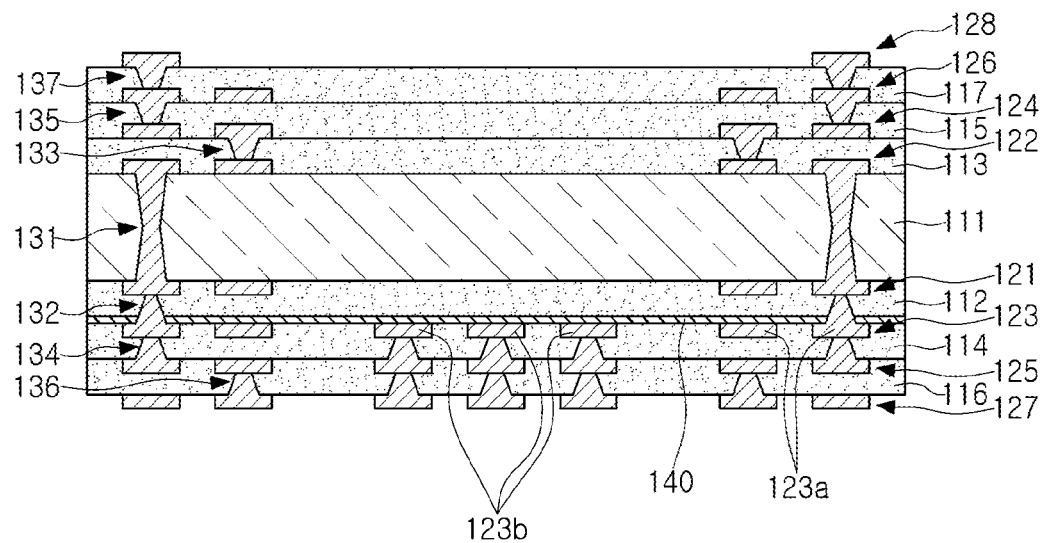

Referring to FIG. 6, next, second to seventh insulating layers 112, 113, 114, 115, 116 and 117 are laminated on both sides of the first insulating layer 111 in a build-up form. In the lamination process of each layer, via holes are formed in the second to seventh insulating layers 112, 113, 114, 115, 116 and 117 by laser processing, etc., respectively, and filled using the plating process, and the second to seventh wiring via layers 132, 133, 134, 135, 136 and 137 are formed, and the third to eighth wiring layers 123, 124, 125, 126, 127 and 128 are formed by a plating process. On the other hand, the second insulating layer 112 may be a prepreg in which copper foil having a primer layer 140 as a primer resin is disposed on one surface. Therefore, after laminating the second insulating layer 112, the primer layer 140 may be disposed between the second and fourth insulating layers 112 and 114. In addition, the third wiring layer 123 may be formed by being plated using copper foil on the primer layer 140 and then patterned in a state including the copper foil.

Figure 7:
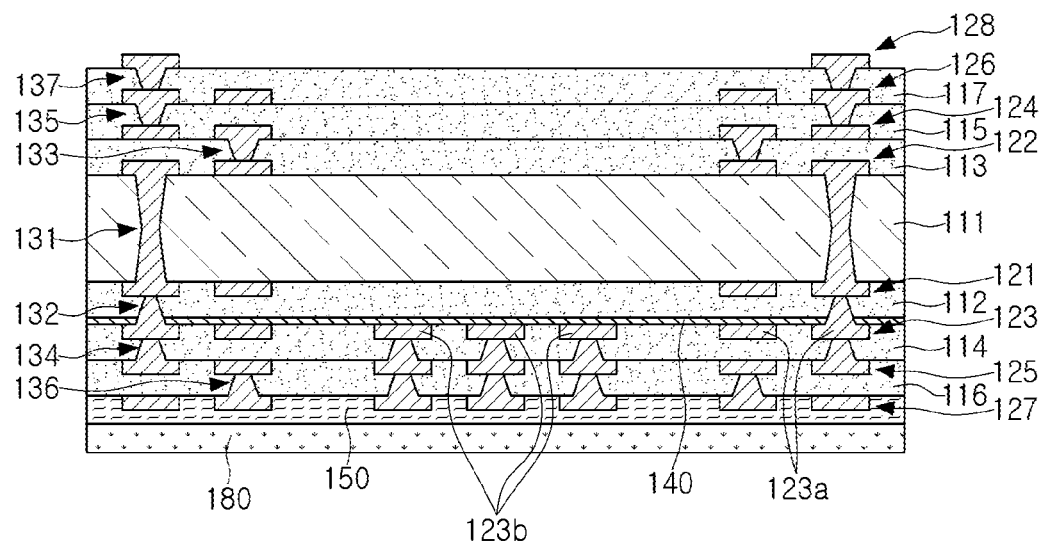

Referring to FIG. 7, next, a detach carrier film 180 is attached to a lower side of the sixth insulating layer 116 disposed at the lowermost side, to have the passivation layer 150 such as ABF disposed therebetween.

Figure 8:
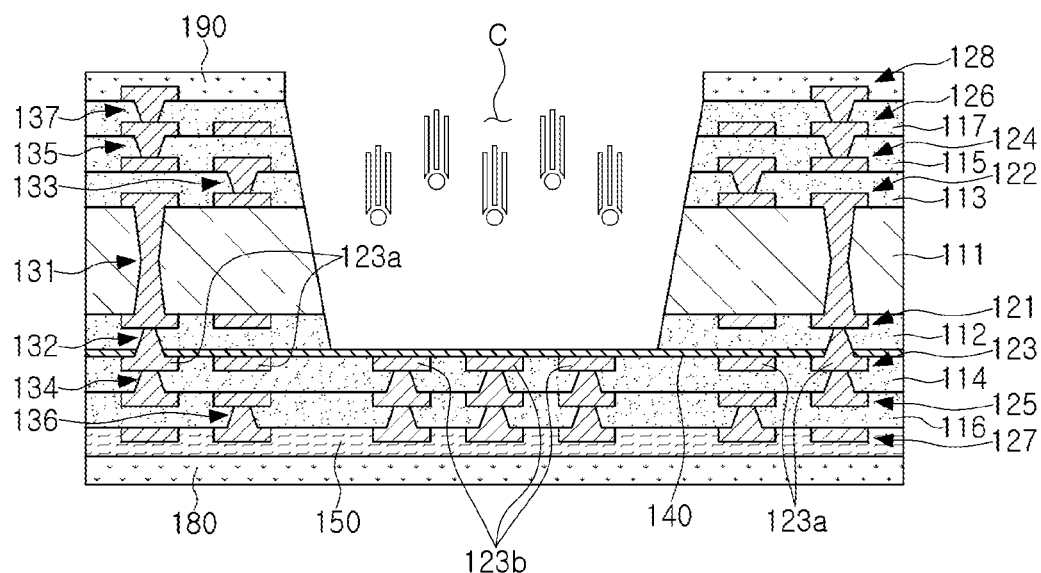

Referring to FIG. 8, next, a dry film 190 is attached on the seventh insulating layer 117 disposed on the uppermost side, and a cavity (C) penetrating through the insulating layers 111, 112, 113, 115 and 117 disposed in the upper side, based on the primer layer 140, is formed by sand blasting. In this case, the primer layer 140 may serve as a barrier.

Figure 9:
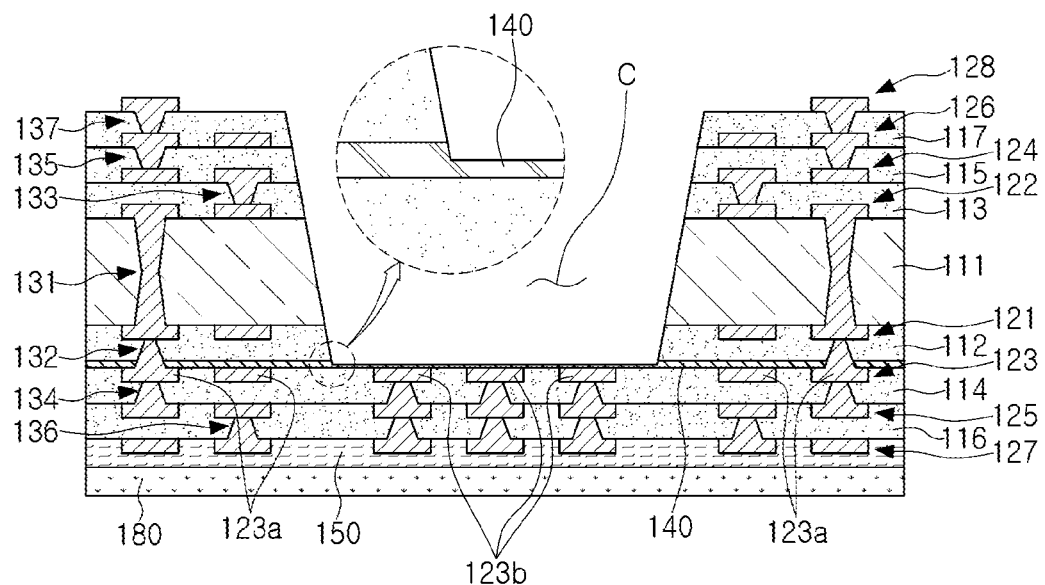

Referring to FIG. 9, next, the dry film 190 is removed. In the sandblasting process, a portion of the primer layer 140 may be etched, and as a result, the thickness of an area of the primer layer 140 exposed by the cavity C is less than the thickness of the area not exposed to the cavity C. If necessary, the printed circuit board 100A according to an example may be manufactured such that the primer layer 140 constitutes the bottom surface of the cavity C.

Figure 10:
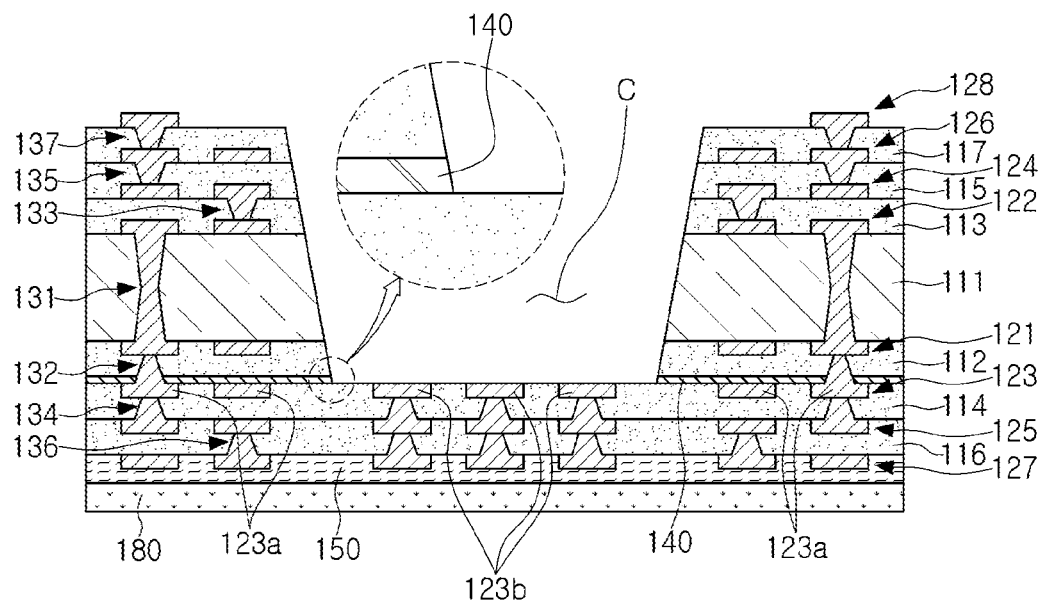

Referring to FIG. 10, next, the primer layer 140 remaining on the bottom surface of the cavity C is removed by an easy method among chemical or physical methods, thereby providing a form in which the cavity C also penetrates through the primer layer 140. As a result, at least a portion of the upper surface of the fourth insulating layer 114 may be exposed by the cavity C. In addition, at least a portion of the upper surface of the wiring pattern 123b of the third wiring layer 123 may be exposed by the cavity C. As such, the printed circuit board 100A according to an example may also be manufactured such that the fourth insulating layer 114 constitutes the bottom surface of the cavity C. Alternatively, as described above, if necessary, the printed circuit board 100A according to an example may be manufactured such that the primer layer 140 constitutes the bottom surface of the cavity C, and in this case, the process described with reference to FIG. 10 may be omitted. In this case, the portion of the primer layer 140 disposed between the second and fourth insulating layers 112 and 114 and exposed by the cavity C, may provide a lowest portion of a side wall of the cavity C, and the lowest portion of the side wall of the cavity C may be in contact with the exposed portion of the primer layer 140 which corresponds to the bottom surface of the cavity C. Although not shown, the printed circuit board 100A including the primer layer 140 with a reduced thickness as the bottom surface of the cavity C may be used to implement an electronic component-embedded substrate 500A2 to be described later.

The printed circuit board 100A according to the example described above may be manufactured through a series of processes, and other details are the same as described above, and detailed descriptions will be omitted.

Figure 11:
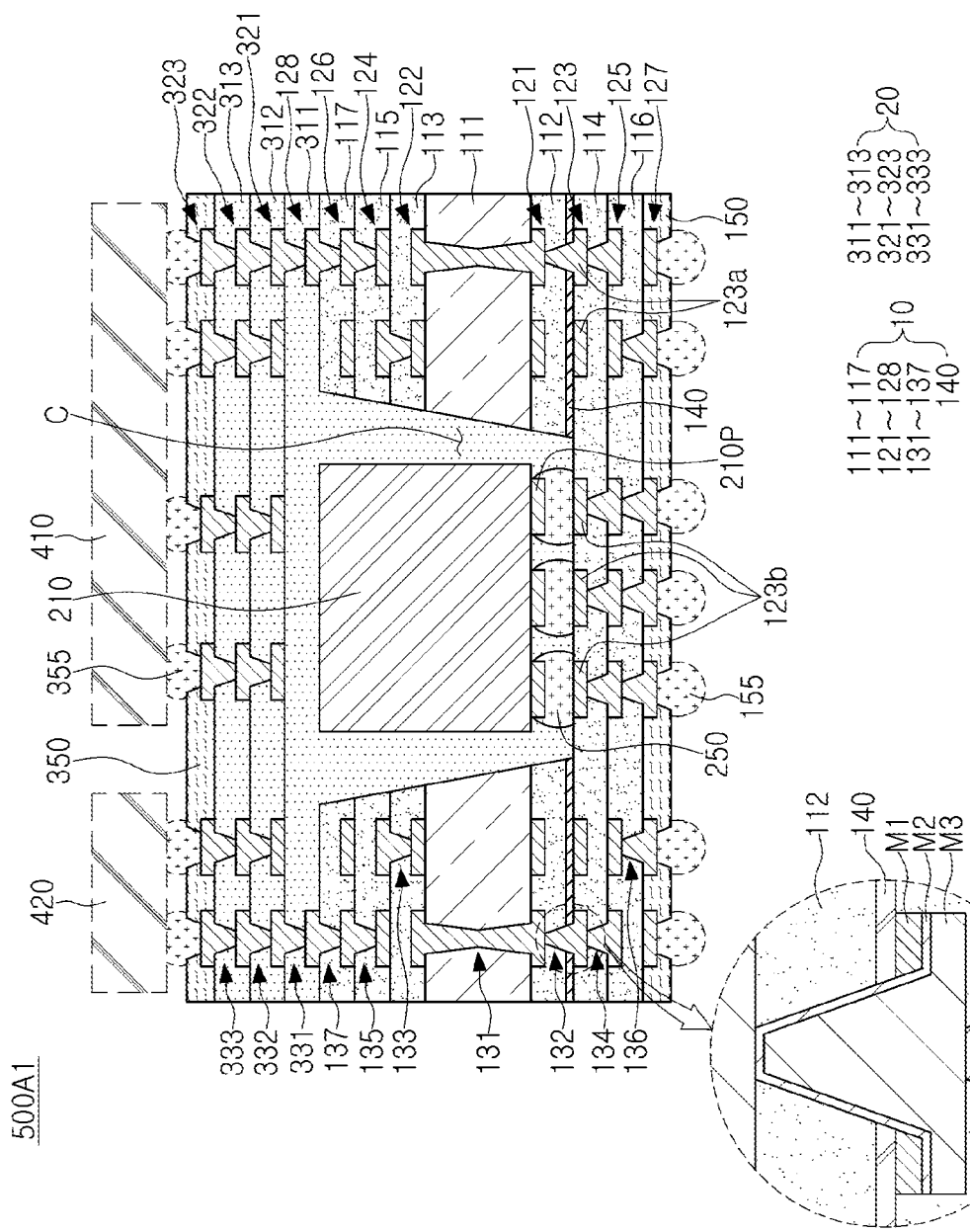
FIG. 11 is a schematic cross-sectional view illustrating an example of an electronic component-embedded substrate including the printed circuit board of FIG. 3.

FIG. 11 is a schematic cross-sectional view illustrating an example of an electronic component-embedded substrate including the printed circuit board of FIG. 3.

Referring to the drawings, an electronic component-embedded substrate 500A1 according to an example includes a core structure 10 having a cavity C, a first electronic component 210 disposed in the cavity C, and a build-up structure 20 disposed on the core structure 10 and the first electronic component 210. If necessary, the electronic component-embedded substrate 500A1 may further include a first passivation layer 150 disposed below the core structure 10, a second passivation layer 350 disposed above the build-up structure 20, a first electrical connection metal 155 disposed on the opening of the first passivation layer 150, a second electrical connection metal 355 disposed on the opening of the second passivation layer 350, and at least one of second and third electronic components 410 and 420 surface-mounted on the build-up structure 20 through the second electrical connection metal 355.

The core structure 10 includes first insulating bodies 111, 112, 113, 114, 115, 116 and 117 including a plurality of insulating layers 111, 112, 113, 114, 115, 116 and 117, a plurality of wiring layers 121, 122, 123, 124, 125, 126 and 127 respectively disposed on or in the first insulating bodies 111, 112, 113, 114, 115, 116 and 117, a plurality of wiring via layers 131, 132, 133, 134, 135, 136 and 137 penetrating through portions of the first insulating bodies 111, 112, 113, 114, 115, 116 and 117, respectively, and connected to the plurality of wiring layers 121, 122, 123, 124, 125, 126, 127 and 128, and a primer layer 140 disposed in the first insulating bodies 111, 112, 113, 114, 115, 116 and 117 and at least partially in contact with any one of the plurality of wiring layers 121, 122, 123, 124, 125, 126 and 127.

The primer layer 140 may have a lower modulus than the first insulating bodies 111, 112, 113, 114, 115, 116 and 117, and may have a relatively greater elongation. The cavity C penetrates through upper side portions 111, 112, 113, 115 and 117 of the first insulating bodies 111, 112, 113, 114, 115, 116 and 117, based on the primer layer 140. The cavity C may further penetrate through the primer layer 140, and as a result, the cavity C may exposed at least a portion 123b of any one 123 of the plurality of wiring layers 121, 122, 123, 124, 125, 126 and 127.

The first electronic component 210 is disposed in the cavity C. The first electronic component 210 may be an IC in which hundreds to millions of devices are integrated into in a single chip. For example, the first electronic component 210 may be a processor chip such as a central processor (for example, a central processing unit (CPU)), a graphics processor (for example, a graphics processing unit (GPU)), a field programmable gate array (FPGA), a digital signal processor, a cryptographic processor, a microprocessor, a microcontroller, or the like, in detail, may be an application processor (AP), but is not limited thereto. In addition, the first electronic component 120 may be a memory such as other volatile memories (for example, a dynamic random access memory (DRAM)), a non-volatile memory (for example, a read only memory (ROM)), a flash memory, or the like; or logic such as an analog-to-digital (ADC) converter, an application-specific integrated circuit (ASIC), or the like. The first electronic component 210 may be disposed in a face-down form such that a connection pad 210P may be electrically connected to at least a portion 123b of the wiring layer 123, exposed through the cavity C, through a connection member 250 such as a solder adhesive. The first electronic component 210 may be a chip-shaped passive component, for example, a chip-shaped inductor or a chip-type capacitor. The first electronic component 210 may be a combination of an IC and a chip-shaped passive component, and in this case, the cavity C may be provided as a plurality of cavities.

The build-up structure 20 includes second insulating bodies 311, 312 and 313 covering at least a portion of each of the core structure 10 and the first electronic component 210, filling at least a portion of the cavity C and including a plurality of insulating layers 311, 312 and 313, a plurality of wiring layers 321, 322 and 323 respectively disposed on or in the second insulating bodies 311, 312 and 313, and a plurality of wiring via layers 331, 332 and 333 respectively penetrating through portions of the second insulating bodies 311, 312 and 313 and connected to the plurality of wiring layers 321, 322 and 323.

The second insulating bodies 311, 312 and 313 include a plurality of insulating layers 311, 312 and 313, and the insulating layers 311, 312 and 313 may be more or less than those illustrated in the drawings. An insulating material may be used as the material of the second insulating body 311, 312 and 313, and as the insulating material, a thermosetting resin such as epoxy resin, a thermoplastic resin such as polyimide, or a material in which these resins are mixed with an inorganic filler, for example, ABF, may be used, but is not limited thereto. If necessary, a material further including a reinforcing material such as glass fiber, for example, a prepreg may be used.

The plurality of wiring layers 321, 322 and 323 may be more or less than those illustrated in the drawings. A metal material may be used as a material for the plurality of wiring layers 321, 322 and 323, and as the metal material, copper (Cu), aluminum (Al), silver (Ag), tin (Sn), gold (Au), nickel (Ni), lead (Pb), titanium (Ti), or alloys thereof may be used. Each of the plurality of wiring layers 321, 322 and 323 may perform various functions according to a design, and for example, may include a ground pattern, a power pattern, a signal pattern, and the like. Each of these patterns may have a line, plane, or pad shape. The plurality of wiring layers 321, 322 and 323 may be formed by plating processes such as AP, SAP, MSAP, TT, etc., and as a result, each include a seed layer that is an electroless plating layer, and an electroplating layer formed based on the seed layer.

The plurality of wiring via layers 331, 332 and 333 may be larger or smaller than those illustrated in the drawings. A metal material may be used as a material for the plurality of wiring via layers 331, 332 and 333, and as the metal material, copper (Cu), aluminum (Al), silver (Ag), tin (Sn), gold (Au), nickel (Ni), lead (Pb), titanium (Ti), or alloys thereof may be used. Each of the plurality of wiring via layers 331, 332 and 333 may include a signal connection via, a ground connection via, a power connection via, and the like according to a design. Wiring vias of the plurality of wiring via layers 331, 332 and 333 may be entirely filled with a metallic material, or may be formed as a metallic material is formed along the wall surface of the via holes. The plurality of wiring via layers 331, 332 and 333 may have a tapered shape. In one example, the plurality of wiring via layers 331, 332 and 333 and the wiring via layers 133, 135 and 137 may be tapered in the same direction. The plurality of wiring via layers 331, 332 and 333 may be formed by a plating process, for example, AP, SAP, MSAP, TT, etc., and as a result, may each have a seed layer as an electroless plating layer, and an electrolytic plating layer formed based on the seed layer.

The first and second passivation layers 150 and 350 may protect a lowermost wiring layer 127 and an uppermost wiring layer 323 from external physical and chemical damage. Each of the first and second passivation layers 150 and 350 may have an opening exposing at least a portion of the wiring layer 127 disposed on the lowermost side and at least a portion of the wiring layer 323 disposed on the uppermost side. The material of the first and second passivation layers 150 and 350 may be an insulating material. In this case, a thermosetting resin such as an epoxy resin, a thermoplastic resin such as polyimide, or a mixture of these resins with an inorganic filler, such as ABF, may be used, but is not limited thereto.

The first and second electrical connection metals 155 and 355 are disposed in the openings of the first and second passivation layers 150 and 350, respectively. The first and second electrical connection metals 155 and 355 are connected to the exposed at least a portion of the wiring layer 127 disposed on the lowermost side and the exposed at least a portion of the wiring layer 323 disposed on the uppermost side, respectively. The first electrical connection metal 155 may physically and/or electrically connect the electronic component-embedded substrate 500A1 to an external device. For example, the electronic component-embedded substrate 500A1 may be mounted on a main board of an electronic device or other Ball Grid Array (BGA) substrates through the first electrical connection metal. The second electrical connection metal 355 may physically and/or electrically connect the electronic component-embedded substrate 500A1 to the second and third electronic components 410 and 420 surface-mounted thereon. The first and second electrical connection metals 155 and 355 may be formed of tin (Sn) or an alloy containing tin (Sn), for example, solder or the like, which is only an example, and thus, the material is not limited thereto. The first and second electrical connection metals 155 and 355 may each be lands, balls, pins, or the like.

The second and third electronic components 410 and 420 may be surface mounted components. The second and third electronic components 410 and 420 may be active components and/or passive components, respectively. Examples of the active component include the IC described above for the electronic component 120. Examples of the passive components include chip-type capacitors such as Multi-Layer Ceramic Capacitor (MLCC), and chip-type inductors such as Power Inductor (PI). If necessary, a molding material covering the second and third electronic components 410 and 420 may be further disposed on the second passivation layer 350, and the molding material may be a known Epoxy Molding Compound (EMC), but is not limited thereto. When the second and third electronic components 410 and 420 are further disposed, the electronic component-embedded substrate 500A1 may be used as a system in package (SiP).

Other details are the same as described above, and detailed descriptions will be omitted.

Figure 12:
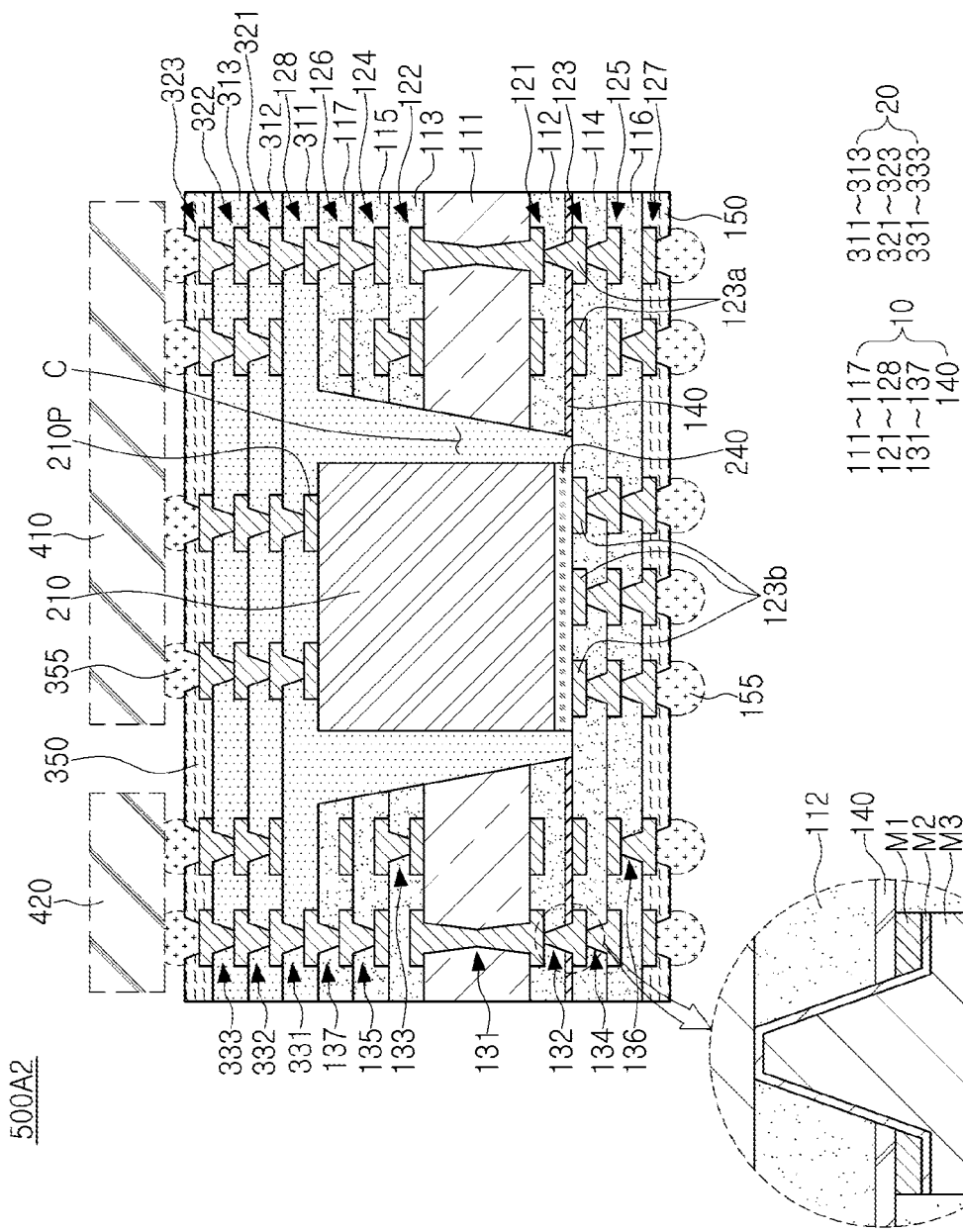
FIG. 12 is a schematic cross-sectional view of another example of an electronic component-embedded substrate including the printed circuit board of FIG. 3.

FIG. 12 is a cross-sectional view schematically illustrating another example of the electronic component-embedded substrate including the printed circuit board of FIG. 3.

Referring to the drawings, in the case of an electronic component-embedded substrate 500A2 according to another example, the first electronic component 210 is disposed in the cavity C in a face-up form in the electronic component-embedded substrate 500A1 according to the above-described example. The first electronic component 210 may be attached to the bottom surface of the cavity C through an adhesive member 240 such as a die attach film (DAF). A connection pad 210P of the first electronic component 210 may be electrically connected to a wiring layer 321 disposed on the lowermost side among the plurality of wiring layers 321, 322 and 323, through at least a portion of a wiring via layer 331 disposed on the lowermost side among the plurality of wiring via layers 331, 332 and 333. The wiring layers 123, 125 and 127 disposed in the lower side, based on the primer layer 140, among the plurality of wiring layers 121, 122, 123, 124, 125, 126, 127 and 128, and the wiring via layers 135 and 137 disposed in the lower side, based on the primer layer 140, among the plurality of wiring via layers 131, 132, 133, 134, 135, 136 and 137, are at least partially, respectively disposed on the lower side of the first electronic component 210, and thus, may be used as a heat dissipation path for dissipating heat received from the back surface of the first electronic component 210.

Other details are the same as described above, and detailed descriptions are omitted.

Figure 13:
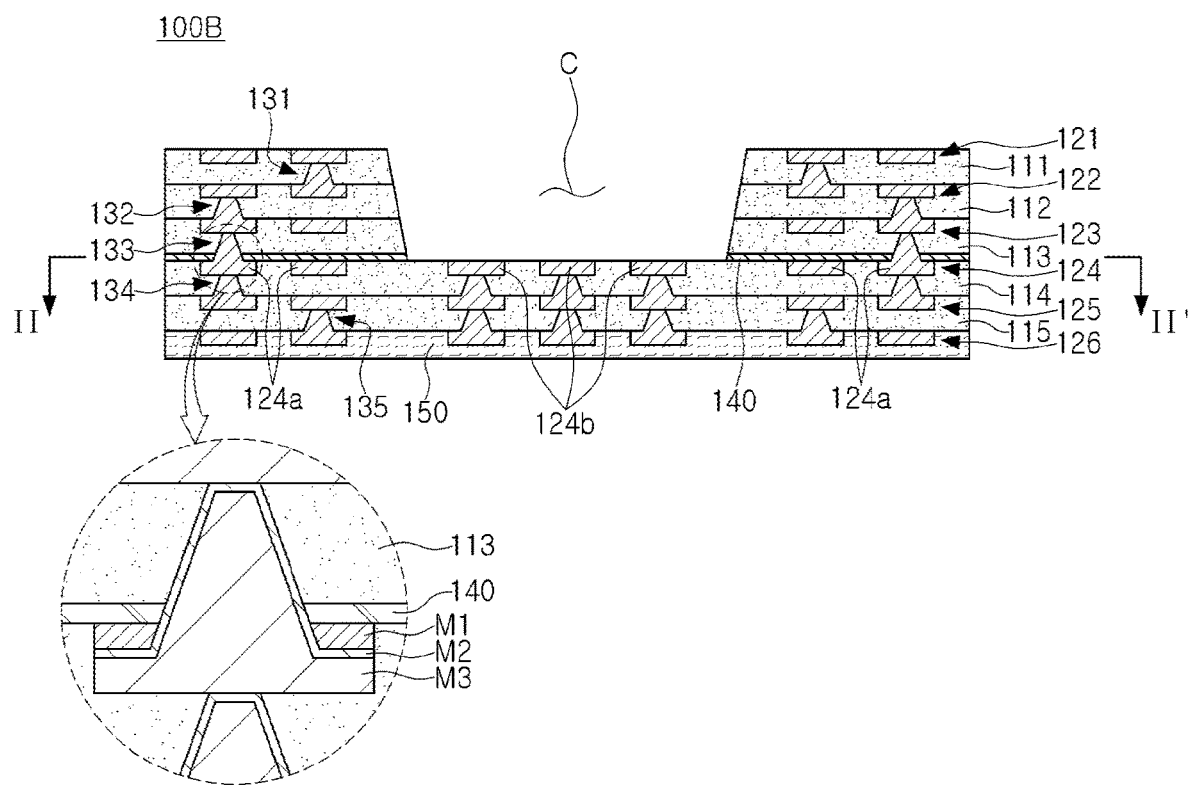
FIG. 13 is a schematic cross-sectional view of another example of a printed circuit board.

FIG. 13 is a schematic cross-sectional view of another example of a printed circuit board.

Figure 14:
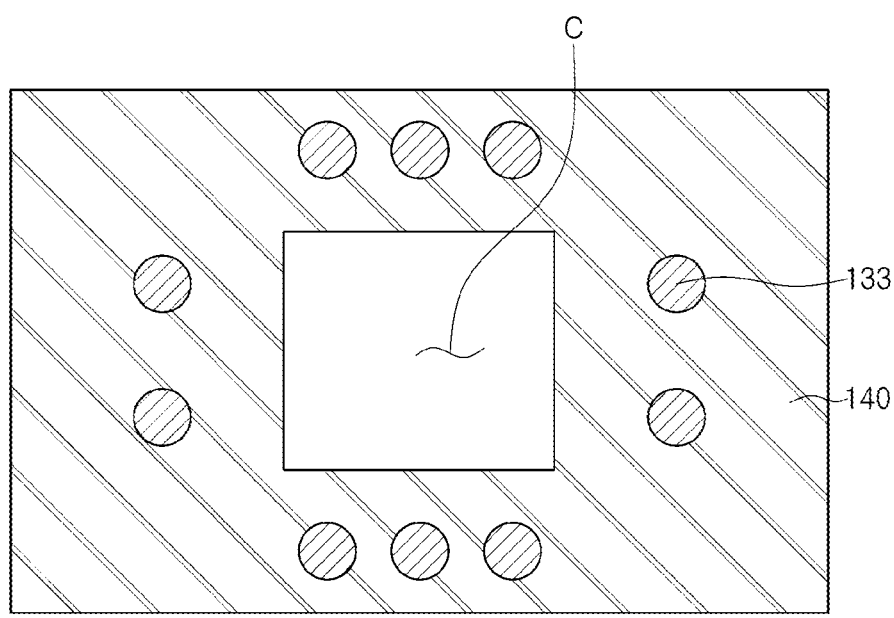
FIG. 14 is a schematic plan view taken along line II-II' of the printed circuit board of FIG. 13.

FIG. 14 is a schematic plan view taken along line II-II' of the printed circuit board of FIG. 13.

Referring to the drawings, a printed circuit board 100B according to another example includes a plurality of insulating layers 111, 112, 113, 114 and 115, a plurality of wiring layers 121, 122, 123, 124, 125 and 126, a plurality of wiring via layers 131, 132, 133, 134 and 135, and a primer layer 140, and may further include a passivation layer 150, if necessary. In addition, the printed circuit board 100B has a cavity C penetrating through the insulating layers 111, 112 and 113 disposed in the upper side, based on the primer layer 140. The cavity C may further penetrate through the primer layer 140, and thus, may exposed a portion of the insulating layer 114 disposed on the uppermost side among the insulating layers 114 and 115 disposed in the lower side, based on the primer layer 140. In addition, the cavity C may expose at least a portion of a wiring pattern 124b of the wiring layer 124 disposed on the uppermost side among the wiring layers 124, 125 and 126 disposed in the lower side, based on the primer layer 140.

In the printed circuit board 100B according to another example, the primer layer 140 is used as a barrier layer for processing the cavity C. In this case, the primer layer 140 may be a primer of a copper foil (M1) provided to use a plating process, for example, SAP, MSAP, or the like, on any insulating layer 113. When the primer layer 140 is used as a barrier layer for processing the cavity C, a separate pattern layer for processing the cavity C is unnecessary. In addition, since the primer layer 140 protects a wiring pattern 124b of the wiring layer 124 that may be exposed later by the cavity C during processing of the cavity C, it is unnecessary to form a separate protective layer. Accordingly, the printed circuit board 100B according to another example may also be reduced in process, and since there is no issue of alignment, a size reduction effect may be provided.

On the other hand, the primer layer 140 may have a lower modulus than each of the plurality of insulating layers 111, 112, 113, 114 and 115, and in this case, may effectively serve as a barrier for processing the cavity C. In addition, the primer layer 140 may have a higher elongation than each of the plurality of insulating layers 111, 112, 113, 114 and 115, and in this case, will more effectively serve as a barrier for processing the cavity C described above. If necessary, the insulating layer 114 disposed on the uppermost side among the insulating layers 114 and 115 disposed in the lower side, based on the primer layer 140, may have a modulus lower than that of each of the insulating layers 111, 112 and 113 disposed in the upper side, based on the primer layer 140, and may have a relatively higher elongation.

On the other hand, the primer layer 140 may include an insulating resin, but may not include an inorganic filler such as silica ($SiO_2$). In this case, adhesion of a wiring pattern 124a of the wiring layer 124 in contact with the primer layer 140 to be described later, for example, the adhesion with the first metal layer M1, may be improved. On the other hand, the plurality of insulating layers 111, 112, 113, 114 and 115 may further include an inorganic filler such as silica in addition to the insulating resin, and may further include a reinforcing material such as glass fiber for rigidity. In this case, the primer layer 140 may have a lower modulus than each of the plurality of insulating layers 111, 112, 113, 114 and 115, and may have relatively high elongation. As a result, the primer layer 140 may effectively serve as a barrier during processing the cavity C. If necessary, the insulating layer 114 disposed on the uppermost side among the insulating layers 114 and 115 disposed in the lower side, based on the primer layer 140, further includes an inorganic filler such as silica in addition to the insulating resin, but may not include a reinforcing material such as glass fiber.

The primer layer 140 may be thinner than each of the plurality of insulating layers 111, 112, 113, 114 and 115. Therefore, the presence of the primer layer 140 may not significantly affect the overall thickness of the printed circuit board 100B. The thickness of the primer layer 140 may be about several hundred nanometers (nm) to several micrometers (μm), for example, about 0.1 μm to 5 μm, but is not limited thereto.

On the other hand, the wiring pattern 124a of the wiring layer 124, disposed on the uppermost side among the wiring layers 124, 125 and 126 disposed in the lower side, based on the primer layer 140, is disposed on the primer layer 140 to be in contact therewith. The wiring pattern 124a may be positioned on the same level as the wiring pattern 124b, and the wiring pattern 124a and the wiring pattern 124b may be at least partially embedded in the insulating layer 114 disposed in the lower side, based on the primer layer 140. Each of the wiring patterns 124a and 124b may include first to third metal layers M1, M2 and M3. The first metal layer M1 may be thicker than the second metal layer M2, but may be thinner than the third metal layer M3. The first metal layer M1 may be a copper foil having the primer layer 140 as a primer resin, and the second metal layer M2 may be a seed layer including copper (Cu) and/or titanium (Ti), formed by electroless plating. The third metal layer M3 may be a plating layer including copper (Cu) formed by electrolytic plating, but the configurations are not limited thereto.

On the other hand, in another example, the cavity C is formed to penetrate through the insulating layers 111, 112 and 113 disposed in the upper side, based on the primer layer 140, and the cavity C is not formed in the insulating layer 114 in which at least a portion of the wiring layer 124 in contact with the primer layer 140 is embedded. For example, at least a portion of the wiring layer 124 in contact with the primer layer 140 may be embedded in the insulating layer 114 in which the cavity C is not formed. However, the present disclosure is not limited thereto, and if necessary, the cavity C may be formed to penetrate through the insulating layers 111, 112 and 113 disposed in the upper side, based on the primer layer 140, and in this case, the cavity C may also be formed in the insulating layer 114 in which at least a portion of the wiring layer 124 in contact with the primer layer 140 is embedded. For example, at least a portion of the wiring layer 124 in contact with the primer layer 140 may be embedded in the insulating layer 114 in which the cavity C is formed.

Hereinafter, each configuration included in the printed circuit board 100B according to another example will be described in more detail with reference to the drawings.

The plurality of insulating layers (111, 112, 113, 114, 115) include a first insulating layer 111, a second insulating layer 112 disposed on the first insulating layer 111, a third insulating layer 113 disposed on the second insulating layer 112, a fourth insulating layer 114 disposed on the third insulating layer 113, and a fifth insulating layer 115 disposed on the fourth insulating layer 114. The plurality of insulating layers 111, 112, 113, 114 and 115 may include a smaller number of insulating layers, or may include a larger number of insulating layers. An insulating material may be used as a material for the plurality of insulating layers 111, 112, 113, 114 and 115, and as the insulating material, a thermosetting resin such as epoxy resin or a thermoplastic resin such as polyimide, and a material in which these resins are mixed with an inorganic filler such as silica or the like, and/or a reinforcing material such as glass fibers, for example, prepregs may be used. If necessary, ABF may be used as the material of the fourth insulating layer 114.

The plurality of wiring layers (121, 122, 123, 124, 125, 126) include a first wiring layer 121 embedded in an upper side of the first insulating layer 111, a second wiring layer 122 disposed on the lower surface of the first insulating layer 111 and embedded in an upper side of the second insulating layer 112, a third wiring layer 123 disposed on the lower surface of the second insulating layer 112 and embedded in an upper side of the third insulating layer 113, a fourth wiring layer 124 disposed on the lower surface of the third insulating layer 123 and embedded in an upper side of the fourth insulating layer 114, a fifth wiring layer 125 disposed on the lower surface of the fourth insulating layer 114 and embedded in an upper side of the fifth insulating layer 115, and a sixth wiring layer 126 disposed on a lower surface of the fifth insulating layer 115. The plurality of wiring layers 121, 122, 123, 124, 125 and 126 may include a smaller number of wiring layers, or may include a larger number of wiring layers. A metal material may be used as a material for the plurality of wiring layers 121, 122, 123, 124, 125 and 126, and as the metal material, copper (Cu), aluminum (Al), silver (Ag), tin (Sn), gold (Au), nickel (Ni), lead (Pb), titanium (Ti), or alloys thereof may be used. Each of the plurality of wiring layers 121, 122, 123, 124, 125 and 126 may perform various functions according to a design. For example, the plurality of wiring layers 121, 122, 123, 124, 125 and 126 may include a ground pattern, a power pattern, a signal pattern, and the like. Each of these patterns may have a line, plane, or pad shape. The plurality of wiring layers 121, 122, 123, 124, 125 and 126 may be formed by a plating process such as AP, SAP, MSAP, TT, etc., and as a result, may each include a seed layer as an electroless plating layer, and an electrolytic plating layer that is formed using the seed layer as a basic layer. A specific layer may further include copper foil.

The plurality of wiring via layers (131, 132, 133, 134, 135) include a first wiring via layer 131 penetrating through the first insulating layer 111 and connecting the first and second wiring layers 121 and 122, a second wiring via layer 132 penetrating through the second insulating layer 112 and connecting the second and third wiring layers 122 and 123, a third wiring via layer 133 penetrating through the third insulating layer 113 and the primer layer 140 and connecting the third and fourth wiring layers 123 and 124, a fourth wiring via layer 134 penetrating through the fourth insulating layer 114 and connecting the fourth and fifth wiring layers 124 and 125, and a fifth wiring via layer 135 penetrating through the fifth insulating layer 115 and connecting the fifth and sixth wiring layers 125 and 126. The plurality of wiring via layers 131, 132, 133, 134 and 135 may include a smaller number of wiring via layers, or may include a larger number of wiring via layers. A metal material may be used as a material for the plurality of wiring via layers 131, 132, 133, 134 and 135, and as the metal material, copper (Cu), aluminum (Al), silver (Ag), tin (Sn), gold (Au), nickel (Ni), lead (Pb), titanium (Ti), or alloys thereof may be used. Each of the plurality of wiring via layers 131, 132, 133, 134 and 135 may include a signal connection via, a ground connection via, a power connection via, and the like according to a design. Wiring vias of the plurality of wiring via layers 131, 132, 133, 134 and 135 may be entirely filled with a metallic material, or may be formed as a metallic material is formed along the wall surface of the via holes. Each of the plurality of wiring via layers 131, 132, 133, 134 and 135 may have a tapered shape. In one example, the plurality of wiring via layers 131, 132, 133, 134 and 135 may be tapered in the same direction. The plurality of wiring via layers 131, 132, 133, 134 and 135 may be formed by a plating process, for example, AP, SAP, MSAP, TT, etc., and as a result, may each include a seed layer as an electroless plating layer, and an electrolytic plating layer formed on the basis of the seed layer. A specific layer may further include copper foil.

An insulating material may be used as the material of the primer layer 140, and a thermosetting resin such as an epoxy resin or a thermoplastic resin such as polyimide may be used as the insulating material. However, the primer layer 140 may not include an inorganic filler and a reinforcing material. The primer layer 140 may have a lower modulus than each of the plurality of insulating layers 111, 112, 113, 114 and 115, and may have a relatively higher elongation, and also, may have a relatively reduced thickness. The primer layer 140 may be a primer resin of the first metal layer M1 of the wiring patterns 124*a* and 124*b* of the fourth wiring layer 124, and thus may have a relatively thinner thickness.

The passivation layer 150 may protect the sixth wiring layer 126 disposed on the lowermost side from external physical and chemical damage. The passivation layer 150 may be disposed on the fifth insulating layer 115 disposed on the lowermost side to cover the sixth wiring layer 126 disposed on the lowermost side. If necessary, an opening may be formed in the passivation layer 150 to expose at least a portion of the sixth wiring layer 126 disposed on the lowermost side. The material of the passivation layer 150 may be an insulating material. In this case, a thermosetting resin such as an epoxy resin, a thermoplastic resin such as polyimide, or a material in which these resins are mixed with an inorganic filler, for example, ABF may be used as the insulating material, but is not limited thereto.

Other details are the same as described above, and detailed descriptions will be omitted.

FIGS. 15 to 19 are process diagrams schematically illustrating an example of manufacturing the printed circuit board of FIG. 13.

Figure 15:
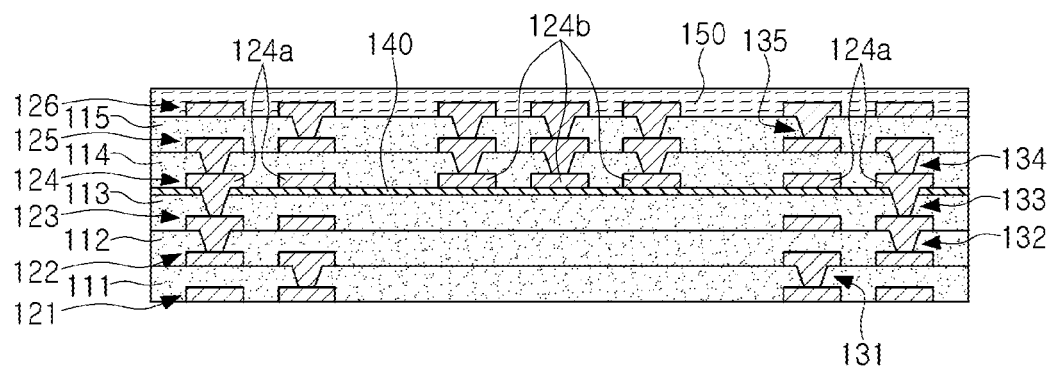
FIGS. 15 to 19 are process diagrams schematically illustrating an example of manufacturing the printed circuit board of FIG. 13.

Referring to FIG. 15, first, first to fifth insulating layers 111, 112, 113, 114 and 115, first to sixth wiring layers 121, 122, 123, 124, 125 and 126, and first to fifth wiring via layers 131, 132, 133, 134 and 135 are formed in a coreless process using a detach carrier. For example, the first wiring layer 121 is formed on a detach carrier film by a plating process, the first wiring layer 121 is embedded by laminating the first insulating layer 111 on the detach carrier film, the first wiring via layer 131 is formed by a plating process after processing a via hole in the first insulating layer 111 by laser processing or the like, and at this time, the second wiring layer 122 is also formed on the first insulating layer 111 together therewith. By repeating this build-up process, the remaining second to fifth insulating layers 112, 113, 114 and 115, third to sixth wiring layers 123, 124, 125 and 126, and second to fifth wiring via layers 132, 133, 134 and 135 are formed. A laminate may be formed through a series of processes. On the other hand, the third insulating layer 113 may be a prepreg in which copper foil having a primer layer 140 as a primer resin is disposed on one surface. Therefore, after laminating the third insulating layer 113, the primer layer 140 may be disposed between the third and fourth insulating layers 113 and 114. In addition, the fourth wiring layer 124 may be formed by being plated using copper foil on the primer layer 140 and then being patterned to include the copper foil.

Figure 16:
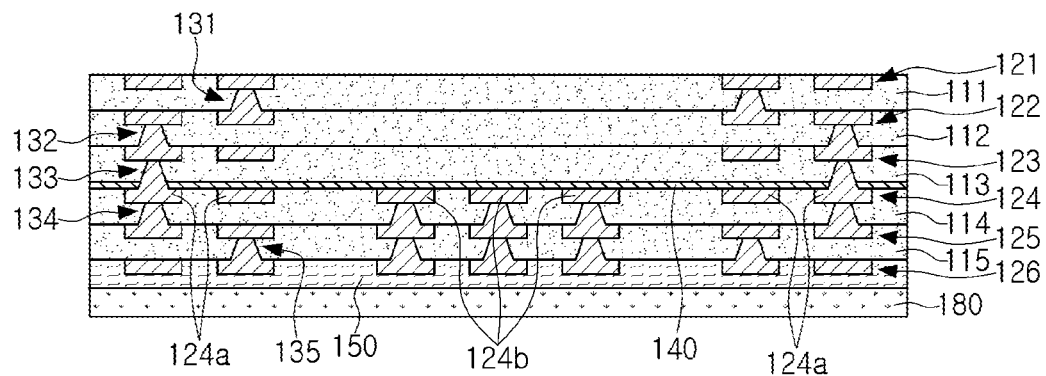

Referring to FIG. 16, next, after separating the laminate from the detach carrier, the laminate is inverted up and down as necessary, and a detach carrier film 180 is attached to a lower side of the fifth insulating layer 115 disposed on the lowermost side, to have the passivation layer 150 formed of ABF or the like therebetween.

Figure 17:
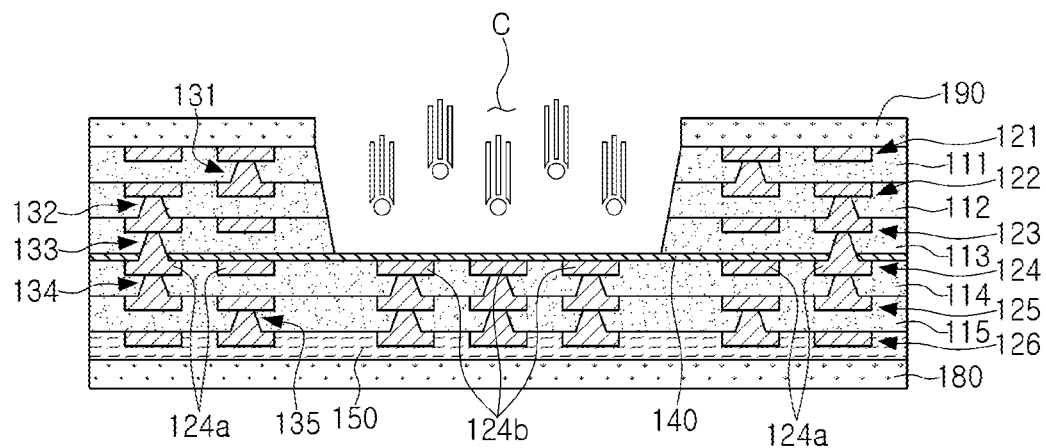

Referring to FIG. 17, next, a dry film 190 is attached on the first insulating layer 111 disposed on the uppermost side, and a cavity C is formed to penetrate through the insulating layers 111, 112 and 113 disposed in the upper side, based on the primer layer 140, by sandblasting. In this case, the primer layer 140 may serve as a barrier.

Figure 18:
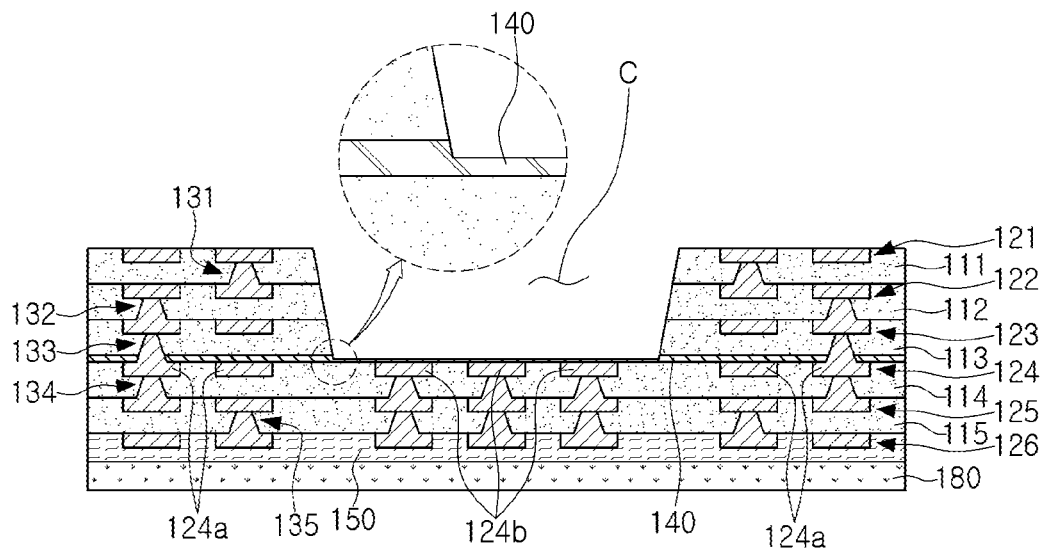

Referring to FIG. 18, next, the dry film 190 is removed. In the sandblasting process, a portion of the primer layer 140 may be etched, and as a result, the thickness of the area of the primer layer 140 exposed by the cavity C is thinner than the thickness of the area thereof not exposed to the cavity C. If necessary, the printed circuit board 100B according to another example may be manufactured such that the primer layer 140 constitutes the bottom surface of the cavity C.

Figure 19:
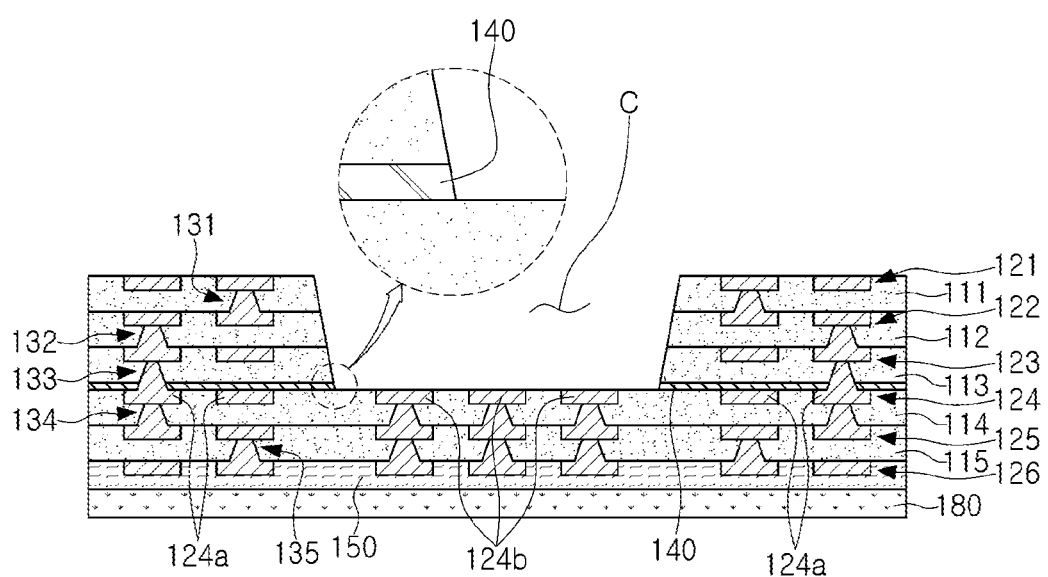

Referring to FIG. 19, next, the primer layer 140 remaining on the bottom surface of the cavity C is removed by an easy method among chemical or physical methods, and as a result, has a structure in which the cavity C also penetrates through the primer layer 140. As a result, at least a portion of the upper surface of the fourth insulating layer 114 may be exposed by the cavity C. Further, at least a portion of the upper surface of the wiring pattern 124b of the fourth wiring layer 124 may be exposed by the cavity C. As such, the printed circuit board 100B according to another example may be manufactured so that the fourth insulating layer 114 constitutes the bottom surface of the cavity C. Alternatively, as described above, if necessary, the printed circuit board 100B according to another example may be manufactured such that the primer layer 140 constitutes the bottom surface of the cavity C, and in this case, the process described with reference to FIG. 19 may be omitted. Although not shown, the printed circuit board 100B including the primer layer 140 with a reduced thickness as the bottom surface of the cavity C may be used to implement an electronic component-embedded substrate 500B2 to be described later.

The printed circuit board 100B according to the example described above may be manufactured through a series of processes, and other details are the same as described above, and detailed descriptions will be omitted.

Figure 20:
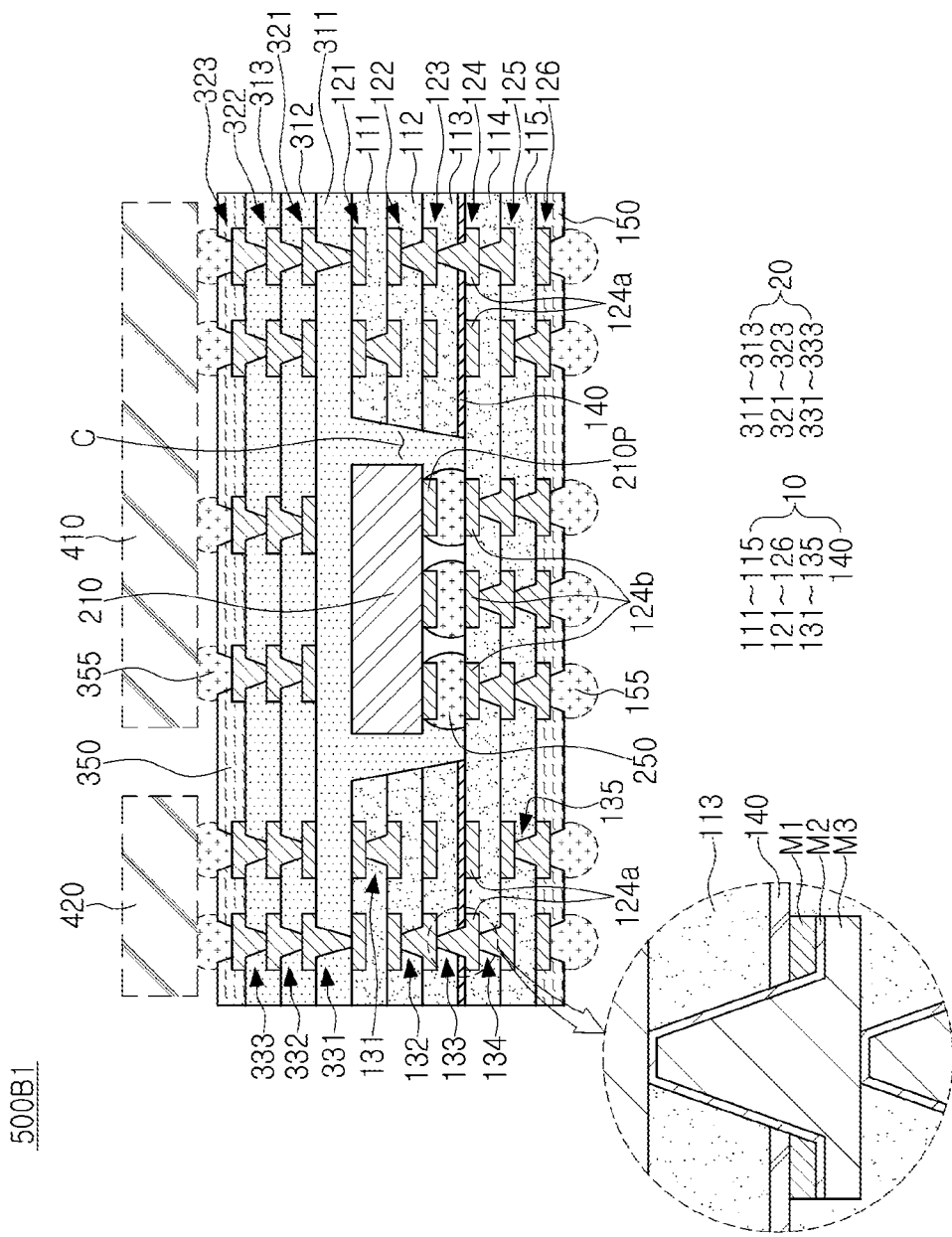
FIG. 20 is a schematic cross-sectional view illustrating an example of an electronic component-embedded substrate including the printed circuit board of FIG. 13.

FIG. 20 is a schematic cross-sectional view illustrating an example of an electronic component-embedded substrate including the printed circuit board of FIG. 13.

Referring to the drawings, an electronic component-embedded substrate 500B1 according to an example includes a core structure 10 having a cavity C, a first electronic component 210 disposed in the cavity C, and a build-up structure 20 disposed on the core structure 10 and the first electronic component 210. If necessary, the electronic component-embedded substrate 500B1 may further include a first passivation layer 150 disposed below the core structure 10, a second passivation layer 350 disposed above the build-up structure 20, a first electrical connection metal 155 disposed on an opening of the first passivation layer 150, a second electrical connection metal 355 disposed on an opening of the second passivation layer 350, and at least one of second and third electronic components 410 and 420 surface-mounted on the build-up structure 20 through the second electrical connection metal 355.

The core structure 10 includes first insulating bodies 111, 112, 113, 114 and 115 including a plurality of insulating layers 111, 112, 113, 114 and 115, a plurality of wiring layers 121, 122, 123, 124, 125 and 126 disposed on or in the first insulating bodies 111, 112, 113, 114 and 115, respectively, a plurality of wiring via layers 131, 132, 133, 134, 135 and 136 penetrating through portions of the first insulating bodies 111, 112, 113, 114 and 115, respectively, and connected to the plurality of wiring layers 121, 122, 123, 124, 125 and 126, and a primer layer 140 disposed in the first insulating bodies 111, 112, 113, 114 and 115 and at least partially in contact with any one of the plurality of wiring layers 121, 122, 123, 124, 125 and 126.

The primer layer 140 may have a lower modulus than the first insulating bodies 111, 112, 113, 114 and 115, and may have relatively higher elongation. The cavity C penetrates through upper side portions 111, 112 and 113 of the first insulating bodies 111, 112, 113, 114 and 115, based on the primer layer 140. The cavity C may further penetrate through the primer layer 140, and as a result, the cavity C may expose at least a portion 124b of any one 124 of the plurality of wiring layers 121, 122, 123, 124, 125 and 126.

The first electronic component 210 is disposed in the cavity C. The first electronic component 210 may be an IC in which hundreds to millions of devices are integrated into in a single chip. For example, the first electronic component 120 may be a processor chip such as a central processor (for example, a central processing unit (CPU)), a graphics processor (for example, a graphics processing unit (GPU)), a field programmable gate array (FPGA), a digital signal processor, a cryptographic processor, a microprocessor, a microcontroller, or the like, in detail, may be an AP, but is not limited thereto. In addition, the first electronic component 210 may be a memory such as other volatile memories (for example, a dynamic random access memory (DRAM)), a non-volatile memory (for example, a read only memory (ROM)), a flash memory, or the like; or logic such as an analog-to-digital (ADC) converter, an ASIC, or the like. The first electronic component 210 may be disposed in a face-down form such that a connection pad 210P may be electrically connected to at least a portion 124b of the wiring layer 124, exposed through the cavity C, through a connection member 250 such as a solder adhesive. The first electronic component 210 may be a chip-shaped passive component, for example, a chip-shaped inductor or a chip-type capacitor. The first electronic component 210 may be a combination of an IC and a chip-shaped passive component, and in this case, the cavity C may be provided as a plurality of cavities.

The build-up structure 20 includes second insulating bodies 311, 312 and 313 covering at least a portion of each of the core structure 10 and the first electronic component 210, filling at least a portion of the cavity C and including a plurality of insulating layers 311, 312 and 313, a plurality of wiring layers 321, 322 and 323 respectively disposed on or in the second insulating bodies 311, 312 and 313, and a plurality of wiring via layers 331, 332 and 333 respectively penetrating through portions of the second insulating bodies 311, 312 and 313 and connected to the plurality of wiring layers 321, 322 and 323.

The second insulating bodies 311, 312 and 313 include a plurality of insulating layers 311, 312 and 313, and the insulating layers 311, 312 and 313 may be more or less than those illustrated in the drawings. An insulating material may be used as the material of the second insulating body 311, 312 and 313, and as the insulating material, a thermosetting resin such as epoxy resin, a thermoplastic resin such as polyimide, or a material in which these resins are mixed with an inorganic filler, for example, ABF, may be used, but is not limited thereto. If necessary, a material further including a reinforcing material such as glass fiber, for example, a prepreg may be used.

The plurality of wiring layers 321, 322 and 323 may be more or less than those illustrated in the drawings. A metal material may be used as a material for the plurality of wiring layers 321, 322 and 323, and as the metal material, copper (Cu), aluminum (Al), silver (Ag), tin (Sn), gold (Au), nickel (Ni), lead (Pb), titanium (Ti), or alloys thereof may be used.

Each of the plurality of wiring layers 321, 322 and 323 may perform various functions according to a design, and for example, may include a ground pattern, a power pattern, a signal pattern, and the like. Each of these patterns may have a line, plane, or pad shape. The plurality of wiring layers 321, 322 and 323 may be formed by plating processes such as AP, SAP, MSAP, TT, etc., and as a result, each include a seed layer that is an electroless plating layer, and an electroplating layer formed based on the seed layer.

The plurality of wiring via layers 331, 332 and 333 may be larger or smaller than those illustrated in the drawings. A metal material may be used as a material for the plurality of wiring via layers 331, 332 and 333, and as the metal material, copper (Cu), aluminum (Al), silver (Ag), tin (Sn), gold (Au), nickel (Ni), lead (Pb), titanium (Ti), or alloys thereof may be used. Each of the plurality of wiring via layers 331, 332 and 333 may include a signal connection via, a ground connection via, a power connection via, and the like according to a design. Wiring vias of the plurality of wiring via layers 331, 332 and 333 may be entirely filled with a metallic material, or may be formed as a metallic material is formed along the wall surface of the via holes. The plurality of wiring via layers 331, 332 and 333 may have a tapered shape. In one example, the plurality of wiring via layers 331, 332 and 333 and the wiring via layers 131, 132, 133, 134, and 135 may be tapered in opposite directions. The plurality of wiring via layers 331, 332 and 333 may be formed by a plating process, for example, AP, SAP, MSAP, TT, etc., and as a result, may each have a seed layer as an electroless plating layer, and an electrolytic plating layer formed based on the seed layer.

The first and second passivation layers 150 and 350 may protect a lowermost wiring layer 126 and an uppermost wiring layer 323 from external physical and chemical damage. Each of the first and second passivation layers 150 and 350 may have an opening exposing at least a portion of the wiring layer 126 disposed on the lowermost side and at least a portion of the wiring layer 323 disposed on the uppermost side. The material of the first and second passivation layers 150 and 350 may be an insulating material. In this case, a thermosetting resin such as an epoxy resin, a thermoplastic resin such as polyimide, or a mixture of these resins with an inorganic filler, such as ABF, may be used, but is not limited thereto.

The first and second electrical connection metals 155 and 355 are disposed in the openings of the first and second passivation layers 150 and 350, respectively. The first and second electrical connection metals 155 and 355 are connected to the exposed at least a portion of the wiring layer 126 disposed on the lowermost side and the exposed at least a portion of the wiring layer 323 disposed on the uppermost side, respectively. The first electrical connection metal 155 may physically and/or electrically connect the electronic component-embedded substrate 500B1 to an external device. For example, the electronic component-embedded substrate 500B1 may be mounted on a main board of an electronic device or other BGA substrates through the first electrical connection metal. The second electrical connection metal 355 may physically and/or electrically connect the electronic component-embedded substrate 500B1 to the second and third electronic components 410 and 420 surface-mounted thereon. The first and second electrical connection metals 155 and 355 may be formed of tin (Sn) or an alloy containing tin (Sn), for example, solder or the like, which is only an example, and thus, the material is not limited thereto. The first and second electrical connection metals 155 and 355 may each be lands, balls, pins, or the like.

The second and third electronic components 410 and 420 may be surface mounted components. The second and third electronic components 410 and 420 may be active components and/or passive components, respectively. Examples of the active component include the IC described above for the electronic component 120. Examples of the passive components include chip-type capacitors such as an MLCC, and chip-type inductors such as PI. If necessary, a molding material covering the second and third electronic components 410 and 420 may be further disposed on the second passivation layer 350, and the molding material may be a known EMC, but is not limited thereto. When the second and third electronic components 410 and 420 are further disposed, the electronic component-embedded substrate 500B1 may be used as a SiP.

Other details are the same as described above, and detailed descriptions will be omitted.

Figure 21:
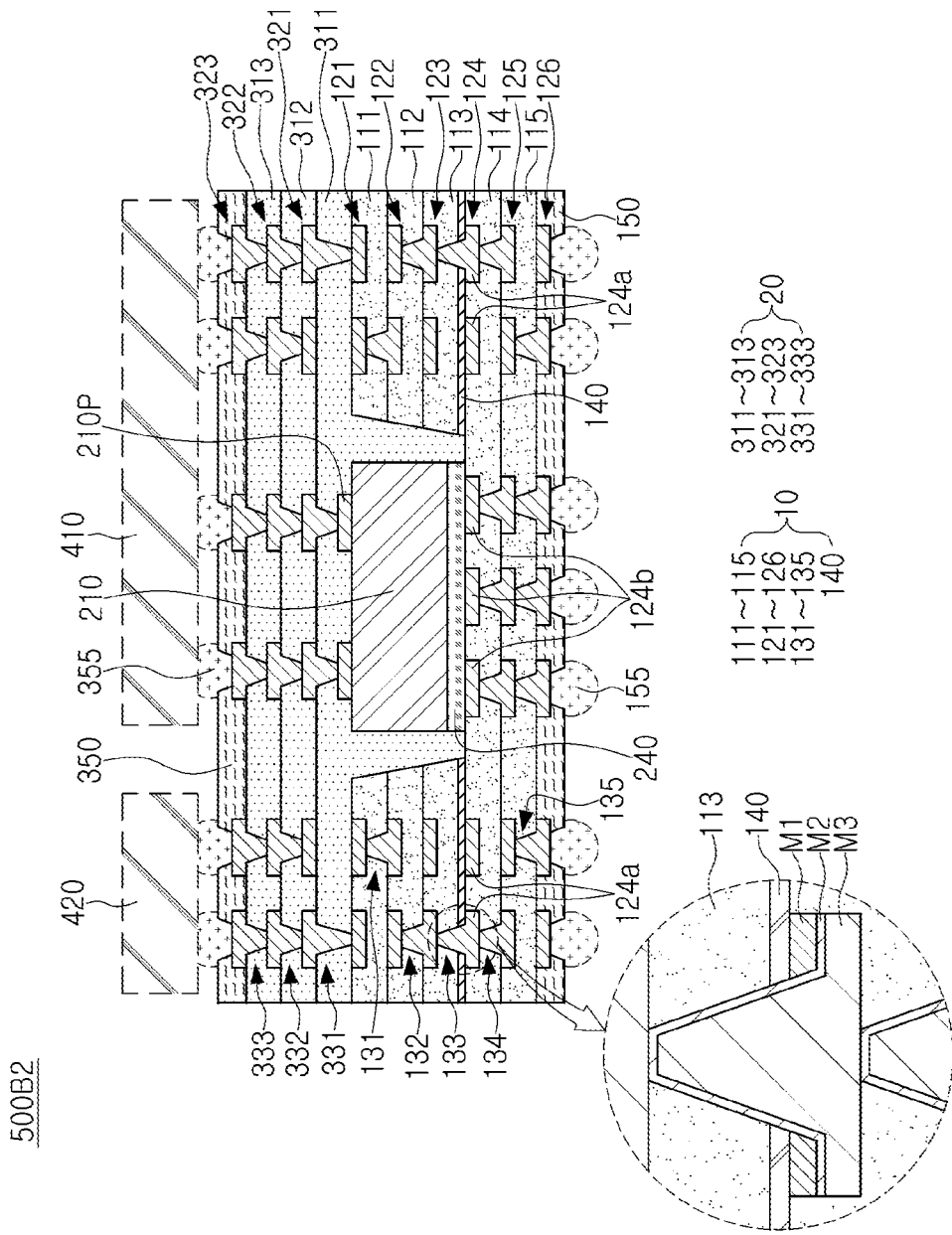
FIG. 21 is a cross-sectional view schematically illustrating another example of the electronic component-embedded substrate including the printed circuit board of FIG. 13.

FIG. 21 is a cross-sectional view schematically illustrating another example of an electronic component-embedded substrate including the printed circuit board of FIG. 13.

Referring to the drawings, in the case of an electronic component-embedded substrate 500B2 according to another example, the first electronic component 210 is disposed in the cavity C in a face-up form in the electronic component-embedded substrate 500B1 according to the above-described example. The first electronic component 210 may be attached to the bottom surface of the cavity C through an adhesive member 240 such as a die attach film (DAF). A connection pad 210P of the first electronic component 210 may be electrically connected to a wiring layer 321 disposed on the lowermost side among the plurality of wiring layers 321, 322 and 323, through at least a portion of a wiring via layer 331 disposed on the lowermost side among the plurality of wiring via layers 331, 332 and 333. The wiring layers 124, 125 and 126 disposed in the lower side, based on the primer layer 140, among the plurality of wiring layers 121, 122, 123, 124, 125 and 126, and the wiring via layers 134 and 135 disposed in the lower side, based on the primer layer 140, among the plurality of wiring via layers 131, 132, 133, 134 and 135, are at least partially, respectively disposed on the lower side of the first electronic component 210, and thus, may be used as a heat dissipation path for dissipating heat received from the back surface of the first electronic component 210.

Other details are the same as described above, and detailed descriptions are omitted.

Figure 22:
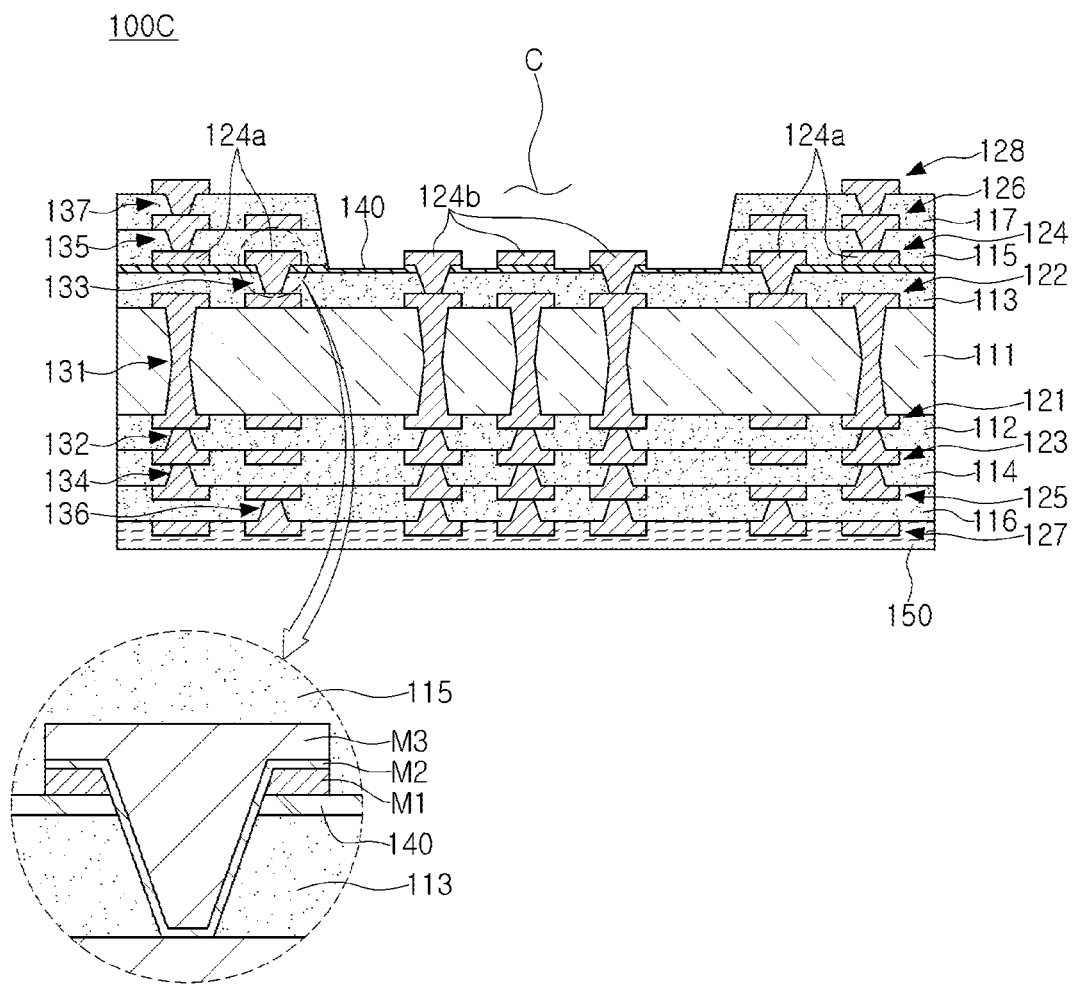
FIG. 22 is a schematic cross-sectional view of another example of a printed circuit board.

FIG. 22 is a schematic cross-sectional view of another example of a printed circuit board.

Figure 23:
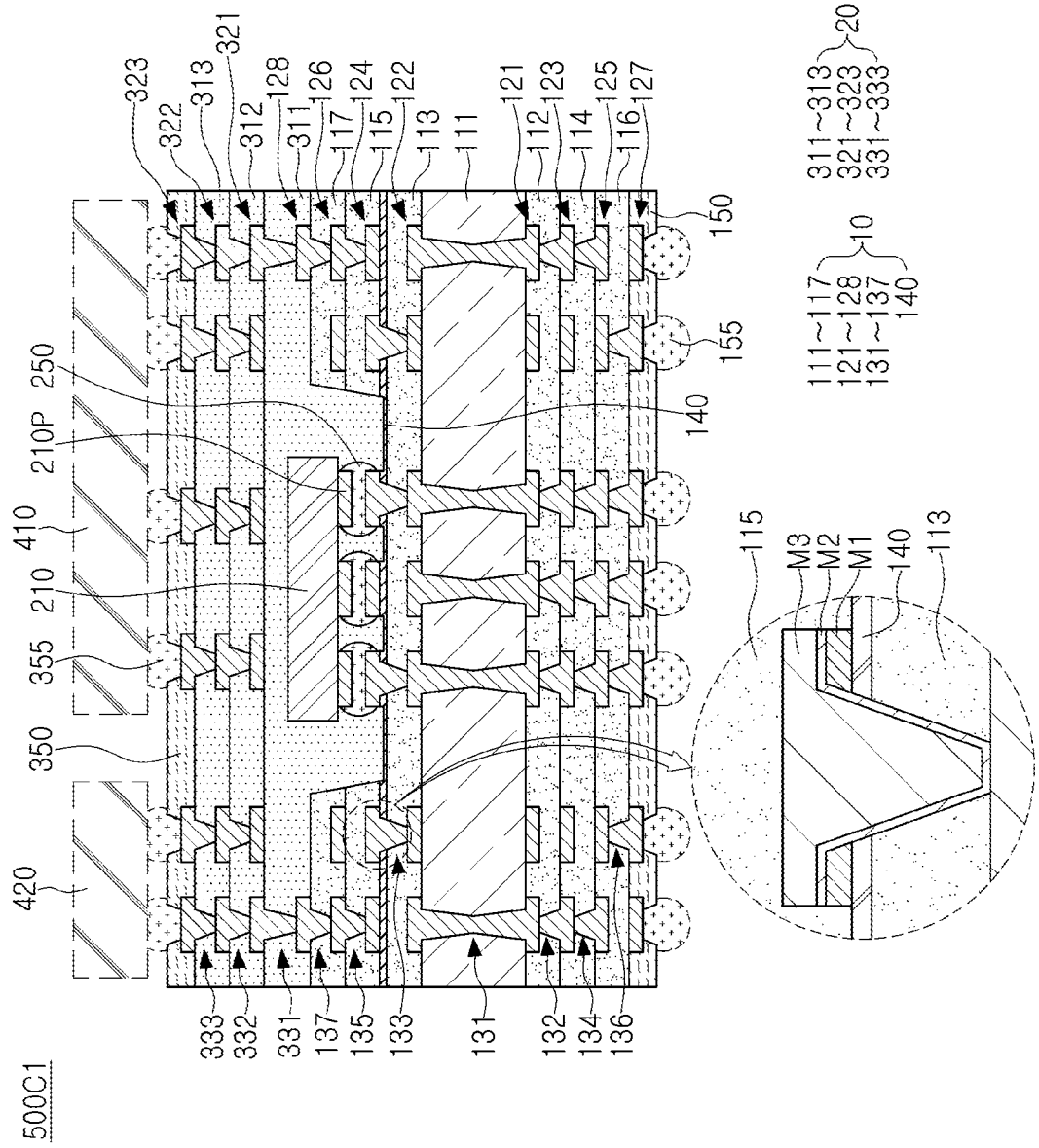
FIG. 23 is a schematic cross-sectional view illustrating an example of an electronic component-embedded substrate including the printed circuit board of FIG. 22.

FIG. 23 is a schematic cross-sectional view illustrating an example of an electronic component-embedded substrate including the printed circuit board of FIG. 22.

Figure 24:
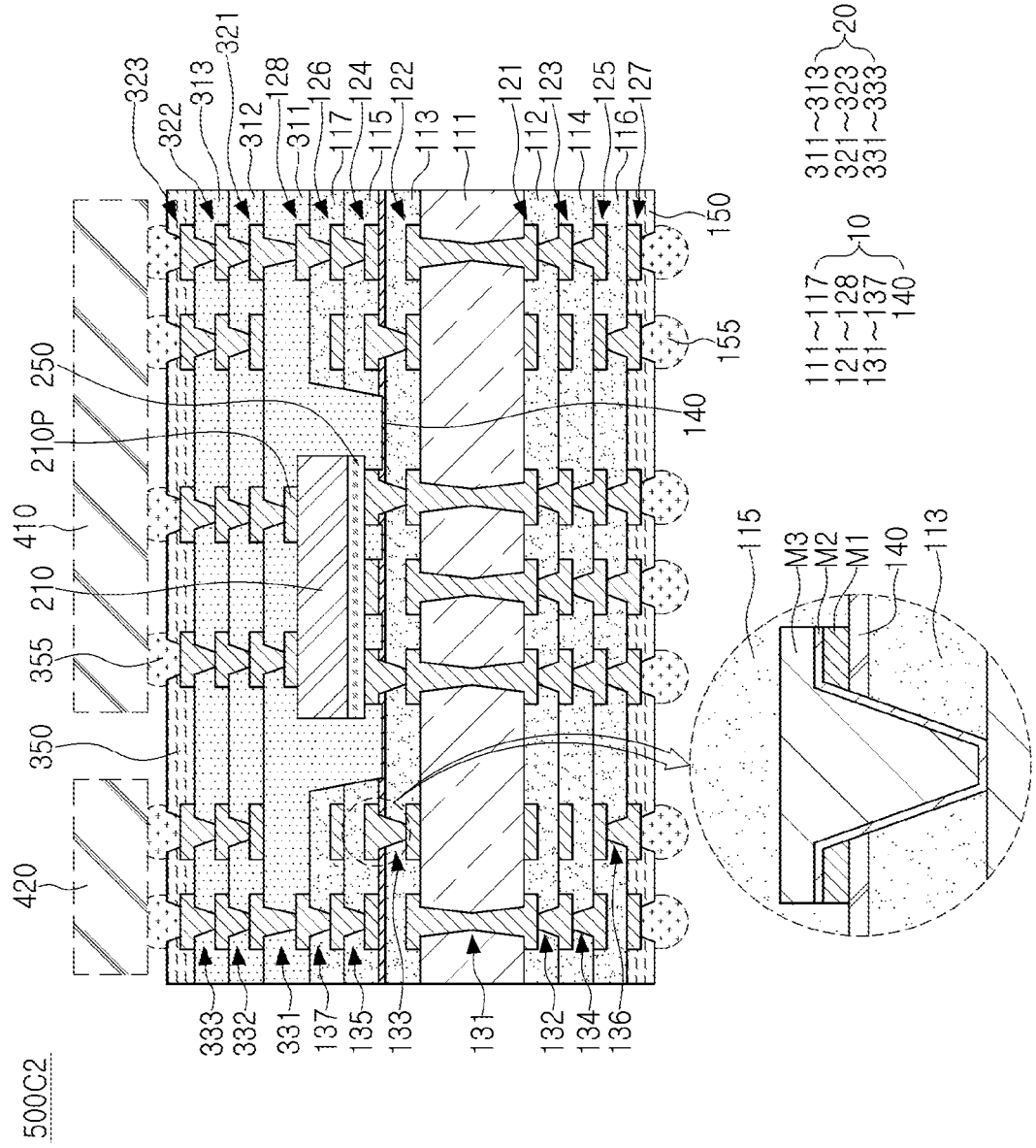
FIG. 24 is a schematic cross-sectional view of another example of an electronic component-embedded substrate including the printed circuit board of FIG. 22.

FIG. 24 is a schematic cross-sectional view of another example of an electronic component-embedded substrate including the printed circuit board of FIG. 22.

Referring to the drawings, in the case of a printed circuit board 100C according to another example and electronic component-embedded substrates 500C1 and 500C2 including the same, a primer layer 140 is disposed between the third insulating layer 113 and the fifth insulating layer 115, and the cavity C penetrates through the fifth insulating layer 115, the seventh insulating layer 117 and at least a portion of the primer layer 140 in the printed circuit board 100A according to the above-described example and the electronic component-embedded substrates 500A1 and 500A2. The cavity C exposes at least a portion of the upper surface of the primer layer 140. The cavity C further penetrates through a portion of the primer layer 140 such that the upper surface of the primer layer 140 has a step difference, and exposes at least a portion of the upper surface of primer layer 140. In the sandblasting process, a portion of the primer layer 140 may be etched, and as a result, the thickness of an area of the primer layer 140 exposed by the cavity C is less than the thickness of the area not exposed to the cavity C. If necessary, the printed circuit board 100C according to an another example may be manufactured such that the primer layer 140 constitutes the bottom surface of the cavity C. The fourth wiring layer 124 includes a first wiring pattern 124a disposed on the upper surface of the primer layer 140 and at least partially embedded in the fifth insulating layer 115, and a second wiring pattern 124b disposed on the upper surface of the primer layer 140 and at least partially exposed by the cavity C. The third wiring via layer 133 penetrates through the primer layer 140.

As in another example, the second wiring pattern 124b of the fourth wiring layer 124 exposed by the cavity C may be a protruding pattern rather than an embedded pattern. In addition, the upper surface of the third insulating layer 113 may not be exposed through the cavity C, by the primer layer 140. Other details are the same as described above, and detailed descriptions will be omitted.

Figure 25:
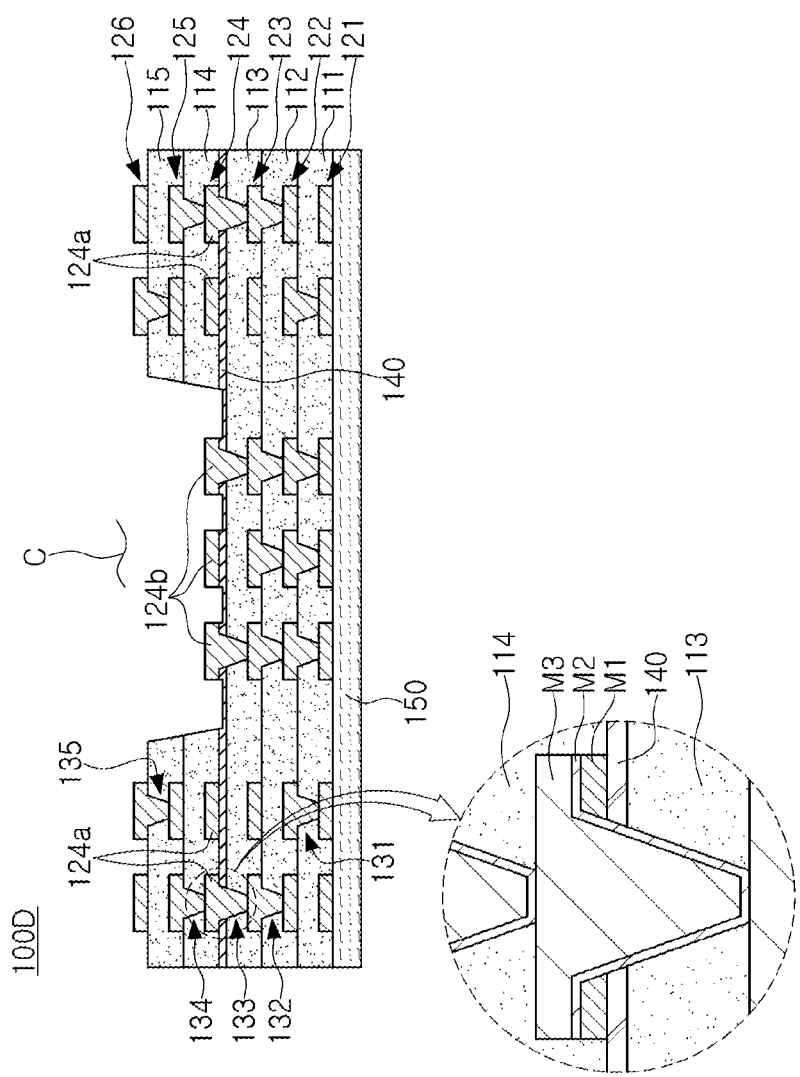
FIG. 25 is a schematic cross-sectional view of another example of a printed circuit board.

FIG. 25 is a schematic cross-sectional view of another example of a printed circuit board.

Figure 26:
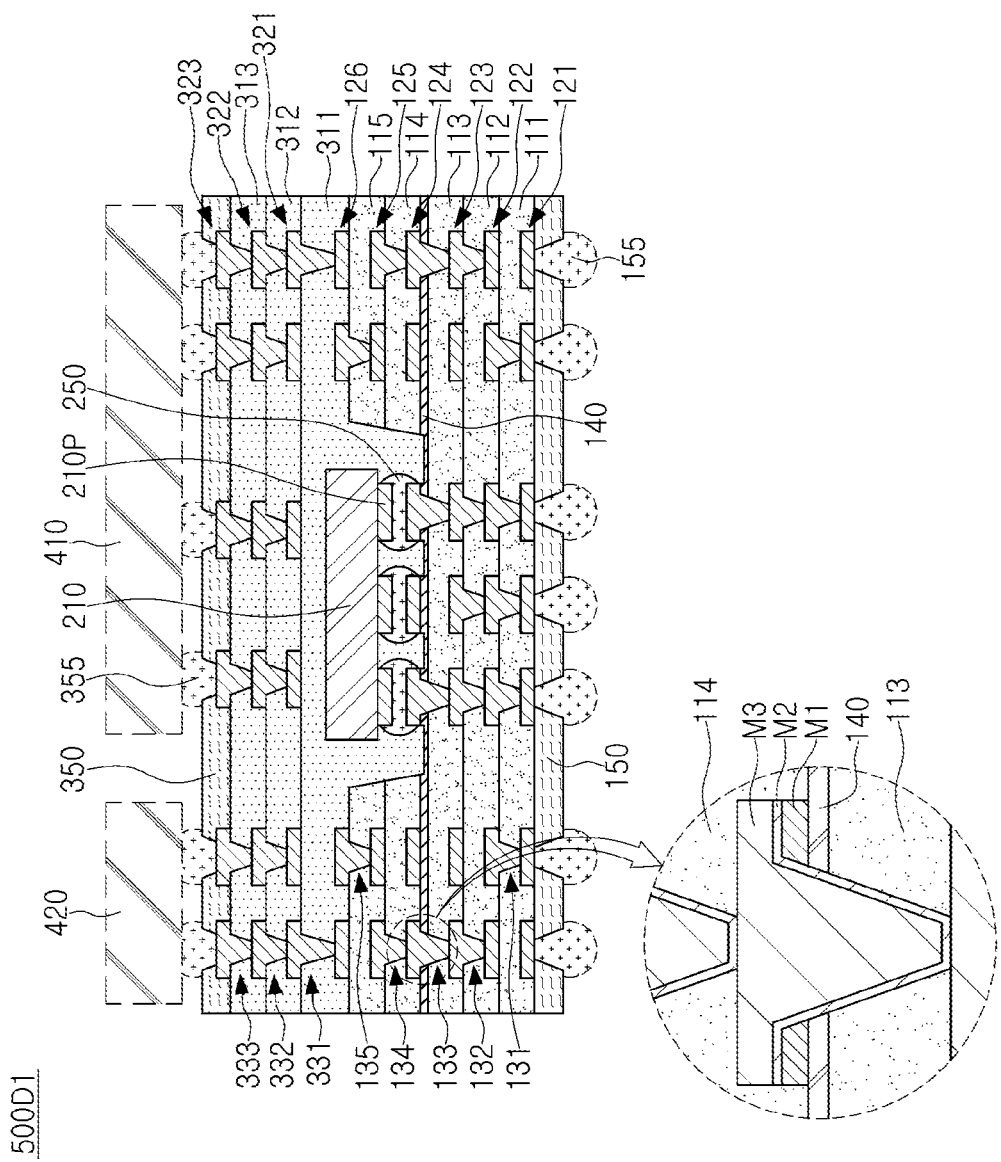
FIG. 26 is a schematic cross-sectional view illustrating an example of an electronic component-embedded substrate including the printed circuit board of FIG. 25.

FIG. 26 is a schematic cross-sectional view illustrating an example of an electronic component-embedded substrate including the printed circuit board of FIG. 25.

Figure 27:
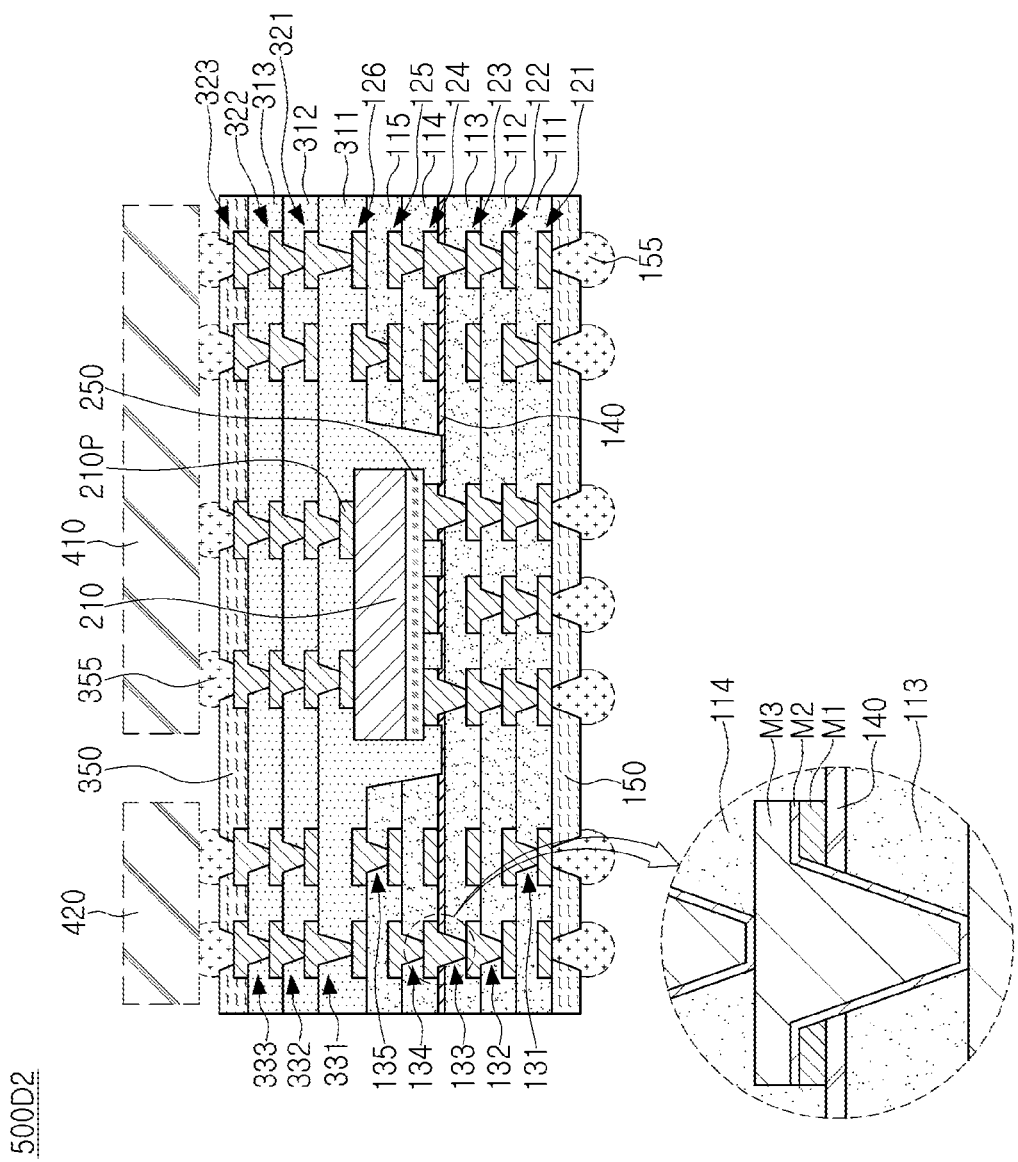
FIG. 27 is a schematic cross-sectional view of another example of an electronic component-embedded substrate including the printed circuit board of FIG. 25.

FIG. 27 is a schematic cross-sectional view of another example of an electronic component-embedded substrate including the printed circuit board of FIG. 25.

Referring to the drawings, in the case of a printed circuit board 100D according to another example and electronic component-embedded substrates 500D1 and 500D2 including the same, the printed circuit board 100D is inverted up and down, and the cavity C penetrates through the fourth and fifth insulating layers 114 and 115 and at least a portion of the upper primer layer 140, not through the first to third insulating layers 111, 112 and 113 in the printed circuit board 100B according to the above-described example and the electronic component-embedded substrates 500B1 and 500B2 including the same. The cavity C exposes at least a portion of the upper surface of the primer layer 140. The cavity C further penetrates through a portion of the primer layer 140 such that the upper surface of the primer layer 140 has a step difference, and exposes at least a portion of the upper surface of primer layer 140. In the sandblasting process, a portion of the primer layer 140 may be etched, and as a result, the thickness of an area of the primer layer 140 exposed by the cavity C is less than the thickness of the area not exposed to the cavity C. If necessary, the printed circuit board 100D according to an another example may be manufactured such that the primer layer 140 constitutes the bottom surface of the cavity C. The fourth wiring layer 124 includes a first wiring pattern 124a disposed on the upper surface of the primer layer 140 and at least partially embedded in the fourth insulating layer 114, and a second wiring pattern 124b disposed on the upper surface of the primer layer 140 and at least partially exposed by the cavity C. The third wiring via layer 133 penetrates through the primer layer 140.

As in another example, the second wiring pattern 124b of the fourth wiring layer 124 exposed by the cavity C may be a protruding pattern rather than an embedded pattern. In addition, the upper surface of the third insulating layer 113 may not be exposed through the cavity C, by the primer layer 140. Other details are the same as described above, and detailed descriptions are omitted.

Figure 28:
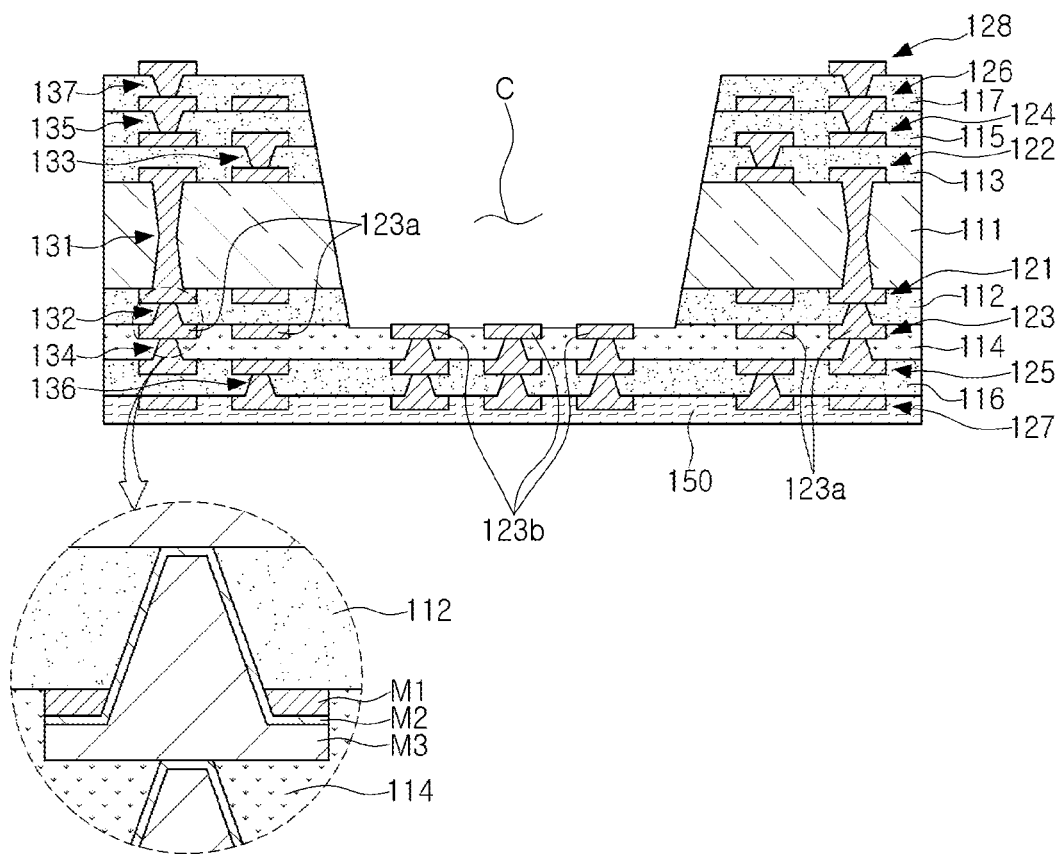
FIG. 28 is a schematic cross-sectional view of another example of a printed circuit board.

FIG. 28 is a schematic cross-sectional view of another example of a printed circuit board.

Figure 29:
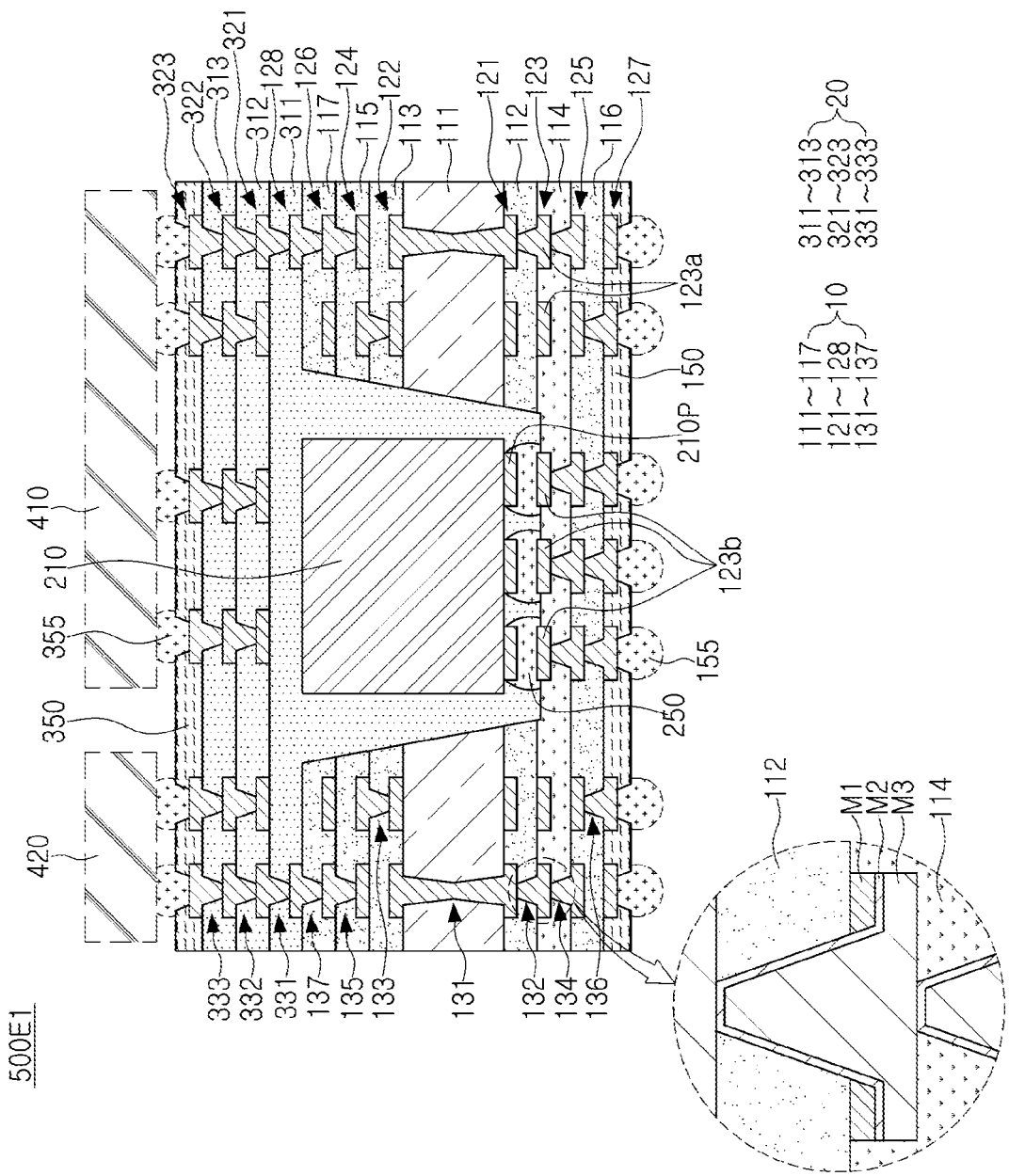
FIG. 29 is a schematic cross-sectional view illustrating an example of an electronic component-embedded substrate including the printed circuit board of FIG. 28.

FIG. 29 is a schematic cross-sectional view illustrating an example of an electronic component-embedded substrate including the printed circuit board of FIG. 28.

Figure 30:
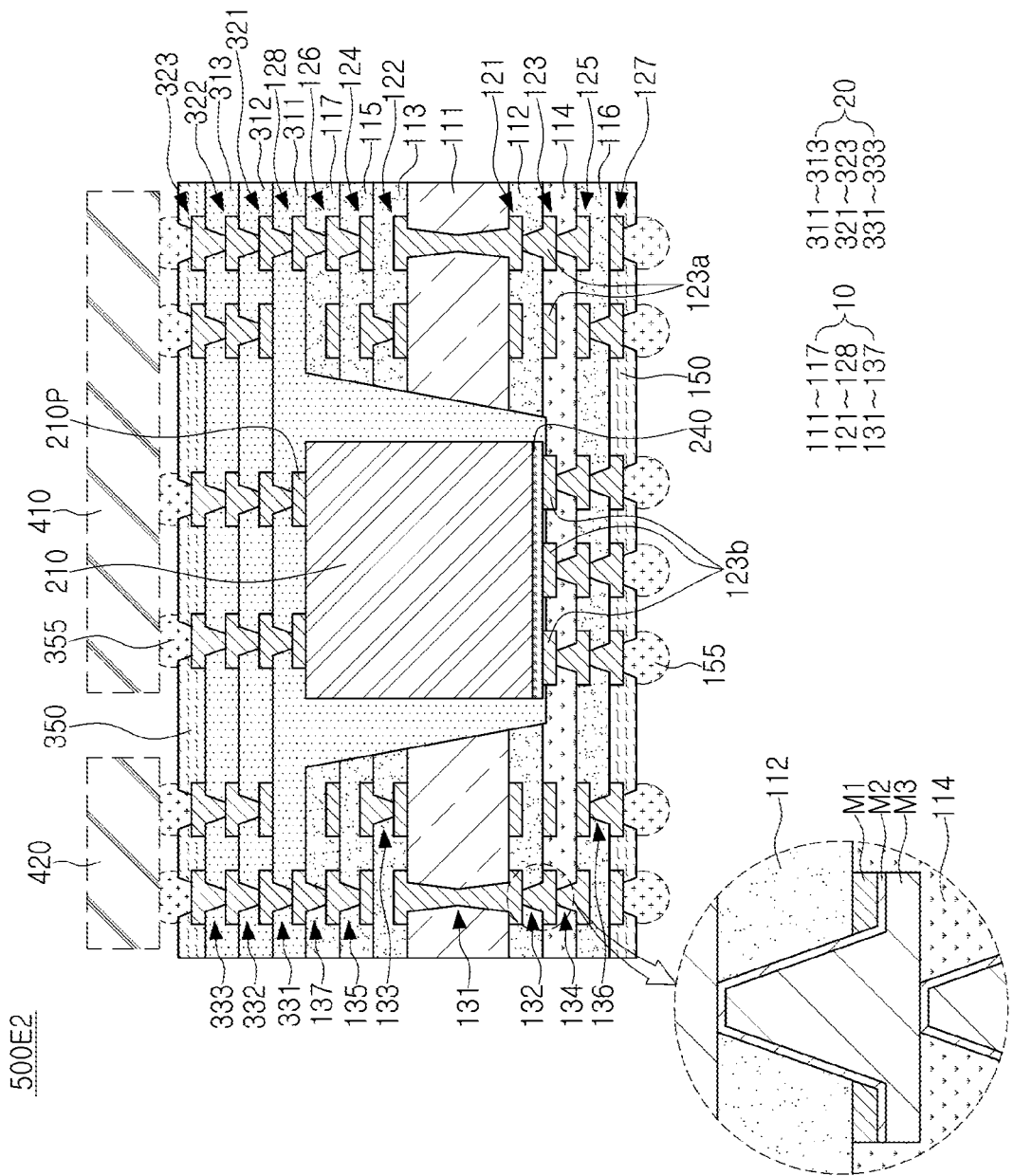
FIG. 30 is a schematic cross-sectional view of another example of the electronic component-embedded substrate including the printed circuit board of FIG. 28.

FIG. 30 is a schematic cross-sectional view of another example of the electronic component-embedded substrate including the printed circuit board of FIG. 28.

Referring to the drawings, in the case of a printed circuit board 100E according to another example and electronic component-embedded substrates 500E1 and 500E2 including the same, the primer layer 140 is omitted in the printed circuit board 100A according to the above-described example and the electronic component-embedded substrates 500A1 and 500A2 including the same, and instead, the fourth insulating layer 114 serves as a barrier layer. From this point of view, the fourth insulating layer 114 may have a lower modulus than each of the insulating layers 111, 112, 113, 115 and 117 in which the cavity C is formed, and may have a relatively higher elongation. For example, the fourth insulating layer 114 may include a material including an insulating resin and an inorganic filler such as silica without a reinforcing material such as glass fiber, for example, include ABF, and the remaining insulating layers 111, 112, 113, 115, 116 and 117 may include a material including an insulating resin, an inorganic filler such as silica and a reinforcing material such as glass fiber, for example, include prepreg or copper clad laminate insulating material. The cavity C further penetrates through a portion of the fourth insulating layer 114 such that the upper surface of the fourth insulating layer 114 has a step difference, and exposes at least a portion of the upper surface of the fourth insulating layer 114. In the sandblasting process, a portion of the fourth insulating layer 114 may be etched, and as a result, the thickness of an area of the fourth insulating layer 114 exposed by the cavity C is less than the thickness of the area not exposed to the cavity C. If necessary, the printed circuit board 100E according to an another example may be manufactured such that the fourth insulating layer 114 constitutes the bottom surface of the cavity C. The third wiring layer 123 is at least partially embedded in the fourth insulating layer 114, and includes a first wiring pattern 123a embedded in the fourth insulating layer 114 such that at least a portion of the upper surface thereof is covered by the second insulating layer 112, and a second wiring pattern 123b embedded in the fourth insulating layer 114 such that at least a portion of the upper surface is exposed by the cavity C.

As in another example, the material of the fourth insulating layer 114 may be different without the primer layer 140, to be used as the aforementioned barrier layer through a difference in modulus. Other details are the same as described above, and detailed descriptions are omitted.

Figure 31:
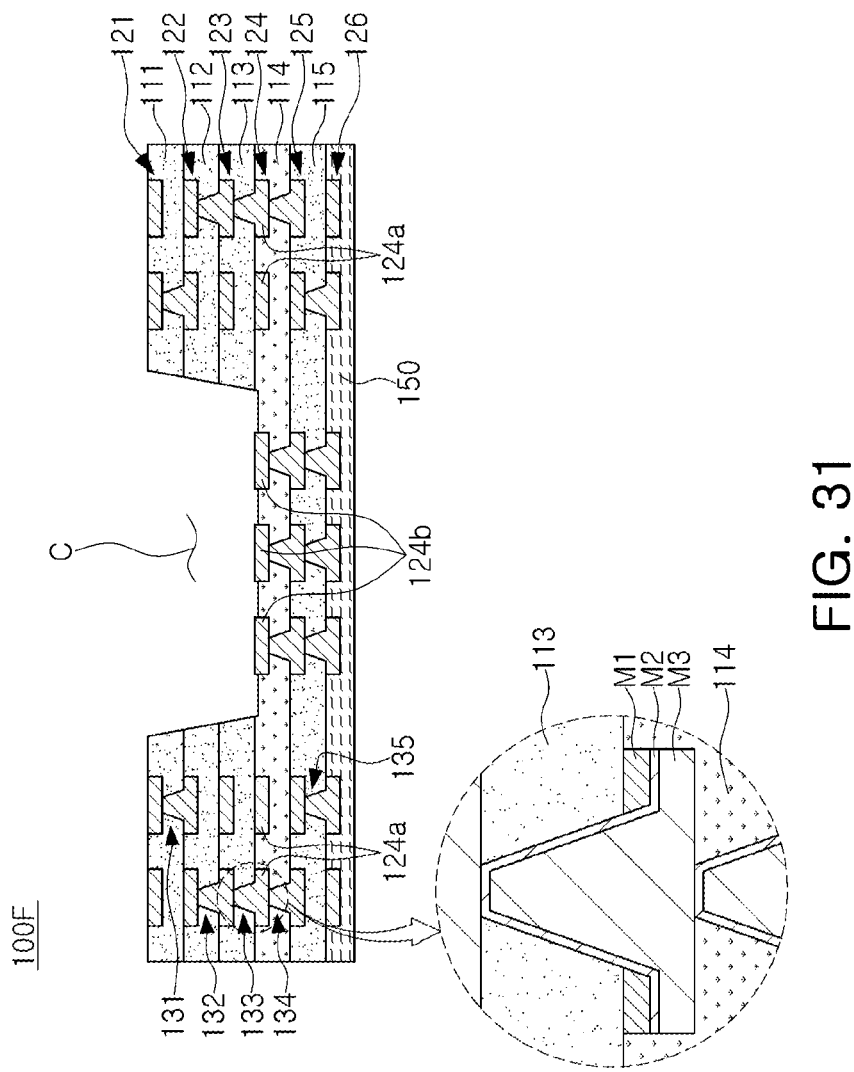
FIG. 31 is a schematic cross-sectional view of another example of a printed circuit board.

FIG. 31 is a schematic cross-sectional view of another example of a printed circuit board.

Figure 32:
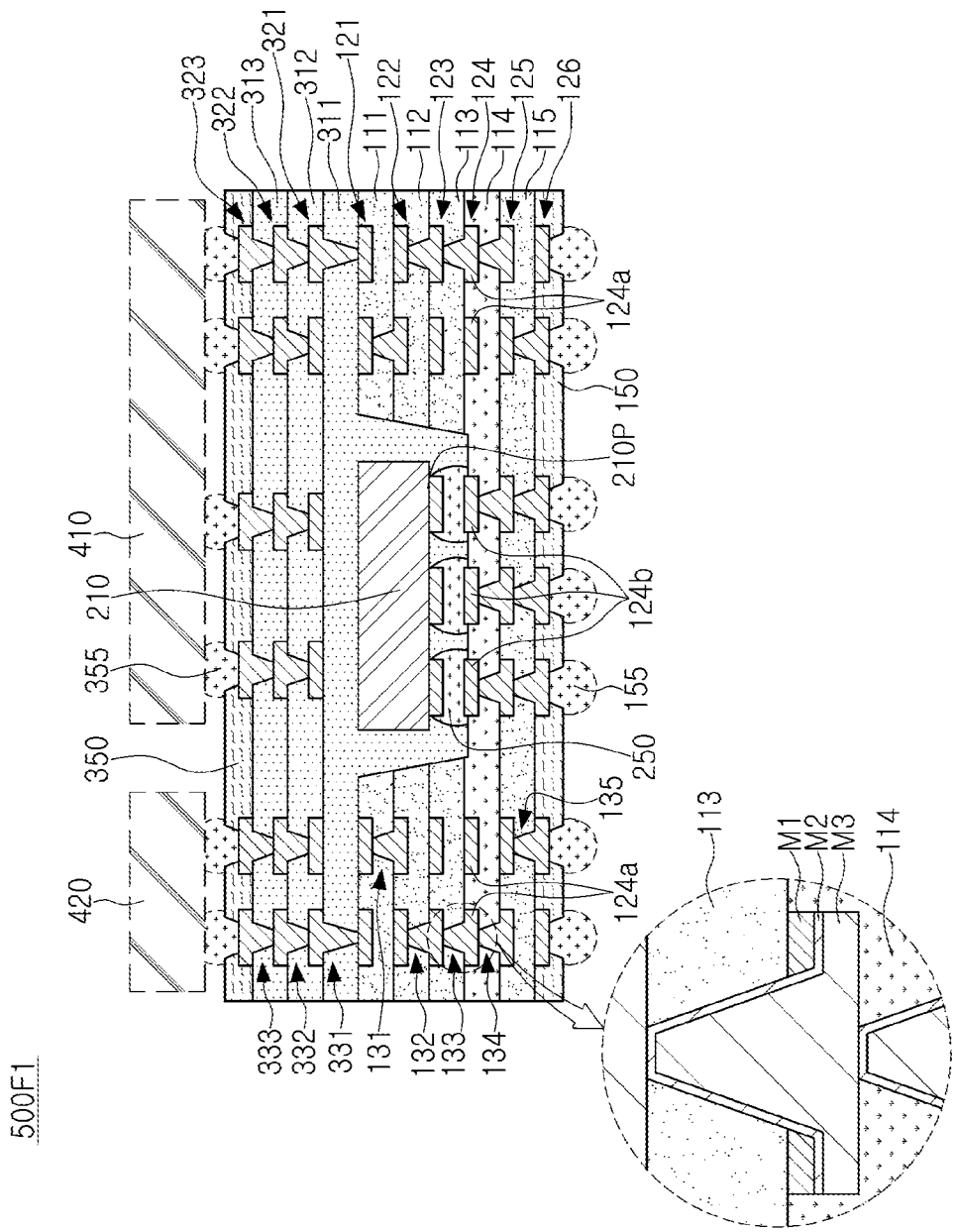
FIG. 32 is a schematic cross-sectional view of an example of an electronic component-embedded substrate including the printed circuit board of FIG. 31.

FIG. 32 is a schematic cross-sectional view of an example of an electronic component-embedded substrate including the printed circuit board of FIG. 31.

Figure 33:
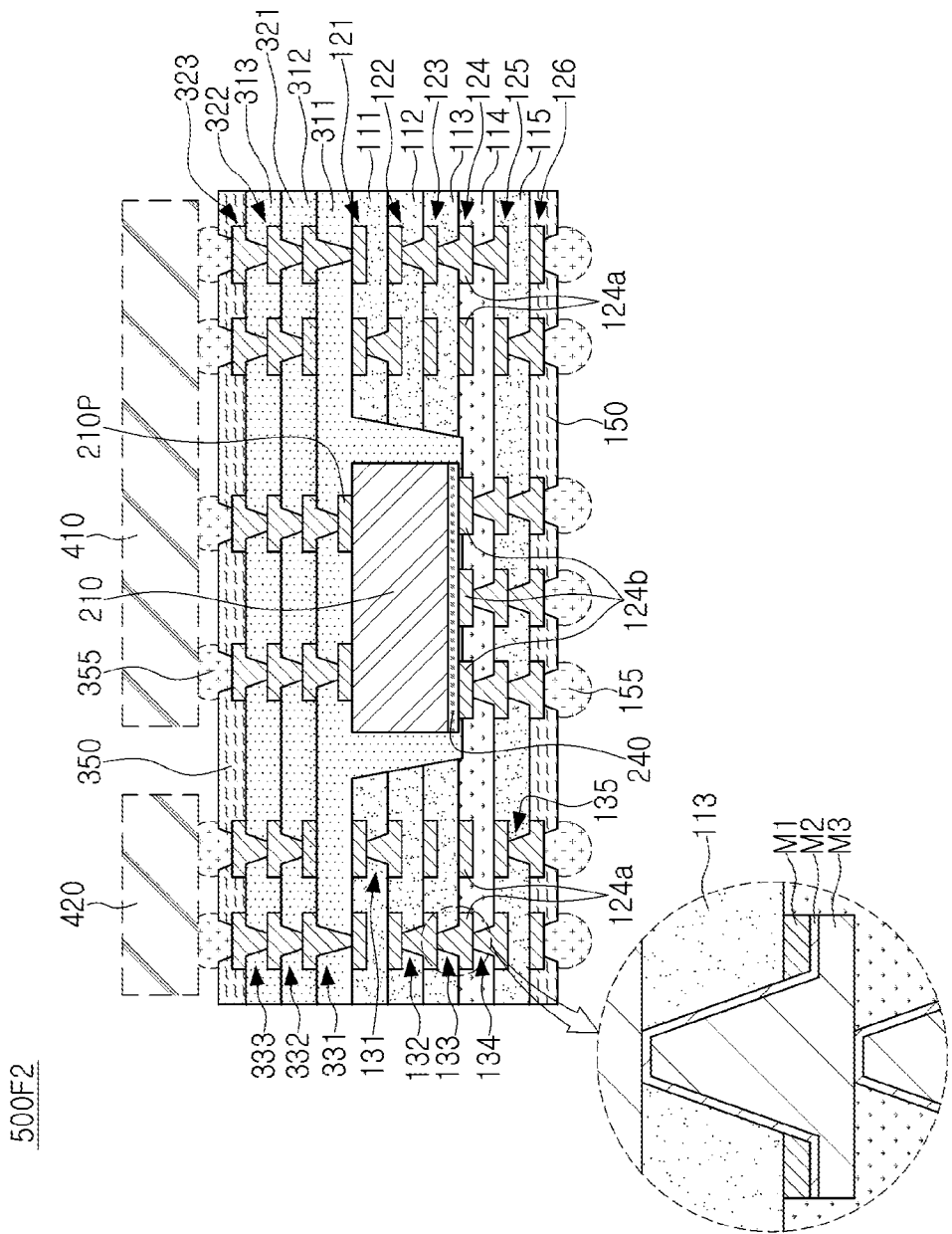
FIG. 33 is a schematic cross-sectional view of another example of an electronic component-embedded substrate including the printed circuit board of FIG. 31.

FIG. 33 is a schematic cross-sectional view of another example of an electronic component-embedded substrate including the printed circuit board of FIG. 31.

Referring to the drawings, in the case of a printed circuit board 100F according to another example and electronic component-embedded substrates 500F1 and 500F2 including the same, the primer layer 140 is omitted in the printed circuit board 100B according to the above-described example and the electronic component-embedded substrates 500B1 and 500B2 including the same, and instead, the fourth insulating layer 114 serves as a barrier layer. From this point of view, the fourth insulating layer 114 may have a lower modulus than each of the insulating layers 111, 112 and 113 in which the cavity C is formed, and may have a relatively higher elongation. For example, the fourth insulating layer 114 may include a material including an insulating resin and an inorganic filler such as silica without a reinforcing material such as glass fiber, for example, include ABF, and the remaining insulating layers 111, 112, 113 and 115 may include a material including an insulating resin, an inorganic filler such as silica and a reinforcing material such as glass fiber, for example, include prepreg. The cavity C further penetrates through a portion of the fourth insulating layer 114 such that the upper surface of the fourth insulating layer 114 has a step difference, and exposes at least a portion of the upper surface of the fourth insulating layer 114. In the sandblasting process, a portion of the fourth insulating layer 114 may be etched, and as a result, the thickness of an area of the fourth insulating layer 114 exposed by the cavity C is less than the thickness of the area not exposed to the cavity C. If necessary, the printed circuit board 100F according to an another example may be manufactured such that the fourth insulating layer 114 constitutes the bottom surface of the cavity C. The fourth wiring layer 124 is at least partially embedded in the fourth insulating layer 114, and includes a first wiring pattern 124a embedded in the fourth insulating layer 114 such that at least a portion of the upper surface thereof is covered by the third insulating layer 113, and a second wiring pattern 124b embedded in the fourth insulating layer 114 such that at least a portion of the upper surface is exposed by the cavity C.

As in another example, the material of the fourth insulating layer 114 may be different without the primer layer 140, to be used as the aforementioned barrier layer through a difference in modulus. Other details are the same as described above, and detailed descriptions are omitted.

Figure 34:
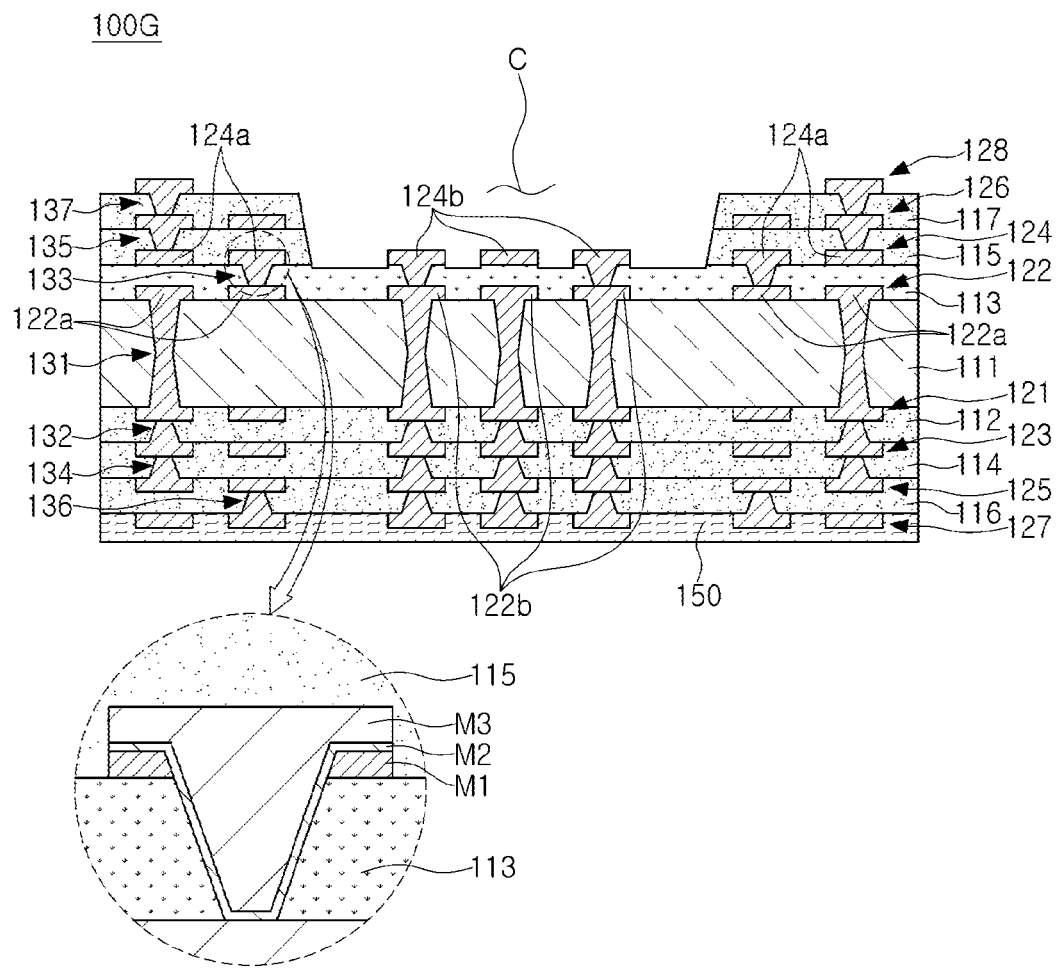
FIG. 34 is a schematic cross-sectional view of another example of a printed circuit board.

FIG. 34 is a schematic cross-sectional view of another example of a printed circuit board.

Figure 35:
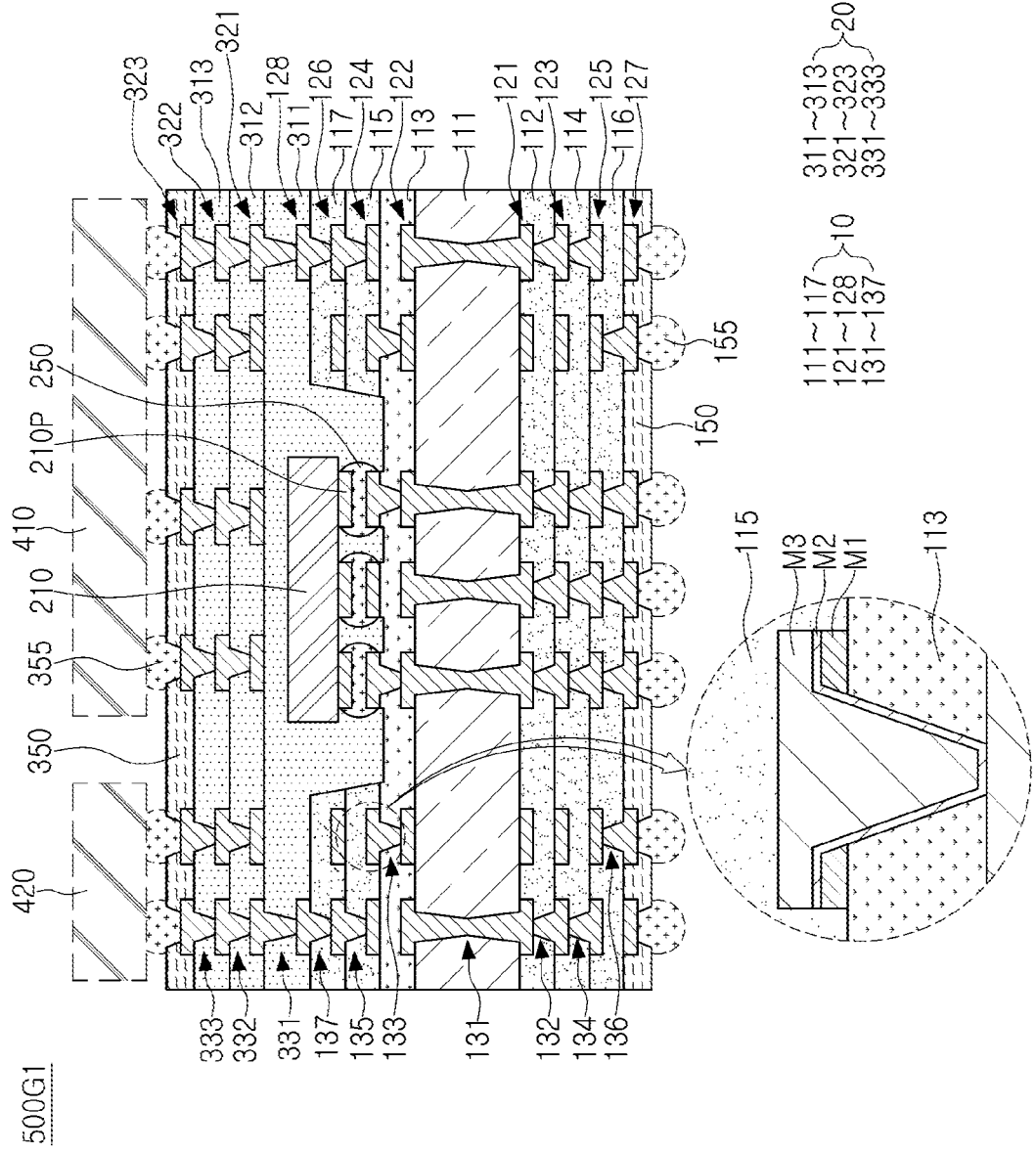
FIG. 35 is a schematic cross-sectional view illustrating an example of an electronic component-embedded substrate including the printed circuit board of FIG. 34.

FIG. 35 is a schematic cross-sectional view illustrating an example of an electronic component-embedded substrate including the printed circuit board of FIG. 34.

Figure 36:
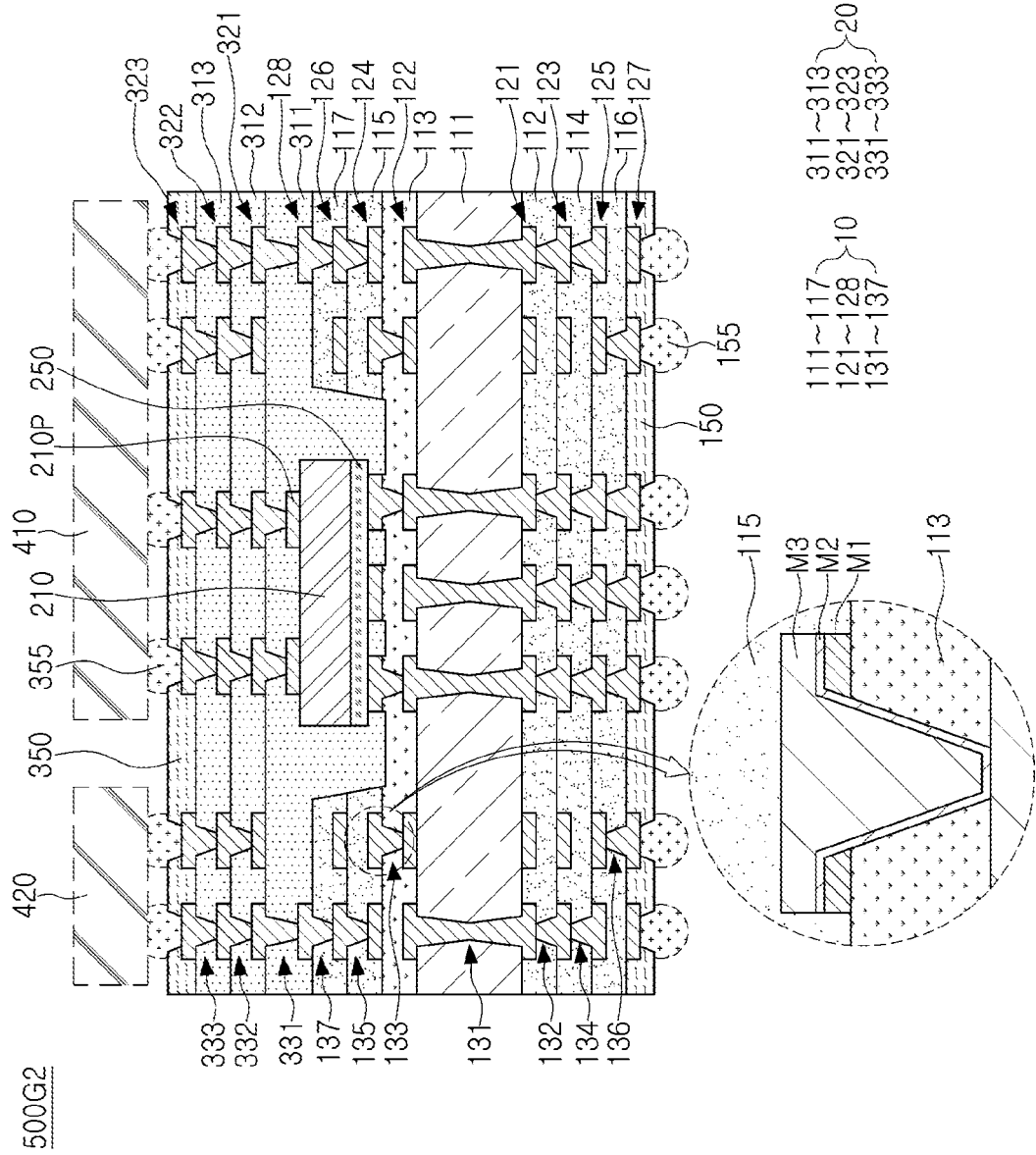
FIG. 36 is a schematic cross-sectional view of another example of an electronic component-embedded substrate including the printed circuit board of FIG. 34.

FIG. 36 is a schematic cross-sectional view of another example of an electronic component-embedded substrate including the printed circuit board of FIG. 34.

Referring to the drawings, in the case of a printed circuit board 100G according to another example and electronic component-embedded substrates 500G1 and 500G2 including the same, the primer layer 140 is omitted in the printed circuit board 100C according to another example described above and the electronic component-embedded substrates 500C1 and 500C2 including the same, and instead, the third insulating layer 113 serves as a barrier layer. From this point of view, the third insulating layer 113 may have a lower modulus than each of the insulating layers 115 and 117 in which the cavity C is formed, and may have a relatively high elongation. For example, the third insulating layer 113 may include a material including an insulating resin and an inorganic filler such as silica without a reinforcing material such as glass fiber, for example, include ABF, and the remaining insulating layers 111, 112, 114, 115, 116 and 117 may include a material including an insulating resin, an inorganic filler such as silica and a reinforcing material such as glass fiber, for example, include prepreg or copper clad laminate insulating material. The cavity C further penetrates through a portion of the third insulating layer 113 such that the upper surface of the third insulating layer 113 has a step difference, and exposes at least a portion of the upper surface of the third insulating layer 113. In the sandblasting process, a portion of the third insulating layer 113 may be etched, and as a result, the thickness of an area of the third insulating layer 113 exposed by the cavity C is less than the thickness of the area not exposed to the cavity C. If necessary, the printed circuit board 100G according to an example may be manufactured such that the third insulating layer 113 constitutes the bottom surface of the cavity C. The second wiring layer 122 includes first and second wiring patterns 122a and 122b respectively disposed on an upper surface of the first insulating layer 111 and at least partially embedded in the third insulating layer 113. The fourth wiring layer 124 includes a third wiring pattern 124a disposed on the upper surface of the third insulating layer 113 and at least partially embedded in the fifth insulating layer 115, and a fourth wiring pattern 124b disposed on the upper surface of the third insulating layer 113 and at least partially exposed by the cavity C.

As in another example, the material of the third insulating layer 113 may be different without the primer layer 140, to be used as the aforementioned barrier layer through a difference in modulus. In addition, the fourth wiring pattern 124b of the fourth wiring layer 124 exposed by the cavity C may be a protruding pattern rather than an embedded pattern. Other details are the same as described above, and detailed descriptions are omitted.

Figure 37:
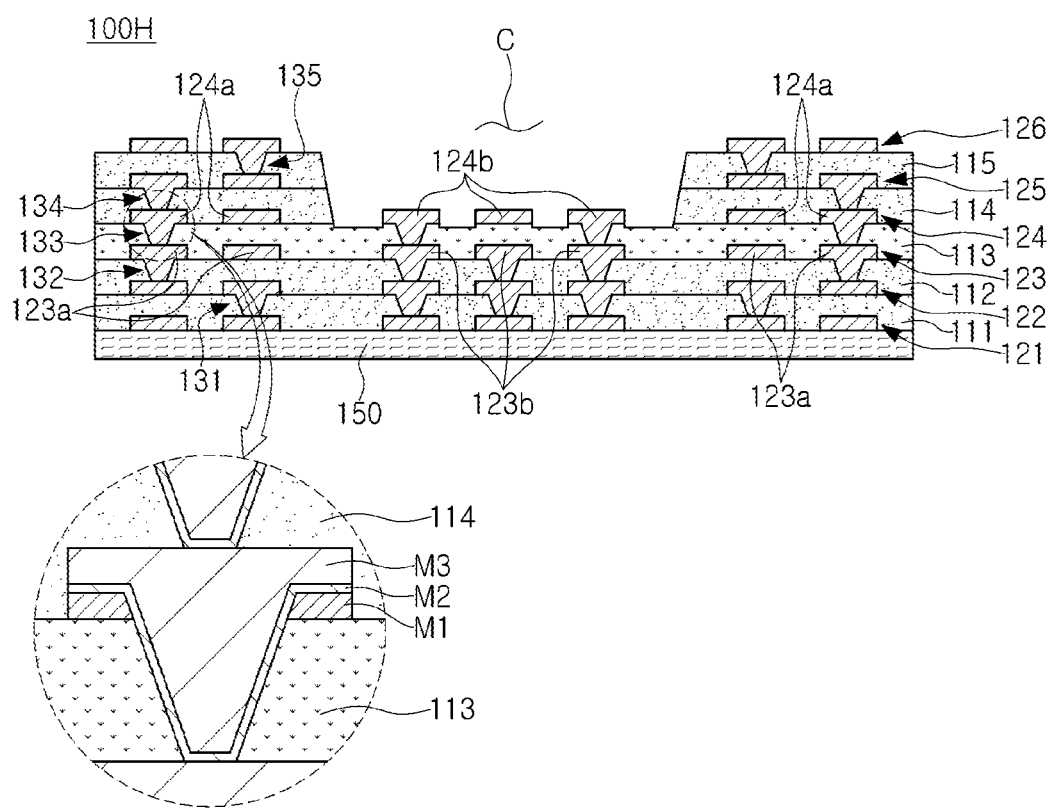
FIG. 37 is a schematic cross-sectional view of another example of a printed circuit board.

FIG. 37 is a schematic cross-sectional view of another example of a printed circuit board.

Figure 38:
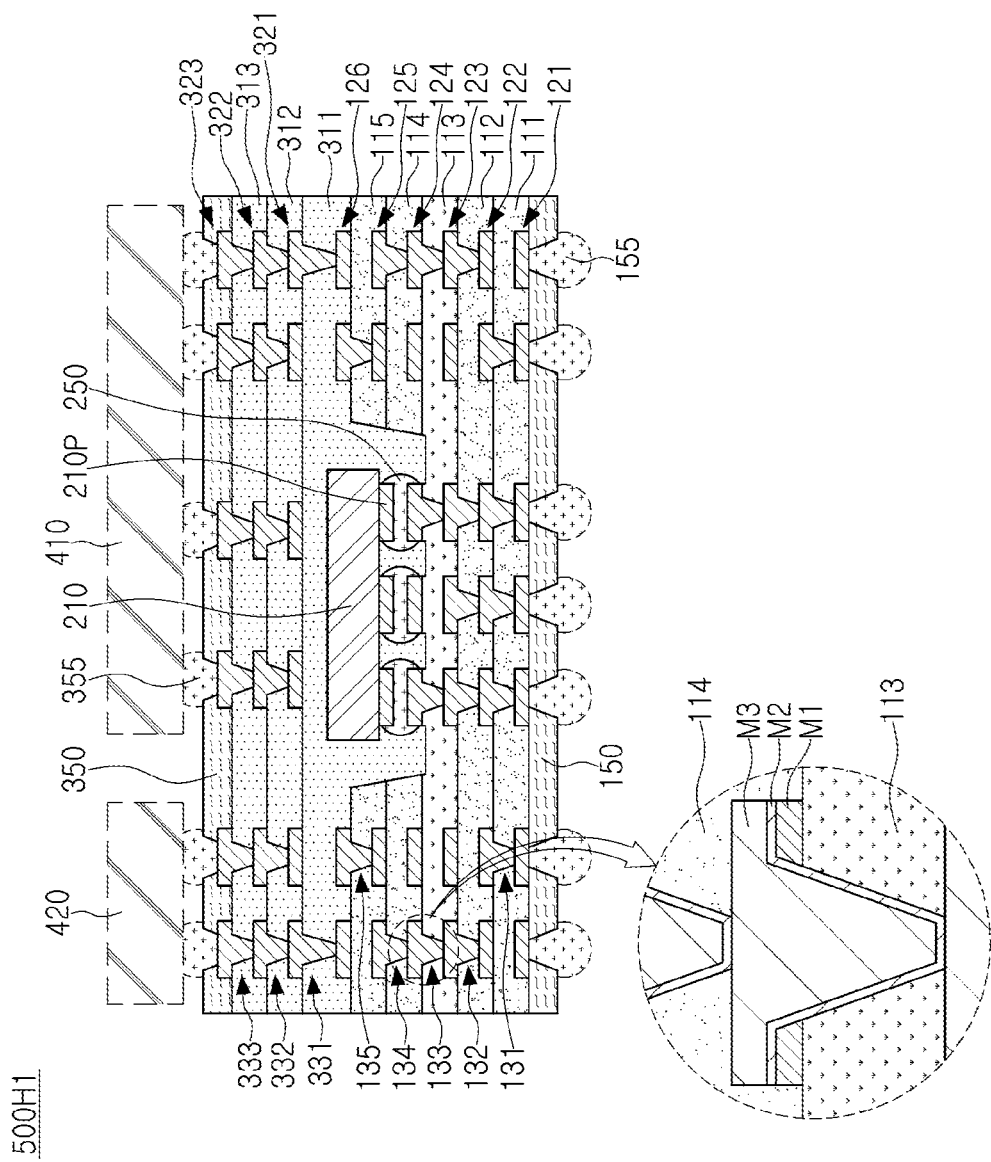
FIG. 38 is a schematic cross-sectional view illustrating an example of an electronic component-embedded substrate including the printed circuit board of FIG. 37.

FIG. 38 is a schematic cross-sectional view illustrating an example of an electronic component-embedded substrate including the printed circuit board of FIG. 37.

Figure 39:
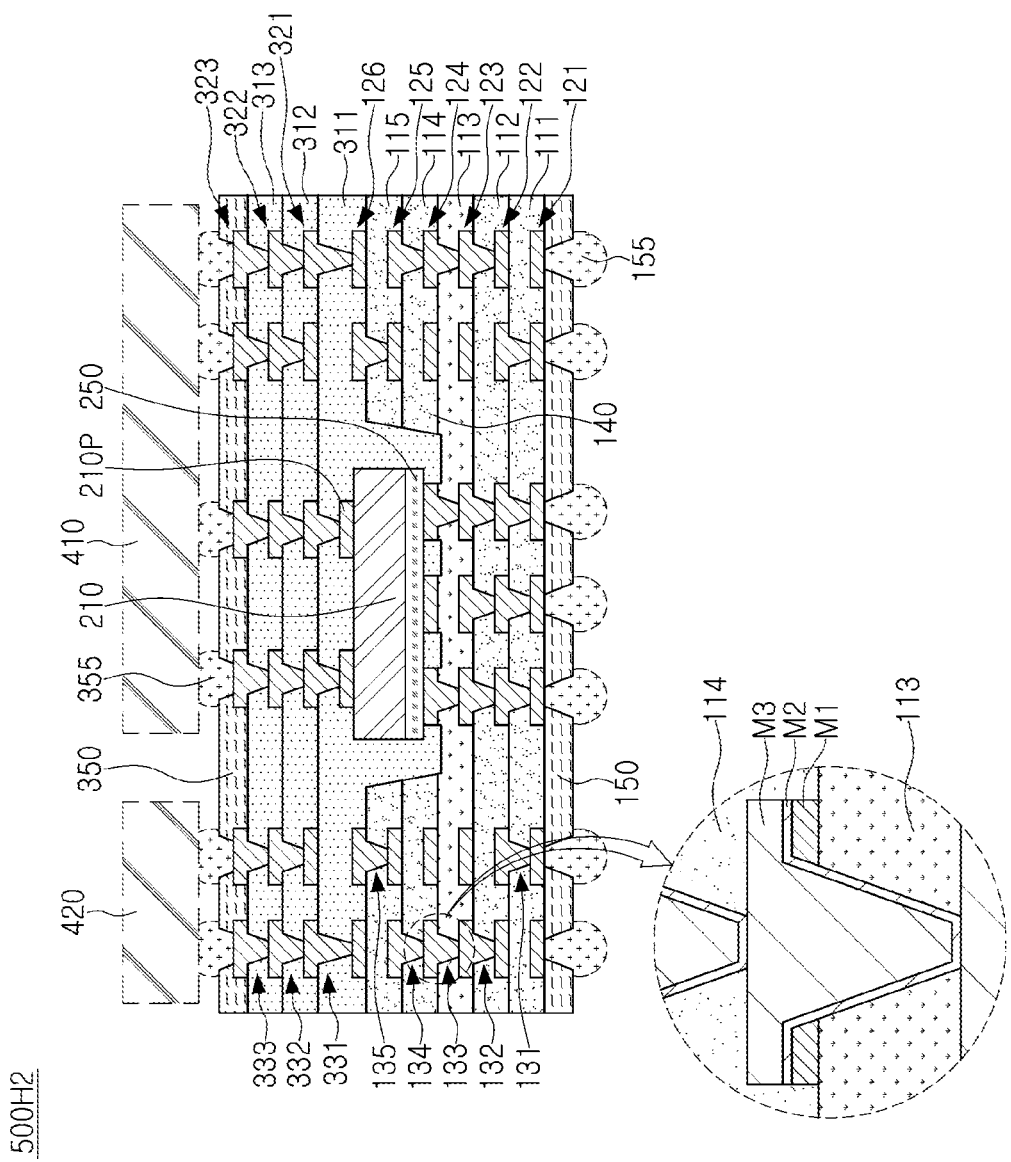
FIG. 39 is a schematic cross-sectional view of another example of an electronic component-embedded substrate including the printed circuit board of FIG. 37.

FIG. 39 is a schematic cross-sectional view of another example of an electronic component-embedded substrate including the printed circuit board of FIG. 37.

Referring to the drawings, in the case of a printed circuit board 100H according to another example and electronic component-embedded substrates 500H1 and 500H2 including the same, the primer layer 140 is omitted in the printed circuit board 100D according to another example described above and the electronic component-embedded substrates 500D1 and 500D2 including the same, and instead, the third insulating layer 113 serves as a barrier layer. From this point of view, the third insulating layer 113 may have a lower modulus than each of the insulating layers 114 and 115 in which the cavity C is formed, and may have a relatively high elongation. For example, the third insulating layer 113 may include a material including an insulating resin and an inorganic filler such as silica without a reinforcing material such as glass fiber, for example, include ABF, and the remaining insulating layers 111, 112, 114 and 115 may include a material including an insulating resin, an inorganic filler such as silica and a reinforcing material such as glass fiber, for example, include prepreg. The cavity C further penetrates through a portion of the third insulating layer 113 such that the upper surface of the third insulating layer 113 has a step difference, and exposes at least a portion of the upper surface of the third insulating layer 113. In the sandblasting process, a portion of the third insulating layer 113 may be etched, and as a result, the thickness of an area of the third insulating layer 113 exposed by the cavity C is less than the thickness of the area not exposed to the cavity C. If necessary, the printed circuit board 100H according to an example may be manufactured such that the third insulating layer 113 constitutes the bottom surface of the cavity C. The third wiring layer 123 includes first and second wiring patterns 123a and 123b respectively disposed on an upper surface of the second insulating layer 112 and at least partially embedded in the third insulating layer 113. The fourth wiring layer 124 includes a third wiring pattern 124a disposed on the upper surface of the third insulating layer 113 and at least partially embedded in the fourth insulating layer 114, and a fourth wiring pattern 124b disposed on the upper surface of the third insulating layer 113 and at least partially exposed by the cavity C.

As in another example, the material of the third insulating layer 113 may be different without the primer layer 140, to be used as the aforementioned barrier layer through a difference in modulus. In addition, the fourth wiring pattern 124b of the fourth wiring layer 124 exposed by the cavity C may be a protruding pattern rather than an embedded pattern. Other details are the same as described above, and detailed descriptions are omitted.

Figure 40:
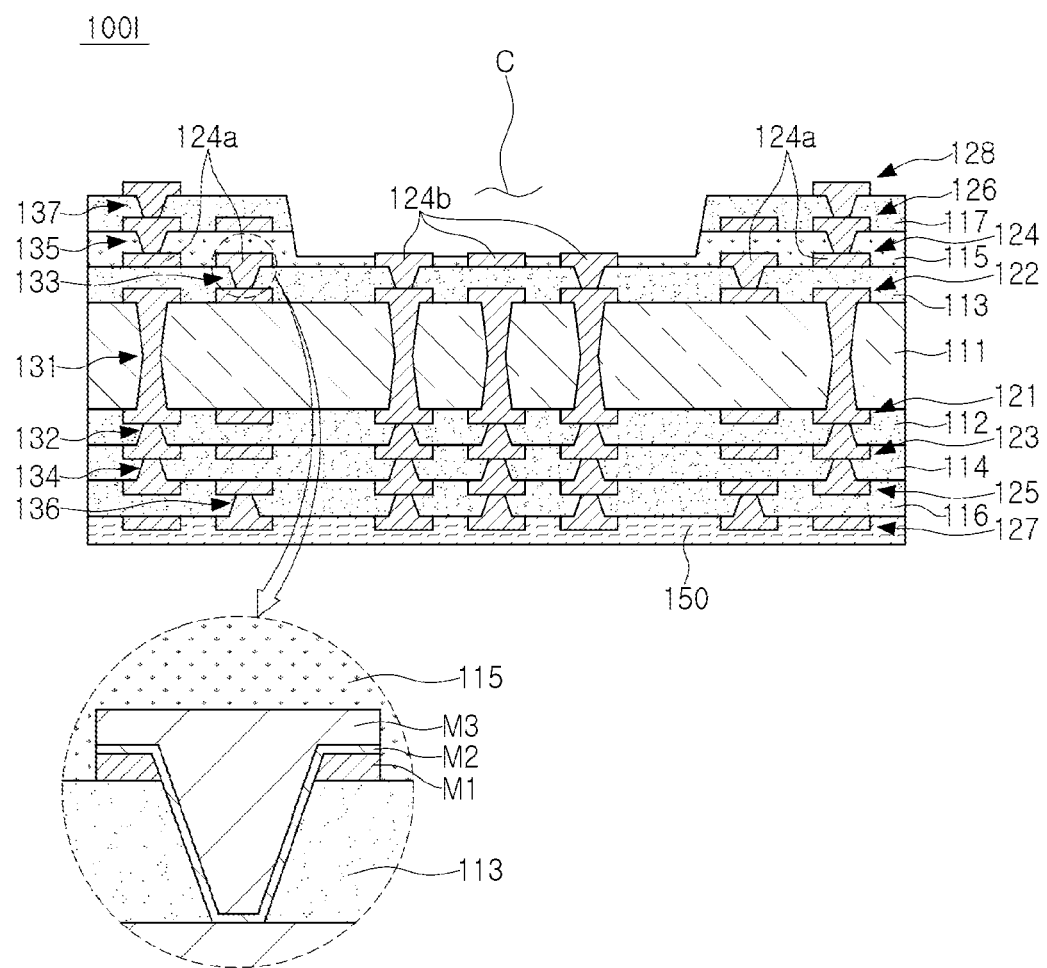
FIG. 40 is a schematic cross-sectional view of another example of a printed circuit board.

FIG. 40 is a schematic cross-sectional view of another example of a printed circuit board.

Figure 41:
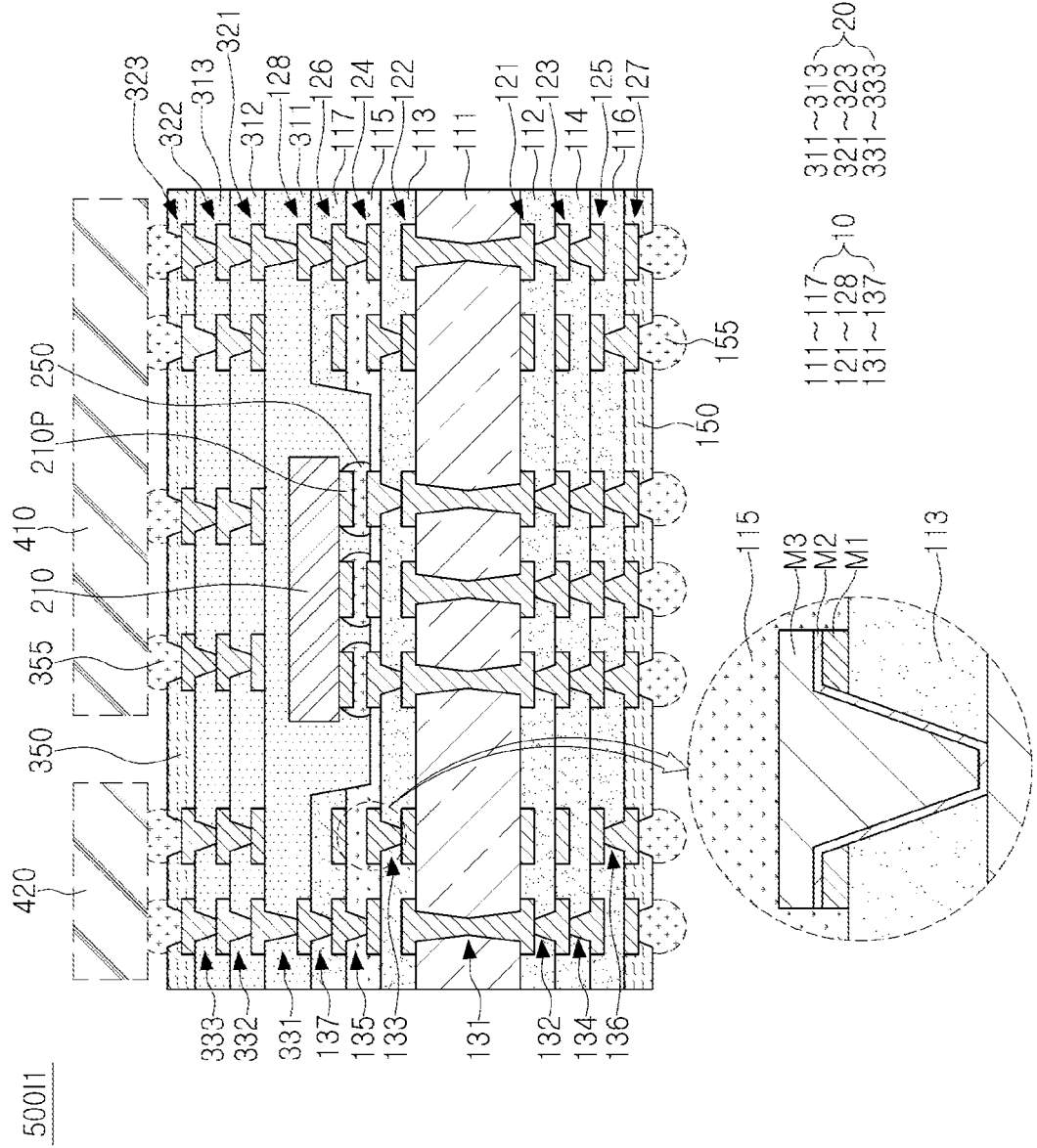
FIG. 41 is a schematic cross-sectional view illustrating an example of an electronic component-embedded substrate including the printed circuit board of FIG. 40.

FIG. 41 is a schematic cross-sectional view illustrating an example of an electronic component-embedded substrate including the printed circuit board of FIG. 40.

Figure 42:
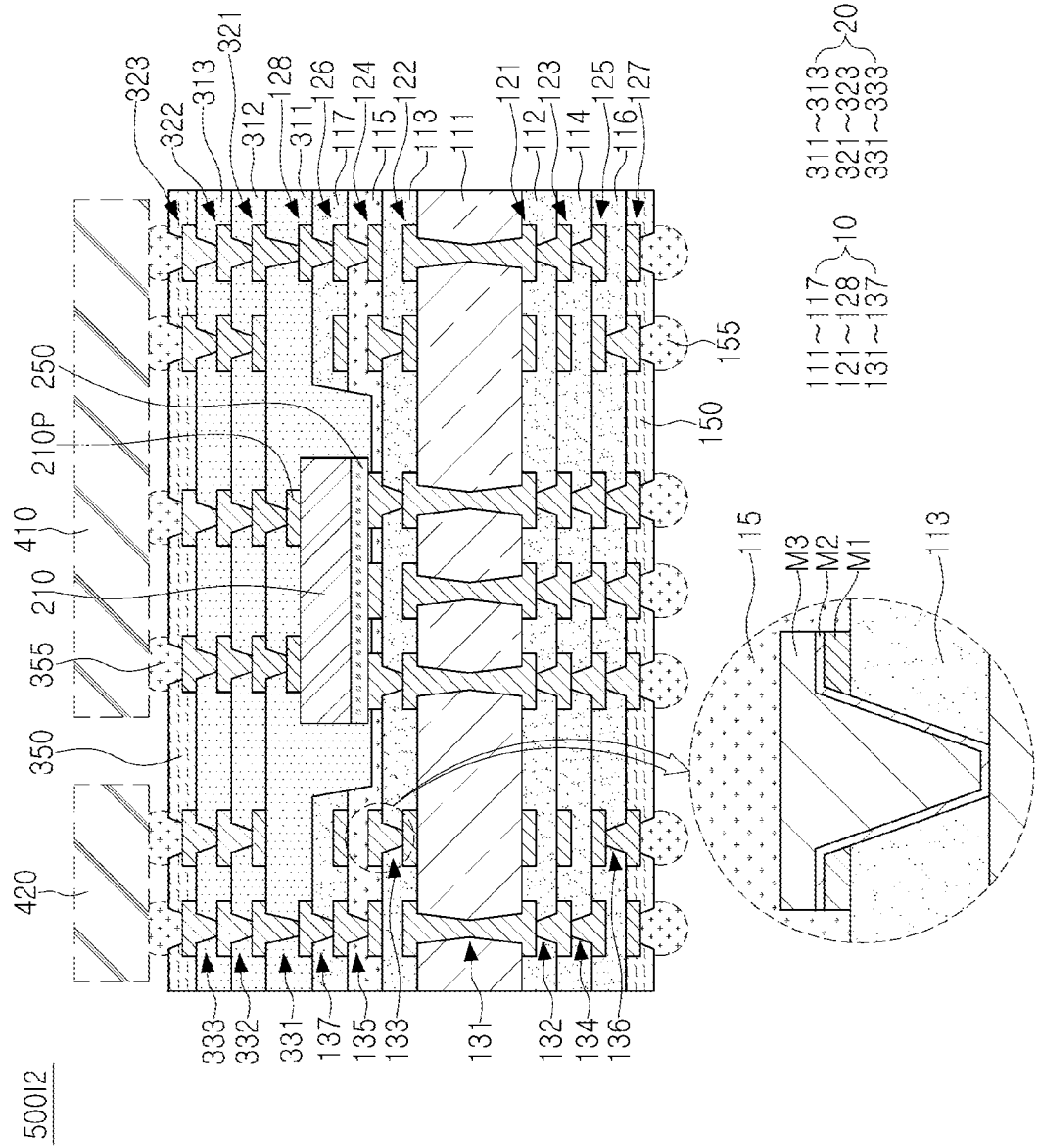
FIG. 42 is a schematic cross-sectional view of another example of an electronic component-embedded substrate including the printed circuit board of FIG. 40.

FIG. 42 is a schematic cross-sectional view of another example of an electronic component-embedded substrate including the printed circuit board of FIG. 40.

Referring to the drawings, in the case of a printed circuit board 100I according to another example and electronic component-embedded substrates 500I1 and 500I2 including the same, the fifth insulating layer 115, not the third insulating layer 113, serves as a barrier layer in the printed circuit board 100G according to another example described above and the electronic component-embedded substrates 500G1 and 500G2 including the same. From this point of view, the fifth insulating layer 115 may have a lower modulus than each of the seventh insulating layer 117 in which the cavity C is formed, and may have a relatively high elongation. For example, the fifth insulating layer 115 may include a material including an insulating resin and an inorganic filler such as silica without a reinforcing material such as glass fiber, for example, include ABF, and the remaining insulating layers 111, 112, 113, 114, 116 and 117 may include a material including an insulating resin, an inorganic filler such as silica and a reinforcing material such as glass fiber, for example, include prepreg or copper clad laminate insulating material. The cavity C further penetrates through a portion of the fifth insulating layer 115 such that the upper surface of the fifth insulating layer 115 has a step difference, and exposes at least a portion of the upper surface of the fifth insulating layer 115. The fourth wiring layer 124 includes first and second wiring patterns 124a and 124b respectively disposed on an upper surface of the third insulating layer 113 and at least partially embedded in the fifth insulating layer 115. At least a portion of the upper surface of the second wiring pattern 124b is exposed by the cavity C.

As in another example, the material of the fifth insulating layer 115 may be different without the primer layer 140, to be used as the aforementioned barrier layer through a difference in modulus. In addition, the cavity C may penetrate through a portion of the fifth insulating layer 115 as the barrier layer, such that the upper surface of the fifth insulating layer 115 as the barrier layer may have a step. In addition, the thickness of the second wiring pattern 124b of the fourth wiring layer 124 exposed by the cavity C may be substantially the same as the thickness of a region of the fifth insulating layer 115 as the barrier layer, exposed by the cavity C. Other details are the same as described above, and detailed descriptions will be omitted.

Figure 43:
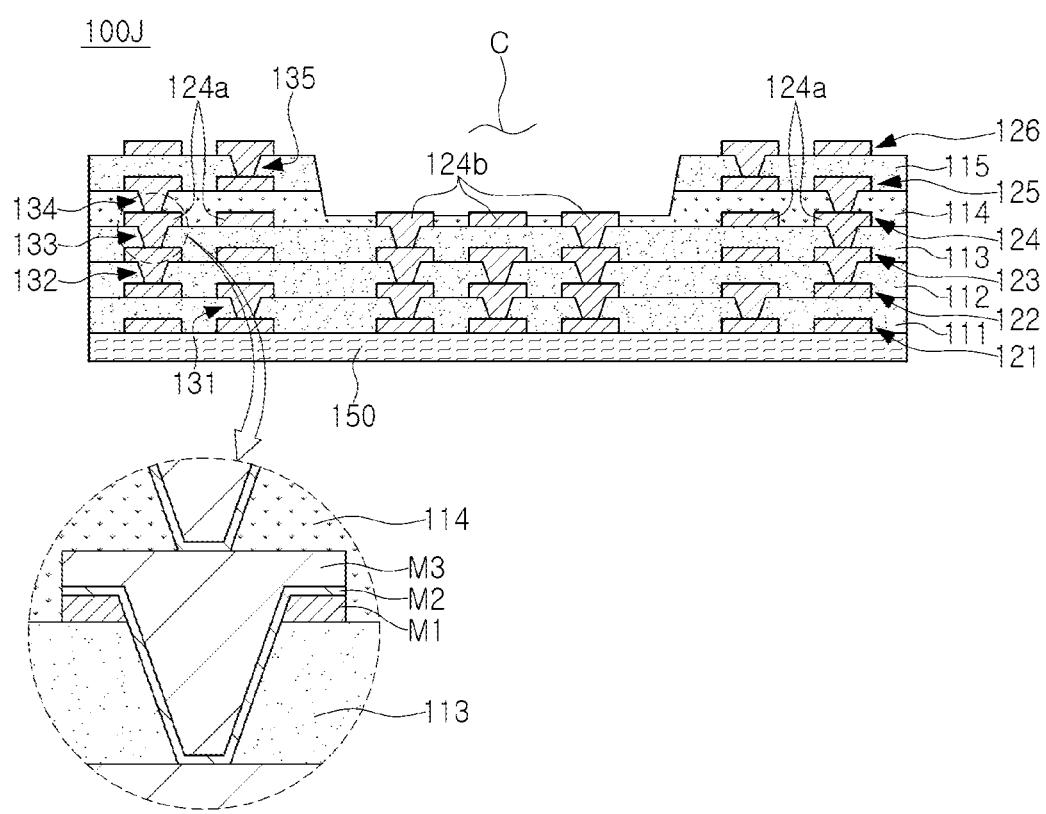
FIG. 43 is a schematic cross-sectional view of another example of a printed circuit board.

FIG. 43 is a schematic cross-sectional view of another example of a printed circuit board.

Figure 44:
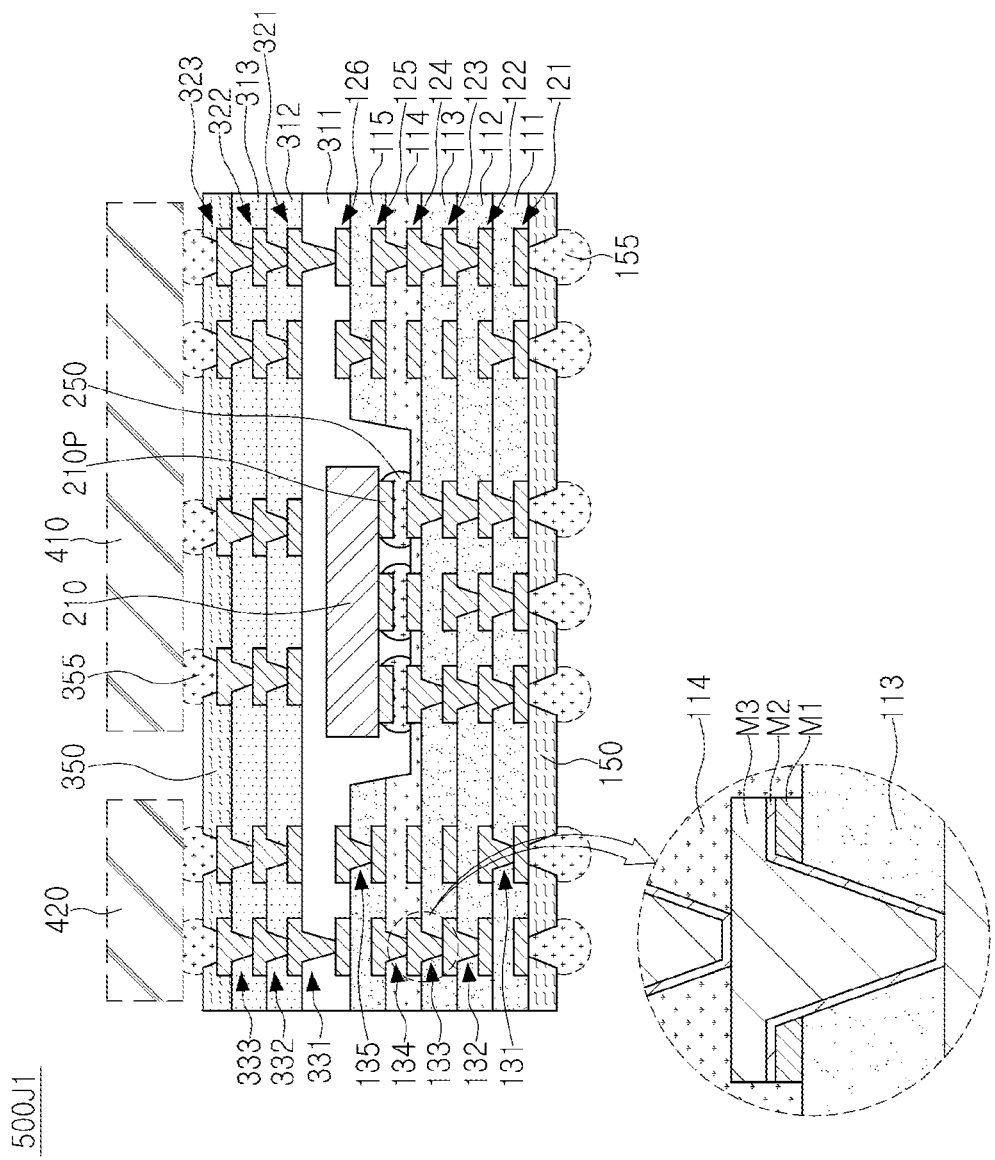
FIG. 44 is a schematic cross-sectional view illustrating an example of an electronic component-embedded substrate including the printed circuit board of FIG. 43.

FIG. 44 is a schematic cross-sectional view illustrating an example of an electronic component-embedded substrate including the printed circuit board of FIG. 43.

Figure 45:
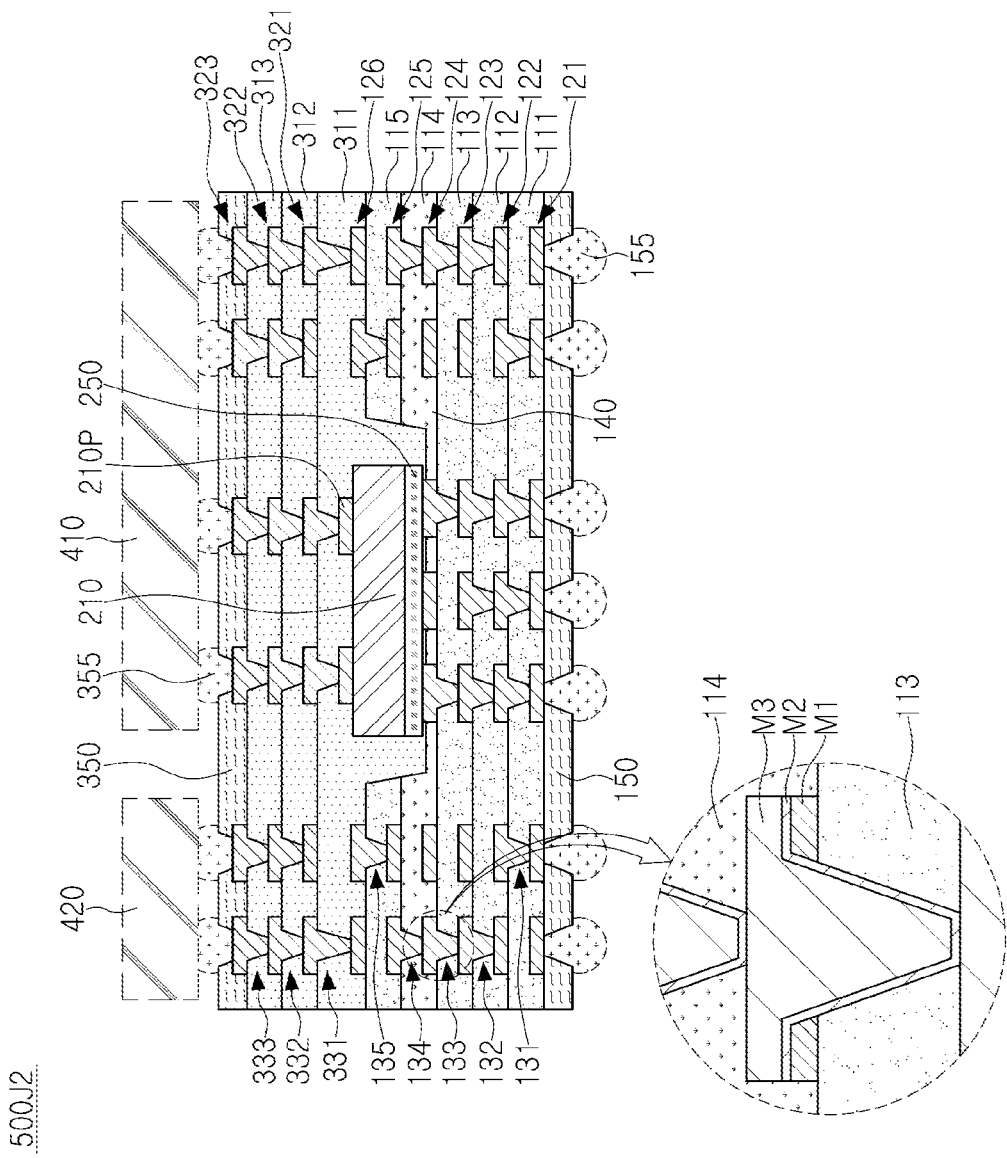
FIG. 45 is a schematic cross-sectional view of another example of an electronic component-embedded substrate including the printed circuit board of FIG. 43.

FIG. 45 is a schematic cross-sectional view of another example of an electronic component-embedded substrate including the printed circuit board of FIG. 43.

Referring to the drawings, in the case of a printed circuit board 100J according to another example and electronic component-embedded substrates 500J1 and 500J2 including the same, the fourth insulating layer 114, not the third insulating layer 113, serves as a barrier layer in the printed circuit board 100H according to another example described above and the electronic component-embedded substrates 500H1 and 500H2 including the same. From this point of view, the fourth insulating layer 114 may have a lower modulus than the fifth insulating layer 115 in which the cavity C is formed, and may have a relatively higher elongation. For example, the fourth insulating layer 114 may include a material including an insulating resin and an inorganic filler such as silica without a reinforcing material such as glass fiber, for example, include ABF, and the remaining insulating layers 111, 112, 113 and 115 may include a material including an insulating resin, an inorganic filler such as silica and a reinforcing material such as glass fiber, for example, include prepreg or copper clad laminate insulating material. The cavity C further penetrates through a portion of the fourth insulating layer 114 such that the upper surface of the fourth insulating layer 114 has a step difference, and exposes at least a portion of the upper surface of the fourth insulating layer 114. The fourth wiring layer 124 includes first and second wiring patterns 124a and 124b respectively disposed on an upper surface of the third insulating layer 113 and at least partially embedded in the fourth insulating layer 114. At least a portion of the upper surface of the second wiring pattern 124b is exposed by the cavity C.

As in another example, the material of the fourth insulating layer 114 may be different without the primer layer 140, to be used as the aforementioned barrier layer through a difference in modulus. In addition, the cavity C may penetrate through a portion of the fourth insulating layer 114 as the barrier layer, such that the upper surface of the fourth insulating layer 114 as the barrier layer may have a step. In addition, the thickness of the second wiring pattern 124b of the fourth wiring layer 124 exposed by the cavity C may be substantially the same as the thickness of a region of the fourth insulating layer 114 as the barrier layer, exposed by the cavity C. Other details are the same as described above, and detailed descriptions will be omitted.

As set forth above, a printed circuit board in which a process may be reduced even with a cavity structure, and an electronic component-embedded substrate including the same may be provided.

In addition, a printed circuit board having a reduced size even having a cavity structure, and an electronic component-embedded substrate including the same may be provided.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
   a first insulating layer;
   a second insulating layer disposed on the first insulating layer;
   a barrier layer disposed between the first and second insulating layers;
   a cavity penetrating through one of the first and second insulating layers;
   a first wiring layer at least partially embedded in one of the first insulating layer and the second insulating layer and at least being partially in contact with the barrier layer;
   a second wiring layer at least partially embedded in another of the first insulating layer and the second insulating layer and being spaced apart from the barrier layer; and
   a via disposed penetrating through the barrier layer and the another of the first insulating layer and the second insulating layer to connect the first wiring layer and the second wiring layer to each other,
   wherein the barrier layer has a modulus lower than a modulus of each of the first and second insulating layers,
   the cavity penetrates at least a portion of the barrier layer such that another portion of the barrier layer outside the cavity is as a bottom portion of a sidewall of the cavity connected to a bottom of the cavity,
   the one of the first and second insulating layers, which the cavity penetrates through, includes upper and lower surfaces opposing each other and a side surface connecting the upper and lower surface to each other, the lower surface being closer to the barrier layer than the upper surface,
   the side surface of the one of the first and second insulating layers is a portion of the sidewall of the cavity, and
   among the side surface and the lower surface of the one of the first and second insulating layers, the barrier layer is disposed only on the lower surface.

2. The printed circuit board of claim 1, wherein the barrier layer is a primer layer thinner than each of the first and second insulating layers.

3. The printed circuit board of claim 2, wherein the primer layer includes an insulating resin without an inorganic filler and glass fiber, and
   the first and second insulating layers include an insulating resin, an inorganic filler, and glass fiber.

4. The printed circuit board of claim 2, wherein the second insulating layer has a modulus lower than a modulus of the first insulating layer, and
   the cavity penetrates through the first insulating layer.

5. The printed circuit board of claim 4, wherein the primer layer includes an insulating resin without an inorganic filler and glass fiber,
   the first insulating layer includes an insulating resin, an inorganic filler, and glass fiber, and
   the second insulating layer includes an inorganic filler and an insulating resin without glass fiber.

6. The printed circuit board of claim 2, wherein the cavity penetrates through the first insulating layer and further penetrates through the primer layer,
   the cavity exposes at least a portion of one surface of the second insulating layer, and
   the first wiring layer comprises a first wiring pattern embedded in the second insulating layer in such a manner that at least a portion of one surface of the first wiring pattern is covered by the primer layer, and a second wiring pattern embedded in the second insulating layer in such a manner that at least a portion of one surface of the second wiring pattern is exposed by the cavity.

7. The printed circuit board of claim 2, wherein the cavity penetrates through the second insulating layer,
   the cavity exposes at least a portion of one surface of the primer layer, and
   the first wiring layer comprises a first wiring pattern disposed on one surface of the primer layer and at least partially embedded in the second insulating layer, and a second wiring pattern disposed on one surface of the primer layer and at least partially exposed by the cavity.

8. The printed circuit board of claim 1, wherein the via has a tapered shape.

9. A printed circuit board comprising:
   a first insulating layer;
   a second insulating layer disposed on the first insulating layer;
   a barrier layer disposed between the first and second insulating layers;
   a cavity penetrating through one of the first and second insulating layers; and
   a first wiring layer at least partially in contact with the barrier layer,
   wherein the barrier layer has a modulus lower than a modulus of each of the first and second insulating layers,
   the cavity penetrates through the first insulating layer and the barrier layer,
   the cavity exposes at least a portion of one surface of the second insulating layer, and
   the first wiring layer comprises a first wiring pattern embedded in the second insulating layer in such a manner that at least a portion of one surface of the first wiring pattern is covered by the barrier layer, and a second wiring pattern embedded in the second insulating layer in such a manner that at least a portion of one surface of the second wiring pattern is exposed by the cavity.

10. The printed circuit board of claim 9, wherein the barrier layer is a primer layer thinner than each of the first and second insulating layers.

11. The printed circuit board of claim 9, wherein the barrier layer includes an insulating resin without an inorganic filler and glass fiber, and
    the first and second insulating layers include an insulating resin, an inorganic filler, and glass fiber.

12. The printed circuit board of claim 9, wherein the second insulating layer has a modulus lower than a modulus of the first insulating layer, and
    the cavity penetrates through the first insulating layer.

13. The printed circuit board of claim 12, wherein the barrier layer includes an insulating resin without an inorganic filler and glass fiber,
 the first insulating layer includes an insulating resin, an inorganic filler, and glass fiber, and
 the second insulating layer includes an inorganic filler and an insulating resin without glass fiber.

* * * * *